United States Patent [19]

Tanitsu et al.

[11] Patent Number: 5,640,284
[45] Date of Patent: Jun. 17, 1997

[54] OPTICAL REFLECTOR, ILLUMINATION OPTICAL SYSTEM, LIGHT SOURCE SYSTEM AND ILLUMINATION OPTICAL APPARATUS

[75] Inventors: Osamu Tanitsu, Tokyo; Takashi Mori, Kawasaki; Hideo Hirose, Kawaguchi, all of Japan

[73] Assignee: Nikon Corporation, Japan

[21] Appl. No.: 330,393

[22] Filed: Oct. 27, 1994

Related U.S. Application Data

[63] Continuation-in-part of Ser. No. 120,873, Sep. 10, 1993, abandoned.

[30] Foreign Application Priority Data

| Sep. 11, 1992 | [JP] | Japan | 4-242486 |
| Nov. 26, 1992 | [JP] | Japan | 4-316717 |
| Oct. 29, 1993 | [JP] | Japan | 5-271952 |
| Dec. 22, 1993 | [JP] | Japan | 5-323718 |
| May 26, 1994 | [JP] | Japan | 6-134916 |

[51] Int. Cl.⁶ .......... G02B 5/10; G02B 27/02; G02B 17/00; G02B 21/06
[52] U.S. Cl. .......... 359/869; 359/867; 359/868; 359/365; 359/389; 359/482; 362/268; 362/291; 362/347
[58] Field of Search .......... 359/867, 868, 359/869, 365, 366, 389, 482; 362/268, 291, 347, 350

[56] References Cited

U.S. PATENT DOCUMENTS

| 3,148,834 | 9/1964 | Boehnke | 362/347 |
| 3,492,474 | 1/1970 | Yamaguchi et al. | 362/350 |
| 4,497,015 | 1/1985 | Konno et al. | 362/268 |
| 4,538,886 | 9/1985 | Townsend et al. | 136/246 |
| 4,545,653 | 10/1985 | Brenden et al. | 359/719 |
| 4,606,606 | 8/1986 | Freeman | 359/482 |
| 5,220,449 | 6/1993 | Kuroda | 359/196 |
| 5,233,457 | 8/1993 | Hamada et al. | 359/216 |
| 5,255,116 | 10/1993 | Araki et al. | 359/212 |

FOREIGN PATENT DOCUMENTS

| 54-123876 | 9/1979 | Japan . |
| 54-123877 | 9/1979 | Japan . |
| 60-158449A | 8/1985 | Japan . |
| 60-232552A | 11/1985 | Japan . |
| 61-251025A | 8/1986 | Japan . |
| 4-101148A | 4/1992 | Japan . |
| 4-225357A | 8/1992 | Japan . |
| 8600685 | 1/1986 | WIPO | 362/347 |

OTHER PUBLICATIONS

N. Shiraishi et al. "New Imaging Technique for 64M-DRAM", SPIE vol. 1647 Optical/Laser Microlithography (Mar. 11-13, 1992).

Primary Examiner—Paul M. Dzierzynski
Assistant Examiner—Mohammad Y. Sikder
Attorney, Agent, or Firm—Pennie & Edmonds LLP

[57] ABSTRACT

An optical illumination system according to the present invention is provided with an optical reflector for illuminating a surface to be illuminated in the shape of arc or annulus. A reflective plane of the optical reflector is shaped in a special curved surface. Specifically, an arbitrary parabola with a first axis passing through the vertex and the focus of the parabola is rotated about a second axis passing through a point located on the opposite side of the directrix of the parabola with respect to the focus and being parallel to the directrix. The rotation of the parabola yields a parabolic toric surface. The reflective plane of the optical reflector has the curved surface constituting at least a part of the parabolic toric surface. The reflective plane so shaped reflects a light source image emitted from a light source system to illuminate the surface to be illuminated in the shape of arc or annulus.

60 Claims, 54 Drawing Sheets

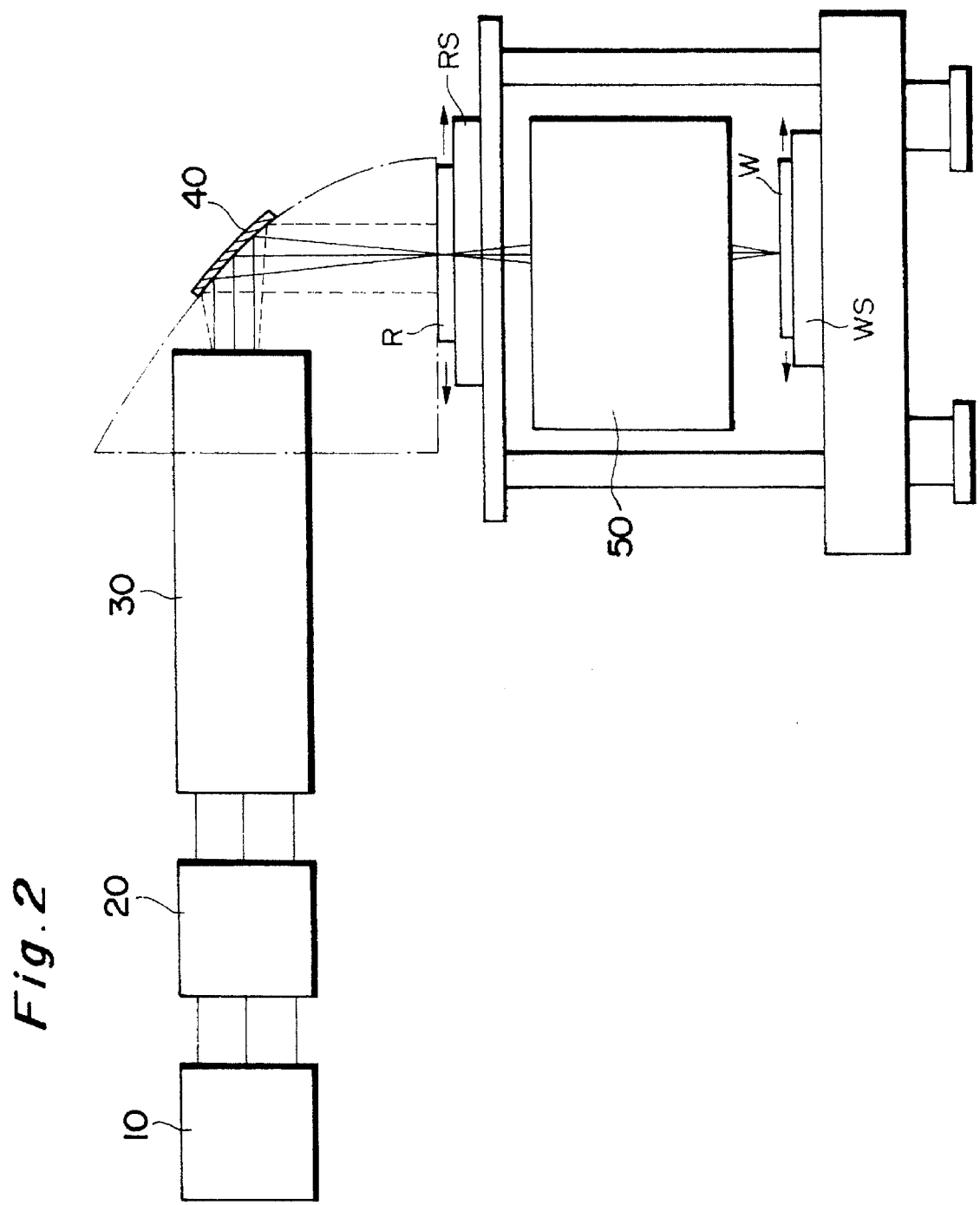

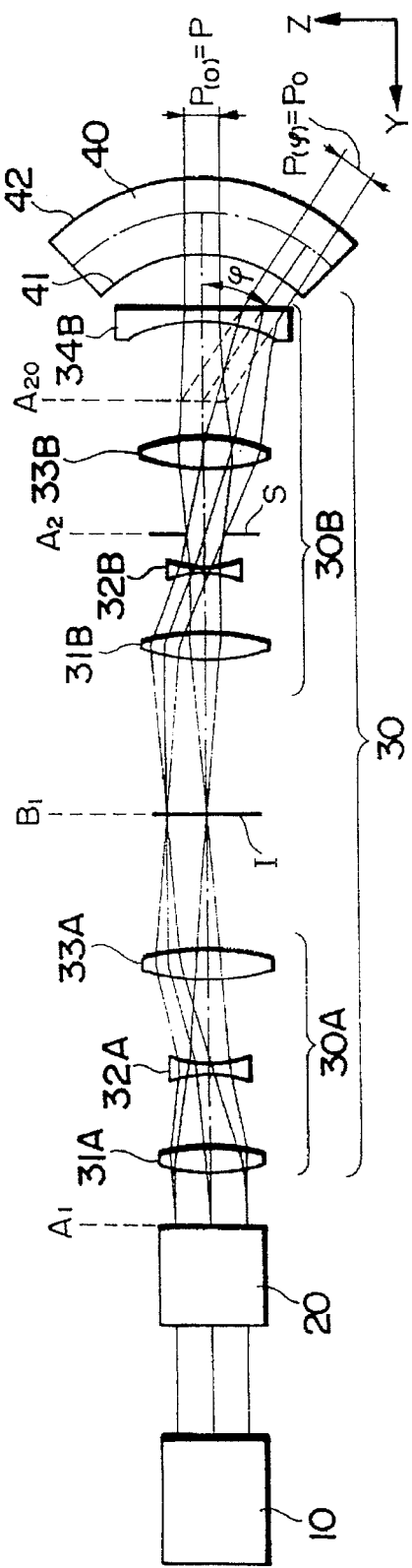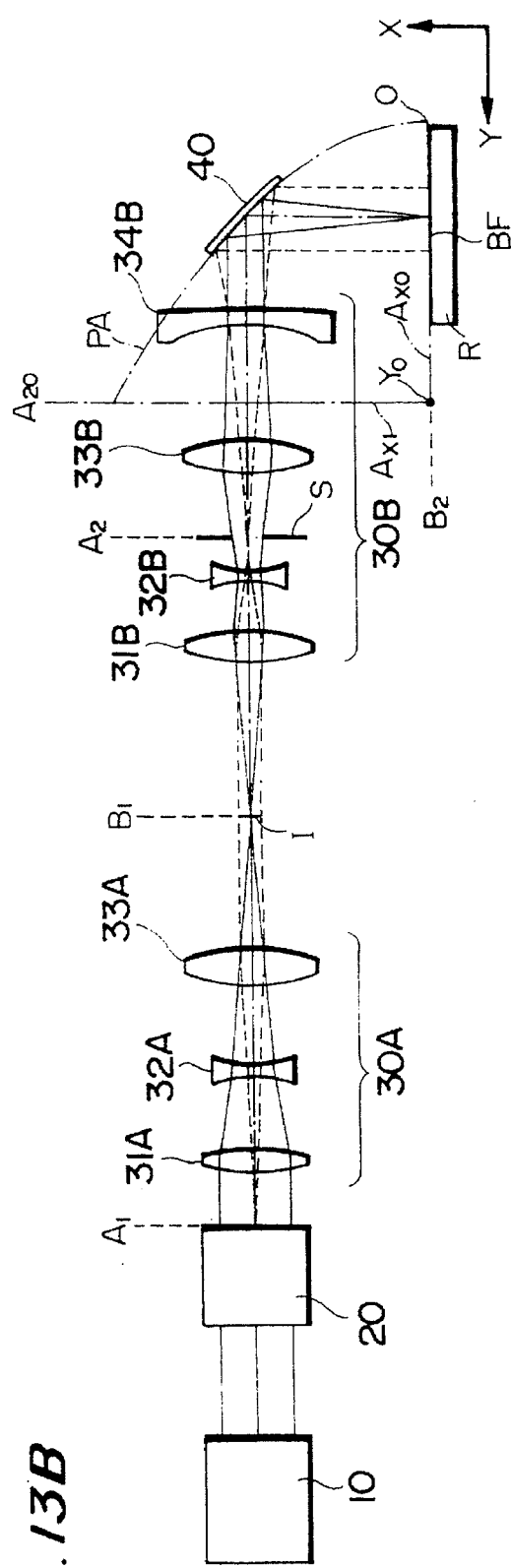
Fig.13A
Fig.13B

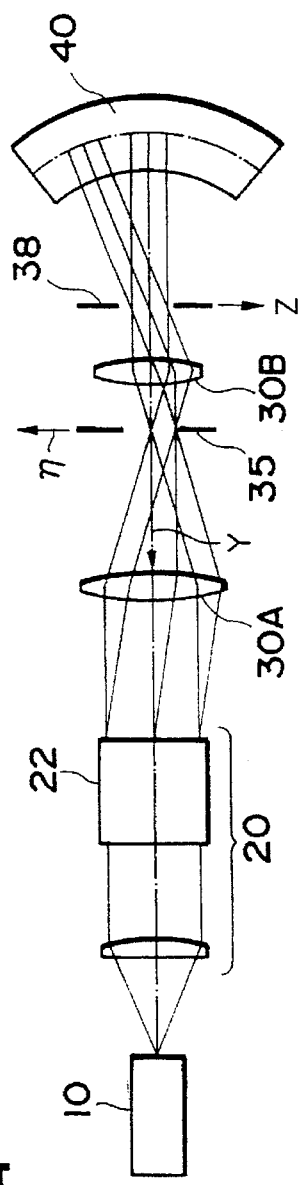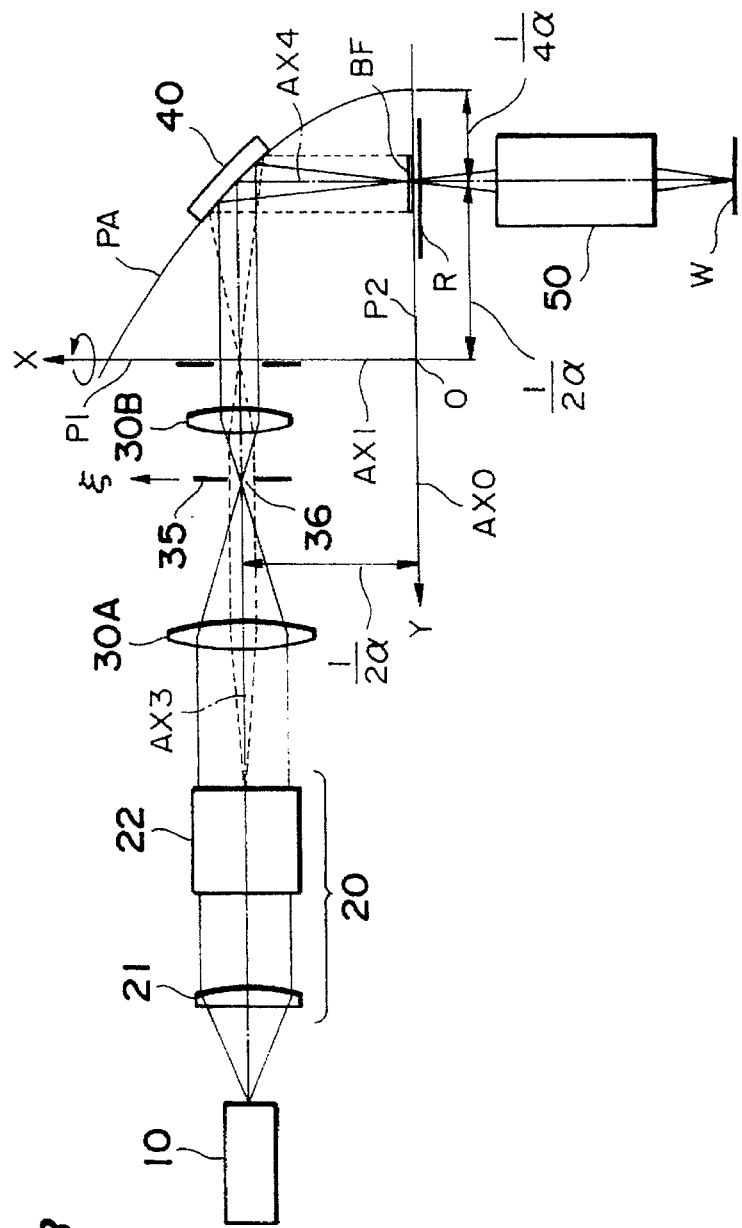
Fig.23A
Fig.23B

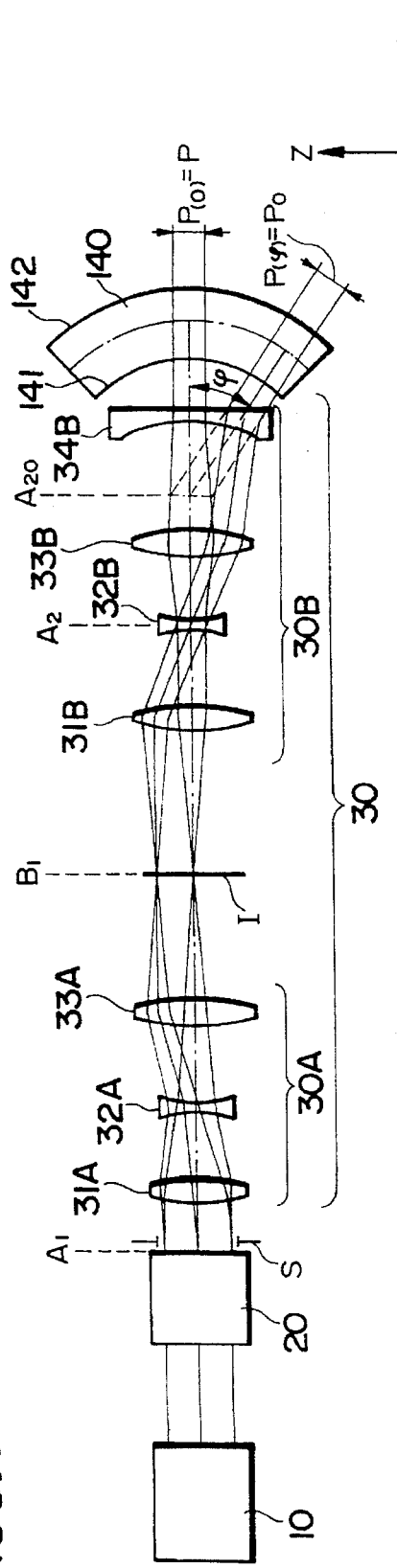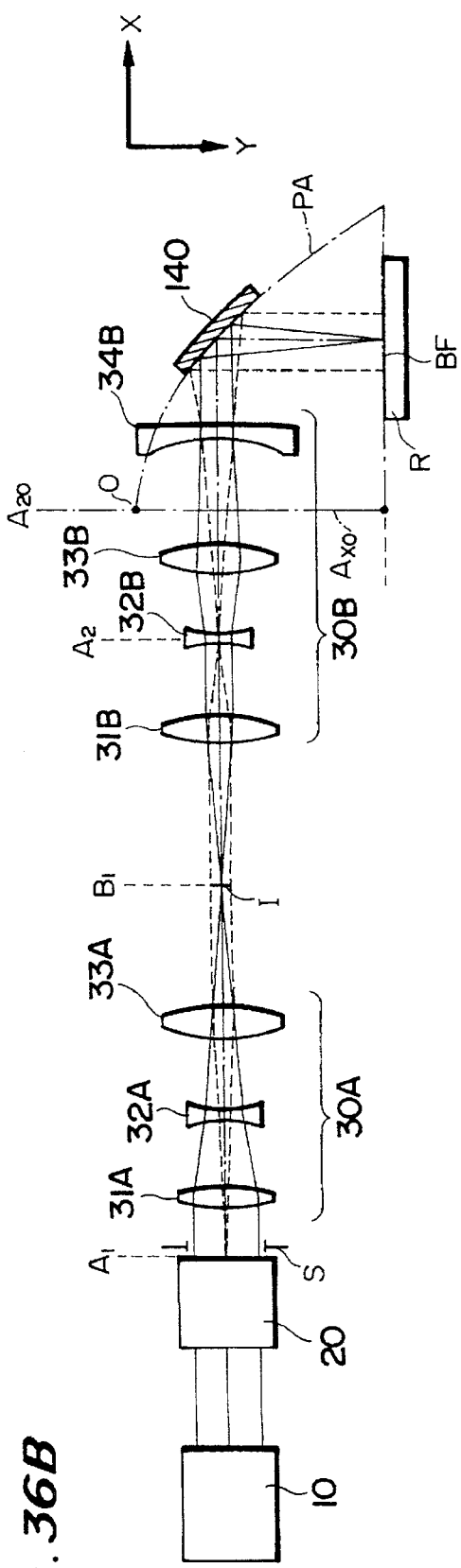
Fig.36A
Fig.36B

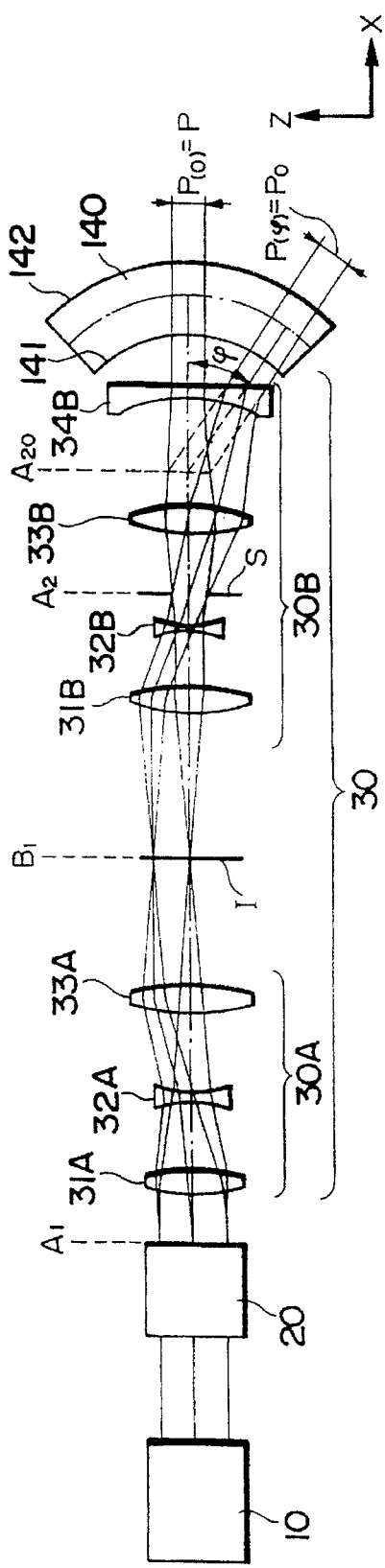
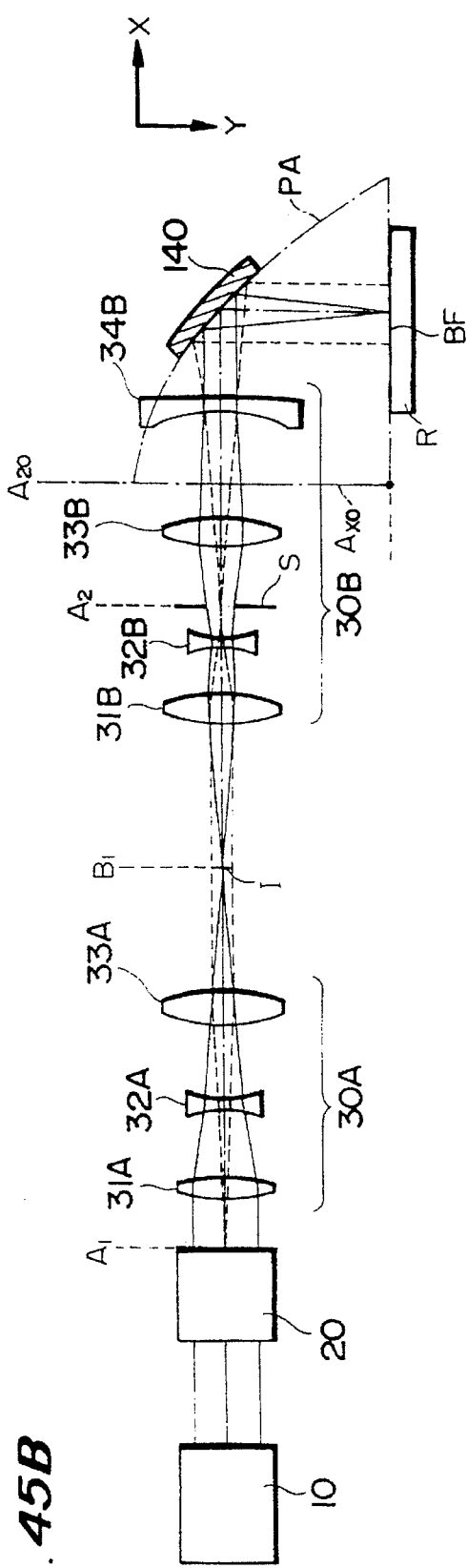
Fig.45A
Fig.45B

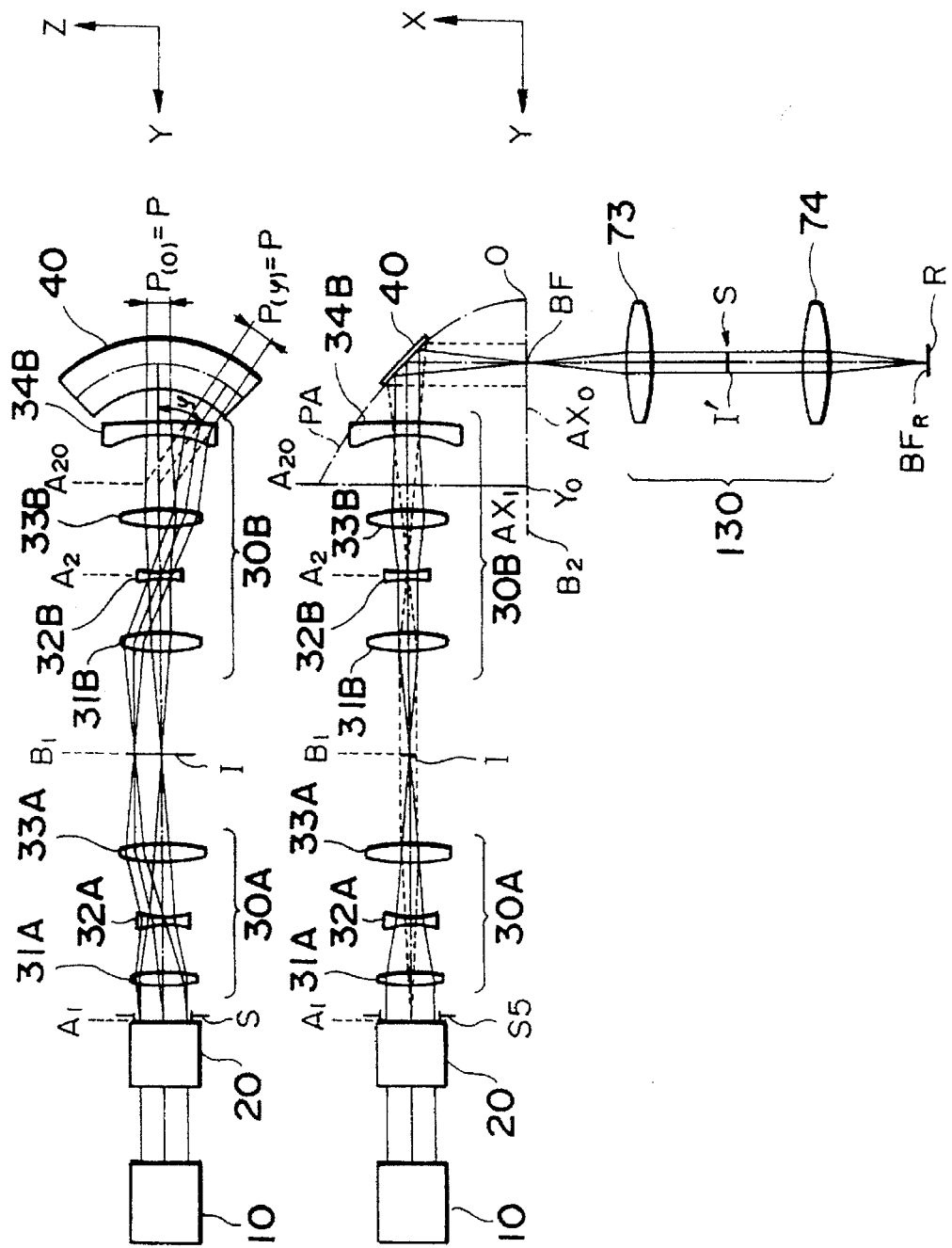

OPTICAL REFLECTOR, ILLUMINATION OPTICAL SYSTEM, LIGHT SOURCE SYSTEM AND ILLUMINATION OPTICAL APPARATUS

RELATED APPLICATIONS

This is a continuation-in-part application of application Ser. No. 08/120,873 filed on Sep. 10, 1993, now abandoned

BACKGROUND OF THE INVENTION

1. Field of the Invention

The present invention relates to an optical reflector for uniformly illuminating a surface to be illuminated in the shape of arc or annulus, an illumination optical system using the optical reflector, a light source system suitable for the illumination optical system, and an illumination optical apparatus provided with the foregoing.

2. Related Background Art

Conventional exposure apparatus for semiconductor production provided with illumination optical system of this type project and replicate a circuit pattern formed on a surface of photo mask (as will be simply referred to as a mask) as an object plane onto a substrate such as a wafer (as will be referred to as a wafer) through a projection optical system. The projection optical system has two reflection mirrors, i.e., a concave mirror and a convex mirror to form a good image in an arcuate region off the axis of projection optical system. Using only the good image region of arc shape, only an arcuate region on mask is projected and replicated onto a wafer. Thus, the replication of the circuit pattern on the entire mask is completed onto the wafer by moving the mask and the wafer in certain directions.

The exposure of this scan type is advantageous in providing a relatively high throughput and a high resolving power.

For exposure apparatus of this type, an illumination optical system desired is one which can uniformly illuminate the whole arcuate region on mask at a constant numerical aperture (NA). Japanese Laid-open Patent Application No. 54-123876 describes a proposal of illumination optical system which can uniformly illuminate a mask in the shape of arc.

The application discloses a belt-like spherical mirror 2 as shown in FIG. 1A, a reflective plane of which has an arcuate shape which is a part of spherical surface 1 cut in the shape of belt. When a light source 4 is placed on a rotation symmetry axis 3 of the belt-like spherical mirror 2, as shown in FIG. 1B and FIG. 1C, a principal ray 5 emitted from the light source 4 is bent at right angle by the belt-like spherical mirror 2 to enter an illuminated surface 6 perpendicularly thereto. Since the reflection is effected on the total reflection plane of arc shape in the belt-like spherical mirror 2, an arc illumination region is formed on the illuminated surface 6.

On one hand, such an illumination optical system has an advantage that the arcuate region can be efficiently illuminated. On the other hand, since the illumination by the illumination optical system is the critical illumination in which a light source image is directly imaged on the illuminated surface, the system has a disadvantage that unevenness of illuminance of the light source 4 appears as illumination unevenness on the illuminated surface 6 as it is. For example, if the light source 4 is an incandescent lamp, a distribution of filament in the incandescent lamp is imaged on the illuminated surface 6 as it is.

SUMMARY OF THE INVENTION

It is an object of the present invention to realize the Köhler illumination on an illumination region in the shape of arc or annulus.

The above and other objects will be further apparent from the following description.

Provided according to the present invention is an optical reflector which reflects a beam emitted from a light source to illuminate a surface to be illuminated in the shape of arc or annulus, wherein a reflective plane of said optical reflector has a curved surface which constitutes at least a part of a parabolic toric surface, said parabolic toric surface being obtained by rotating an arbitrary parabola with a first axis passing through the vertex and the focus of the parabola about a second axis passing through a point located on an opposite side to the directrix of the parabola with respect to said focus while being parallel to the directrix.

Also provided according to the present invention is an illumination optical system in which an optical reflector reflects a light source image emitted from a light source system to illuminate a surface to be illuminated in the shape of arc or annulus, wherein a reflective plane of said optical reflector has a curved surface which constitutes at least a part of a parabolic toric surface, said parabolic toric surface being obtained by rotating an arbitrary parabola with a first axis passing through the vertex and the focus of the parabola about a second axis passing through a point located on an opposite side to the directrix of the parabola with respect to said focus while being parallel to the directrix.

Further provided according to the present invention is a light source system comprising light source means for emitting a beam and optical means for receiving the beam emitted from said light source means and converging it to form a light source image, the beam emitted from the light source image having a substantially constant beam diameter in all outgoing directions of the beam.

Also provided according to the present invention is an illumination optical apparatus for illuminating a surface to be illuminated in the shape of arc of annulus, which comprises a light source system for forming a light source image to emit the beam and an optical reflector for reflecting the beam emitted from said light source system, wherein said light source system comprises light source means for emitting the beam and optical means for receiving the beam emitted from said light source means and converging it to form a light source image, the beam emitted from said light source image having a substantially constant beam diameter in all outgoing directions of the beam, wherein a reflective plane of said optical reflector has a curved surface which constitutes at least a part of a parabolic toric surface, said parabolic toric surface being obtained by rotating an arbitrary parabola with a first axis passing through the vertex and the focus of the parabola about a second axis passing through a point located on an opposite side to the directrix of the parabola with respect to said focus while being parallel to the directrix.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIG. 2 a schematic constitutional drawing to show an illumination optical apparatus of the present invention;

FIG. 13A is a plan view to show another embodiment of re-imaging optical system;

FIG. 13B is a side view of the re-imaging optical system shown in FIG. 13A;

FIG. 23A is a plan view to show an embodiment of the illumination optical system according to the present invention, and FIG. 23B is a side view of the embodiment, partly in section;

FIG. 33A and FIG. 33B are explanatory drawings to illustrate schematic illumination states using the replaced shape of aperture stop, showing a relay state toward the illumination region by a relay optical system and an illumination state of light passing through the aperture stop, wherein FIG. 33A shows an enlarged state of the aperture stop and lens 72 and FIG. 33B shows the shape of aperture stop as observed from the illumination region (illuminated object);

FIG. 36A is an enlarged plan view to show the structure of a re-imaging optical system in the exposure apparatus shown in FIG. 35, and FIG. 36B is a side view thereof;

FIG. 45A is a plan view to show another embodiment of the re-imaging optical system, and FIG. 45B is a side view thereof;

FIG. 57A and FIG. 57B are explanatory drawings to illustrate schematic illumination states using the replaced shape of aperture stop, showing a relay state toward the illumination region by a relay optical system and an illumination state of light passing through the aperture stop, wherein FIG. 57A shows an enlarged state of the aperture stop and lens 72 and FIG. 57B shows the shape of aperture stop as observed from the illumination region (illuminated object); and FIG. 58A is a plan view to show an example of another construction of the illumination optical apparatus, and FIG. 58B is a side view thereof.

DESCRIPTION OF THE PREFERRED EMBODIMENTS

Figure 1A:
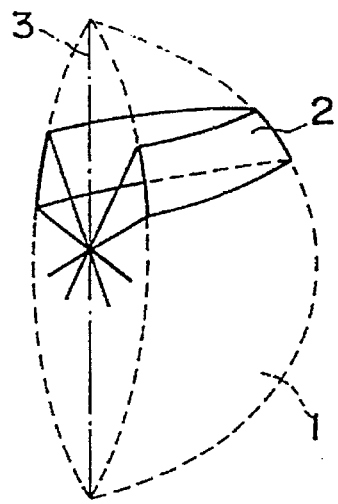
FIG. 1A is a perspective view to show a belt-like spherical mirror.
Figure 1B:
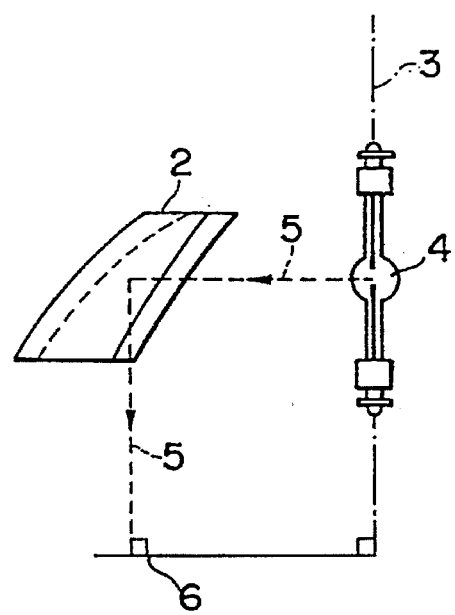
FIG. 1B is a side view to show an illumination optical system provided with the belt-like spherical mirror shown in FIG. 1A.
Figure 1C:
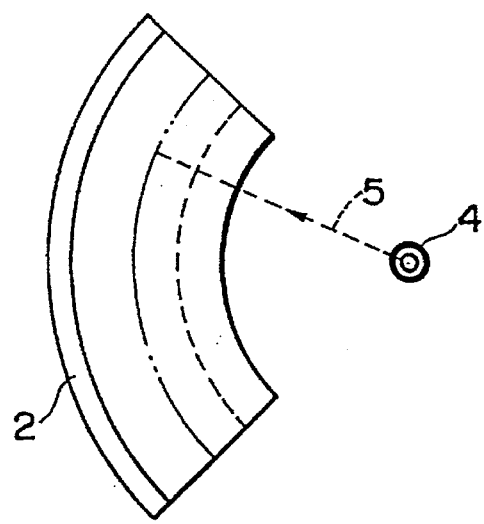
FIG. 1C is a plan view of the illumination optical system shown in FIG. 1B.

The present invention will be described with the preferred embodiments, referring to the accompanying drawings.

Embodiment I-1

FIG. 2 schematically shows the structure of the illumination optical apparatus in the present embodiment. The illumination optical apparatus is composed of a light source 10, for example of an excimer laser, a light source image forming optical system 20 having an optical integrator formed of an assembly of plural lenses, a re-imaging optical system 30 for re-imaging a plurality of light source images formed by the optical integrator comprised in the light source image forming optical system 20, and an optical reflector 40.

Further, the illumination optical apparatus has a reticle stage RS in the vicinity of an illuminated surface by the illumination optical apparatus. The reticle stage RS holds a reticle on which a circuit pattern of IC is formed, as it can move the reticle. The illumination optical apparatus is also provided below the reticle stage RS with a wafer stage WS movably holding a wafer W and with a projection optical system 50 for projecting an image of circuit pattern on the reticle R onto the wafer W. A drive control unit as will be described hereinafter sequentially moves the reticle stage RS and the wafer stage WS in predetermined directions. The entire apparatus as described constitutes an optical exposure apparatus which carries out repetitive exposure of the circuit pattern image on the reticle R onto the wafer R chip by chip from the edge thereof.

The structure of the apparatus will be described in detail one by one.

Figure 3A:
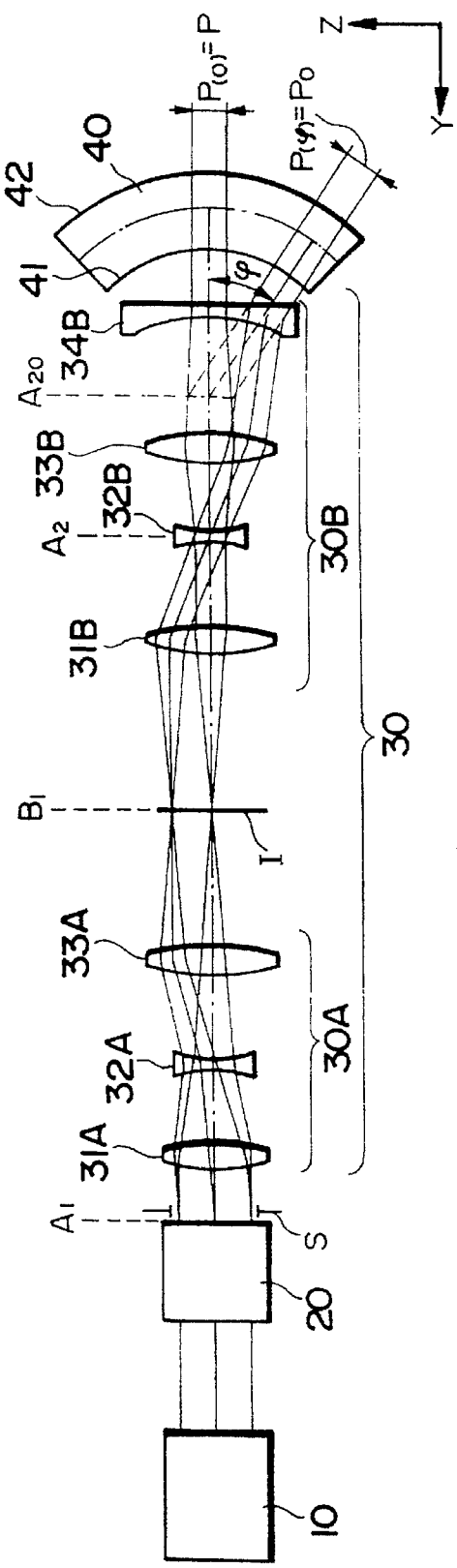
FIG. 3A is an enlarged plan view to show the structure of a re-imaging optical system in the illumination optical apparatus shown in FIG. 2.
Figure 3B:
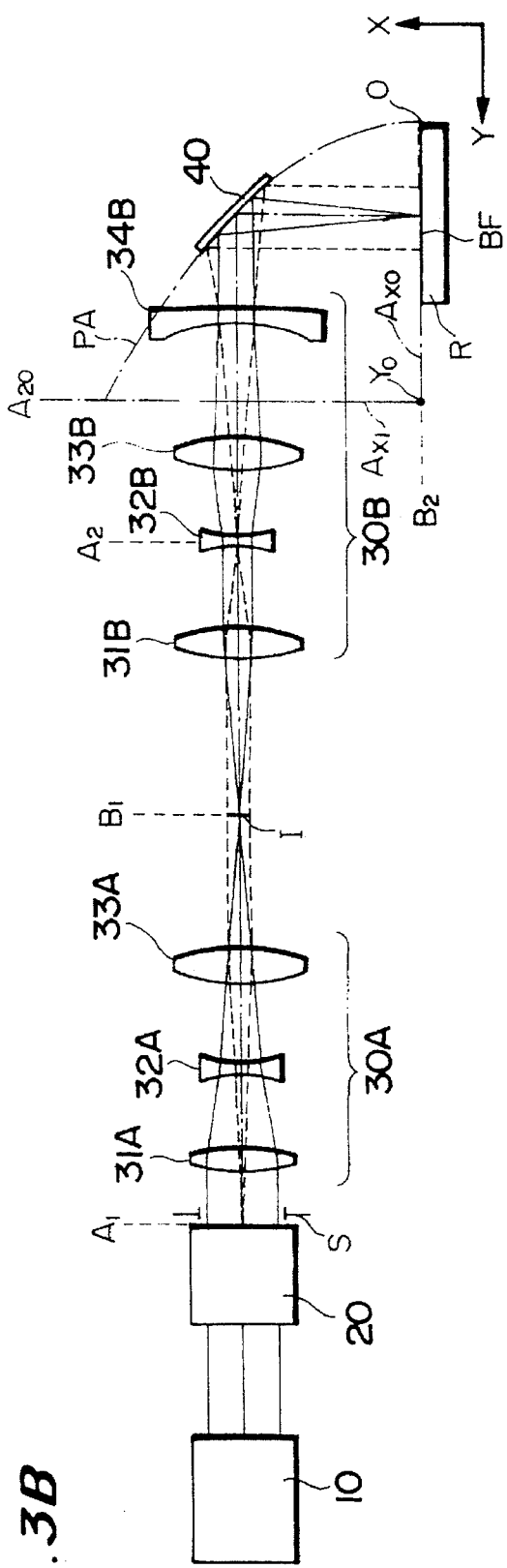
FIG. 3B is a side view of the re-imaging optical system shown in FIG. 3A.

First, FIG. 3A and FIG. 3B are enlarged views to show the arrangement of the light source 10, the light source image forming optical system 20 and the re-imaging optical system 30. FIG. 3A is a top plan view of the arrangement, and FIG. 3B is a side view in cross section of the systems.

The optical integrator comprised in the light source image forming optical system 20 is, for example an assembly of plural lens elements, which focuses parallel rays emitted from the light source 10 and entering the respective lens elements on the exit side. Formed at a position $A_1$ on the exit side are a plurality of light source images I which are an assembly of point sources corresponding to the lens elements, whereby a secondary light source is formed thereon substantially as a surface illuminant. An aperture stop S with circular aperture portion is provided at or near the position $A_1$ where the secondary light source is formed, and it shapes the secondary light source formed by the optical integrator comprised in the light source image forming optical system 20 to be circular.

A beam is released from each light source image in the circular secondary light source shaped by the aperture stop S, so that, as seen as the entire secondary light source, parallel beams are outgoing therefrom at each exit angle and incident into the re-imaging optical system 30, as shown in FIG. 3A.

The re-imaging optical system 30 has a function to re-image the plurality of light source images formed by the optical integrator, and is so arranged that the entrance pupil of the re-imaging optical system 30 is coincident with the position $A_1$ of light source images formed by the optical integrator.

The re-imaging optical system 30 is composed of a first optical system 30A with positive refracting power and a second optical system 30B with positive refracting power. The first optical system 30A is constituted by an f·sinΦ lens composed of three lenses of a double-convex positive lens 31A, a double-concave negative lens 32A and a double-convex positive lens 33A. The second optical system 30B is constituted by an fΦ lens composed of four lenses of a double-convex positive lens 31B, a double-concave negative lens 32B, a double-convex positive lens 33B and a meniscus negative lens 34B with a concave plane facing the light source.

Now described is the principle of the re-imaging optical system 30 so arranged.

Figure 4A:
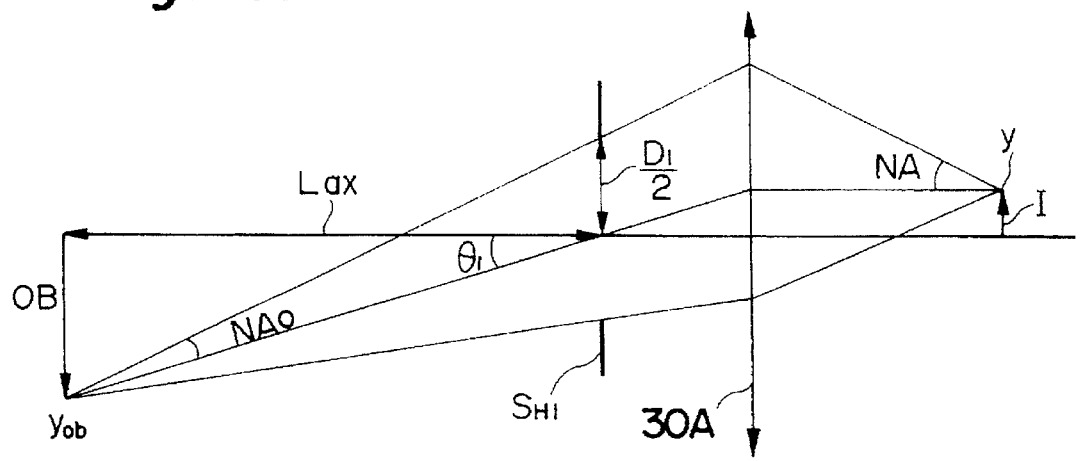
FIG. 4A and FIG. 4B are explanatory drawings to illustrate the principle of the re-imaging optical system.
Figure 4B:
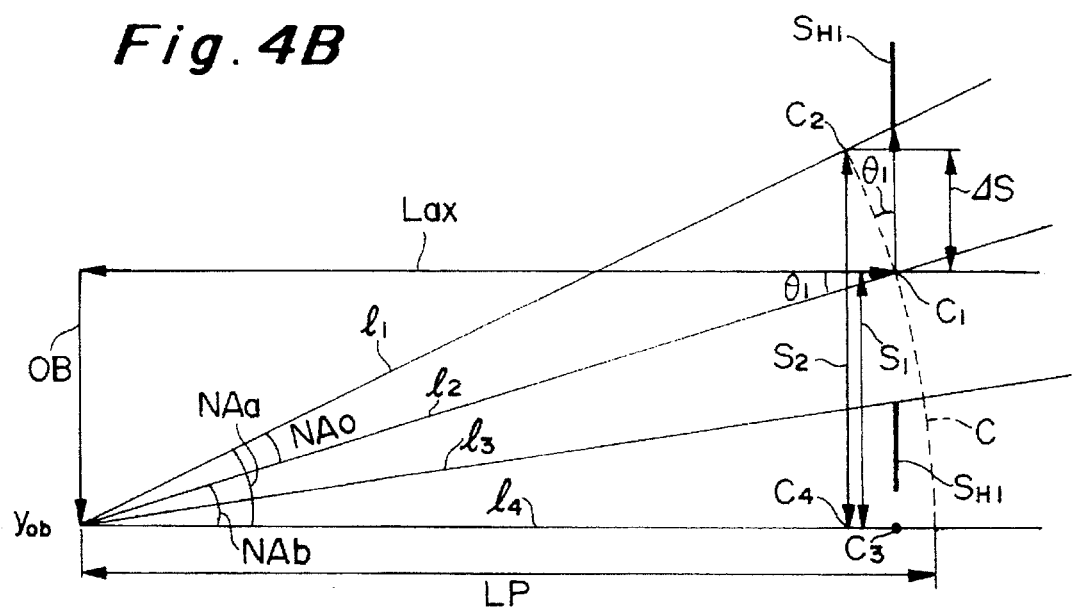

First, let us assume, as shown in FIG. 4A and in FIG. 4B, that an imaginary stop $S_{H1}$ is provided as an entrance pupil on the light source side of the first optical system 30A, that an object OB with height $y_{ob}$ is placed at a position apart by a distance $L_{ax}$ from the stop $S_{H1}$ along the optical axis, and that oblique rays from the object OB pass through the stop $S_{H1}$ and the first optical system 30A to form an image I with height y. FIG. 4A is a schematic representation of the first optical system 30A on the light source side, and FIG. 4B is an enlarged drawing to show a ray diagram near the stop $S_{H1}$, where the stop $S_{H1}$ is placed on the light source side of the first optical system 30A.

Before a suitable arrangement is obtained for the re-imaging optical system 30, a numerical aperture (NA) of oblique rays is first obtained on the exit side of the first optical system 30A, referring to FIG. 4A and FIG. 4B.

Let $NA_a$ be a numerical aperture on the entrance side of the first optical system 30A formed by a ray $l_1$ coming from an object point at height $y_{ob}$ of object OB and passing the upper edge of stop $S_{H1}$ and a ray $l_4$ coming from the object point at height $y_{ob}$ of object OB and being parallel to the optical axis, $NA_0$ be a numerical aperture on the entrance side of the first optical system 30A formed by a ray $l_1$ coming from the object point at height $y_{ob}$ of object OB and passing the upper edge of the stop $S_{H1}$ and a ray (principal ray) $l_2$ coming from the object point at height $y_{ob}$ of object OB and passing the center of stop $S_{H1}$, and $NA_b$ be a numerical aperture on the entrance side of the first optical system 30A formed by a ray (principal ray) $l_2$ coming from the object point at height $y_{ob}$ of object OB and passing the center of the stop $S_{H1}$ and a ray $l_4$ coming from the object point at height $y_{ob}$ of object OB and being parallel to the optical axis. Then the following relation stands from FIG. 4B.

$$NA_0 = NA_a - NA_b \tag{1}$$

Also, let $\theta_1$ be an entrance angle of the principal ray $l_2$ into the first optical system 30A, $L_p$ be a length of the principal ray $l_2$ from the object point at height $y_{ob}$ of object OB to the center of stop $S_{H1}$, $c_1$ be a position where a circle C with radius $L_p$ about the object point at height $y_{ob}$ of object OB intersects with the stop $S_{H1}$ at the center thereof, $c_2$ be a position where the circle C intersects with the ray $l_1$ passing the upper edge of stop $S_{H1}$, $c_3$ and $c_4$ be intersections between the ray $l_4$ and normal lines from the positions $c_1$, $c_2$ to the ray $l_4$, respectively, $s_1$ be a distance between the position $c_1$ and the position $c_3$ along the direction normal to the optical axis, and $s_2$ be a distance between the position $c_2$ and the position $c_4$ along the direction normal to the optical axis. Then above Equation (1) may be expressed by the following Equation (2) from FIG. 4B.

$$NA_0 = \frac{s_2}{L_p} - \frac{s_1}{L_p} = \frac{(s_2 - s_1)\cos\theta_1}{L_{ax}} \tag{2}$$

Here, let $\Delta s$ be a difference between $s_2$ and $s_1$, and $D_1$ be a diameter of aperture in stop $S_{H1}$. Then the following relation holds from FIG. 4B.

$$\Delta s = \left[\frac{D_1}{2} \cos\theta_1\right] \cos\theta_1 = \frac{D_1 \cos^2\theta_1}{2} \tag{3}$$

Consequently, the following relation is derived from Equations (2) and (3).

$$NA_0 = \frac{D_1 \cos^3\theta_1}{2L_{ax}} \tag{4}$$

Meanwhile, the following relation of Equation (5) stands between the numerical aperture $NA_0$ on the entrance side of the first optical system 30A and the numerical aperture NA on the exit side of the first optical system 30A, as shown in FIG. 4A, when an infinitesimal change of height $y_{ob}$ of object OB is $dy_{ob}$ and an infinitesimal change of image height y of image I is dy.

$$\frac{NA}{NA_0} = \frac{dy_{ob}}{dy} \tag{5}$$

Since the relation of $y_{ob} = L_{ax} \cdot \tan\theta_1$ holds from FIG. 4A, the derivative thereof is as follows.

$$\frac{dy_{ob}}{d\theta_1} = \frac{L_{ax}}{\cos^2\theta_1} \tag{6}$$

Suppose there is the following relation between the entrance angle $\theta_1$ of an incident ray into the first optical system 30A and the image height y with focal length $f_1$ of the first optical system 30A.

$$y = f_1 g_1(\theta_1) \tag{7}$$

The derivative of Equation (7) is as follows.

$$\frac{dy}{d\theta_1} = f_1 g_1'(\theta_1) \tag{8}$$

In the equations, $g_1(\theta_1)$ is a function of $\theta_1$ and $g_1'(\theta_1)$ is a derivative of $g_1(\theta_1)$.

Consequently, from Equations (4), (5), (6) and (8), the following relation is derived.

$$NA = \frac{D_1 \cos^3\theta_1}{2L_{ax}} \times \frac{L_{ax}}{\cos^2\theta_1} \times \frac{1}{f_1 g_1'(\theta_1)} \tag{9}$$

$$= \frac{D_1 \cos\theta_1}{2f_1 g_1'(\theta_1)}$$

It is understood from Equation (9) that the relation of Equation (9) always stands even with object OB at infinity to the first optical system 30A, since the numerical aperture NA on the exit side of the first optical system 30A is irrespective of the distance $L_{ax}$ between the stop $S_{H1}$ and the object OB.

Figure 5A:
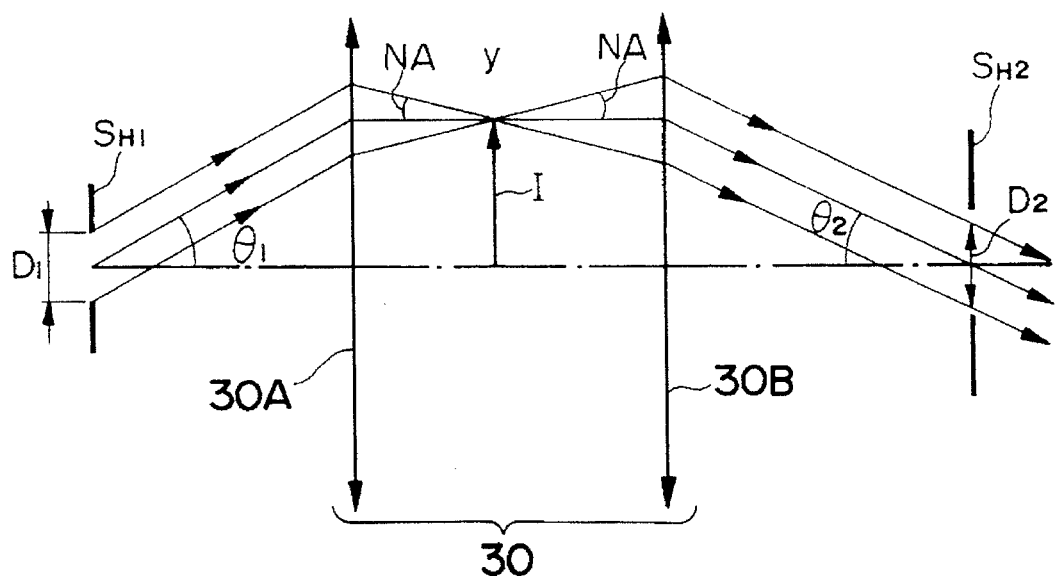
FIG. 5A and FIG. 5B are explanatory drawings to illustrate the principle of the re-imaging optical system.
Figure 5B:
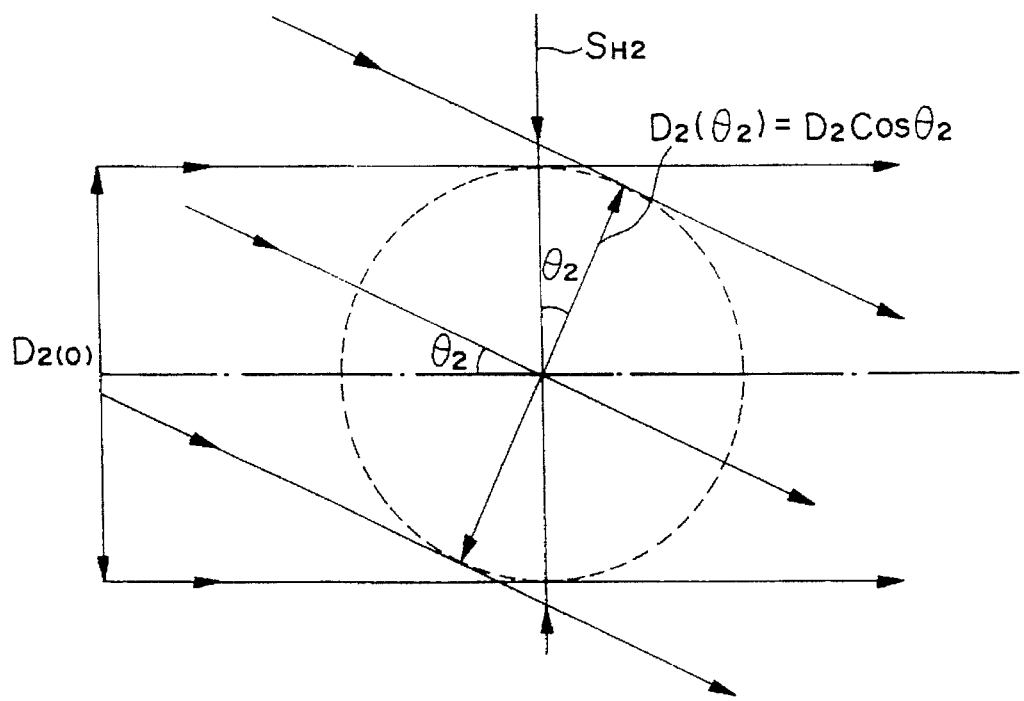

A suitable arrangement of the re-imaging optical system 30 is next obtained referring to FIG. 5A and FIG. 5B. FIG. 5A is a schematic representation of the entire re-imaging optical system 30 and FIG. 5B is an enlarged drawing to show a ray diagram near the exit pupil of the re-imaging optical system 30.

Suppose an imaginary stop $S_{H2}$ is provided as an exit pupil on the exit side of the second optical system 30B. As shown in FIG. 5A, let y be a height of image I formed through the first optical system 30A by rays coming at entrance angle $\theta_1$ through the imaginary stop $S_{H1}$, $\theta_2$ be an exit angle of rays outgoing from the second optical system 30B after the rays from the height y of image I are converged by the second optical system 30B, $f_1$ be a focal length of the first optical system 30A, and $f_2$ be a focal length of the second optical system 30B. Then the following relation holds.

$$y = f_1 g_1(\theta_1) = f_2 g_2(\theta_2) \tag{10}$$

In the equation, $g_1(\theta_1)$ is a function of $\theta_1$ and $g_2(\theta_2)$ is a function of $\theta_2$.

Letting $D_2$ be a diameter of outgoing rays at the exit pupil position out of the second optical system 30B and $y' = f_2 g_2'(\theta_2)$ be a derivative of $y = f_2 g_2(\theta_2)$, the numerical aperture NA is given by following Equation (11), since the relation of above Equation (9) also holds for the second optical system 30B. In the equation, $g'(\theta_2)$ is a derivative of $g(\theta_2)$.

$$NA = \frac{D_2 \cos\theta_2}{2f_2 g_2'(\theta_2)} \quad (11)$$

Consequently, the following relation is derived from Equations (9) and (11).

$$D_2 = \frac{D_1 f_2 \cos\theta_1 g_2'(\theta_2)}{f_1 \cos\theta_2 g_1'(\theta_1)} \quad (12)$$

The following relation should be preferably satisfied in order that, letting $D_2(\theta_2)$ be a diameter of outgoing rays at exit angle $\theta_2$, an outgoing beam diameter $D_2(0)$ at exit angle of 0 degrees ($\theta_2=0°$) is equal to that at exit angle $\theta_2$, as shown in FIG. 5B.

$$D_2(0) = D_2(\theta_2) = D_2\cos\theta_2 \quad (13)$$

Then the following relation is derived from Equations (12) and (13).

$$\frac{D_2(0)}{\cos\theta_2} = \frac{D_1 f_2 \cos\theta_1 g_2'(\theta_2)}{f_1 \cos\theta_2 g_1'(\theta_1)} \quad (14)$$

Finally, following Equation, (15) is obtained.

$$\frac{D_1 f_2 g_2'(\theta_2)\cos\theta_1}{D_2(0) f_1} = g_1'(\theta_1) \quad (15)$$

Since a magnification m of the re-imaging optical system 30 is as follows:

$$m = \frac{D_1}{D_2(0)} = \frac{f_1}{f_2} \quad (16)$$

Equation (14) is finally changed into Equation (17).

$$\frac{g_2'(\theta_2)\cos\theta_1}{g_1'(\theta_1)} = 1 \quad (17)$$

Accordingly, if the re-imaging optical system 30 is constructed to satisfy the above Equation (17), the diameter of outgoing beam from the re-imaging optical system 30 becomes constant irrespective of the exit angle $\theta_2$.

An example of solution to Equation (17) is as follows.

$$\begin{cases} g_1(\theta_1) = k_1\sin\theta_1 + k_2 \\ g_2(\theta_2) = k_1\theta_2 + k_3 \end{cases} \quad (18)$$

In the equations, $k_1$–$k_3$ are constants.

Thus, it is seen that the first optical system 30A may be constituted by a lens satisfying the relation of $y=f_1k_1\sin\theta_1+k_2$ and that the second optical system 30B may be constituted by a lens satisfying the relation of $y=f_2k_1\theta_2+k_3$.

For example, if $k_1=1$ and $k_2=k_3=0$, then the first optical system 30A may be constituted by an f·sinθ lens satisfying the relation of $y=f_1\sin\theta_1$ and the second optical system 30B by an fθ lens satisfying the relation of $y=f_2\theta_2$.

Also, if $k_2=k_3=0$, then the first optical system 30A may be constituted by an $fk_1\sin\theta$ lens satisfying the relation of $y=f_1k_1\sin\theta_1$ and the second optical system 30B by an $fk_1\theta$ lens satisfying the relation of $y=f_2k_1\theta_2$.

As described above, the re-imaging optical system 30 can convert beams outgoing at respective exit angles from a light source or light source image and incident thereinto into beams having a substantially constant beam diameter in all directions of incidence and entering the optical reflector 40.

Now returning to FIGS. 3A and 3B, the re-imaging optical system 30 is further described.

The first optical system 30A is constructed to satisfy the relation of $y=f_1\sin\theta_1$ where $f_1$ is a focal length of the first optical system 30A, $\theta_1$ an angle of incidence of incident beam from secondary light source, and y an image height of image formed by the first optical system 30A, while the second optical system 30B is constructed to satisfy the relation of $y=f_2\theta_2$ where $f_2$ is a focal length of the second optical system 30B and $\theta_2$ is an exit angle of outgoing beam from the second optical system 30B, which is a beam from the image height y of image formed by the first optical system 30A.

As the re-imaging optical system 30 is so arranged, the first optical system 30A converges parallel rays outgoing at each exit angle from the secondary light source at the position $A_1$ to form an aerial image I at the position $B_1$. The second optical system 30B converges rays from the aerial image I to convert them into parallel rays directed to the optical reflector 40. In other words, the first optical system 30A converges rays from the respective point sources forming the secondary light source at the position $A_1$ so that the rays are converted into parallel rays superposedly illuminating the aerial image I at the position $B_1$, for example as shown by the dotted lines in FIG. 3B. After that, the parallel rays enter the second optical system 30B and are once focused at the position $A_2$ inside the negative lens 32B in the second optical system 30B. Then the rays go to the optical reflector 40 as a condensing optical system.

A real image of secondary light source is formed at the position $A_2$ inside the negative lens 32 in the second optical system 32B, and a virtual image of secondary light source is formed at the exit pupil position $A_{20}$ of re-imaging optical system 30 such that it is always circular when the exit side of re-imaging optical system 30 is seen at an arbitrary angle.

Thus, a beam diameter P(0) of parallel rays outgoing at exit angle of 0 degree ($\psi=0°$) from the re-imaging optical system 30 is equal to a beam diameter P($\psi$) of parallel rays outgoing at exit angle $\psi$ from the re-imaging optical system 30. Therefore, parallel rays are supplied with a constant diameter $P_0$ from the exit pupil of the re-imaging optical system 30. Incidentally, the position $B_1$ of the aerial image I formed by the first optical system 30A is made coincident with the rear focal position (on the illuminated surface side) of the first optical system 30A and with the front focal position (on the light source side) of the second optical system 30B.

Parallel rays emitted at each exit angle from the re-imaging optical system 30 are reflected by the optical reflector 40 to be focused in the shape of arc on the reticle R placed at the illuminated surface.

Figure 6:
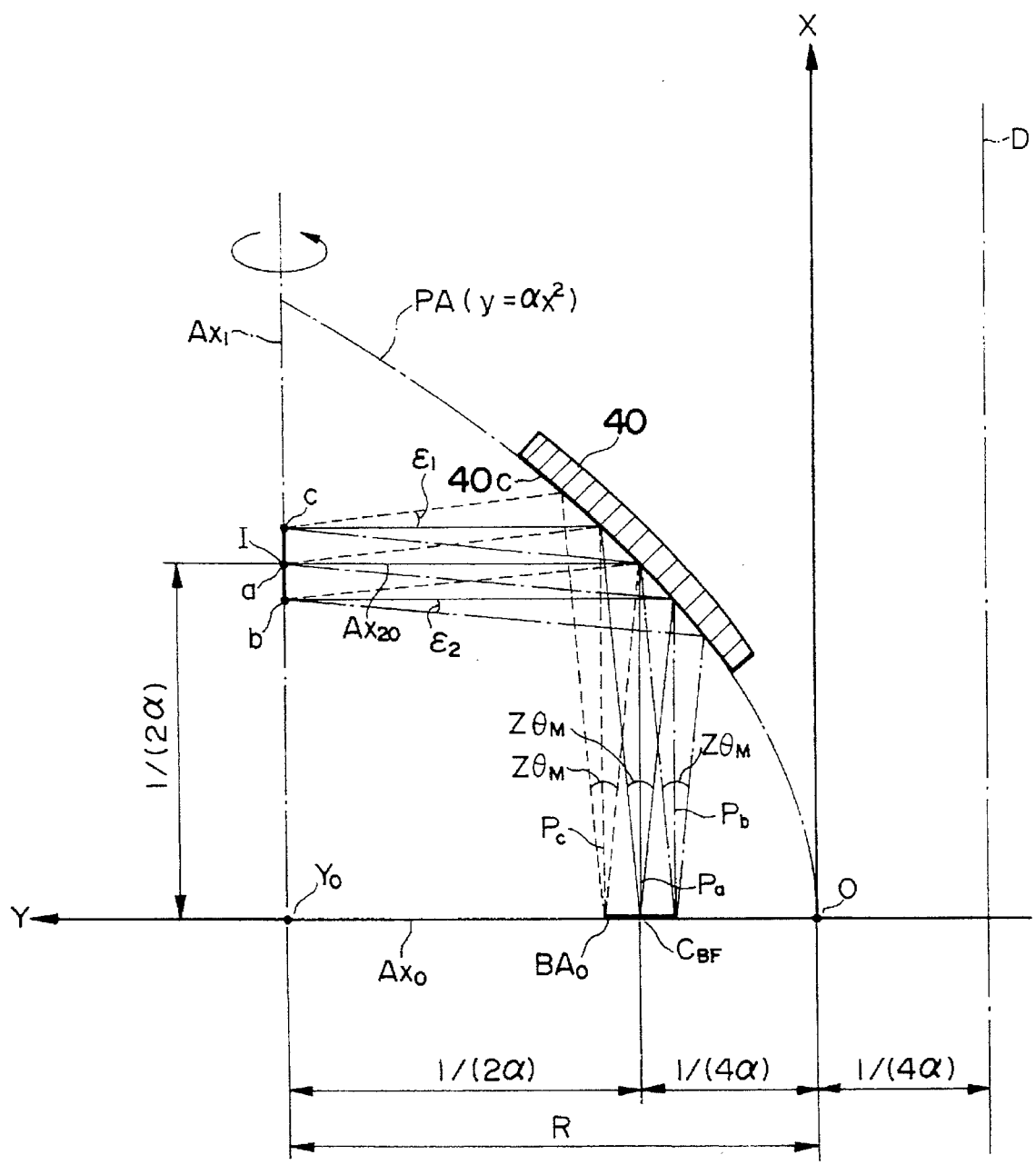
FIG. 6 is a cross sectional drawing of an optical reflector in a meridional direction.
Figure 7:
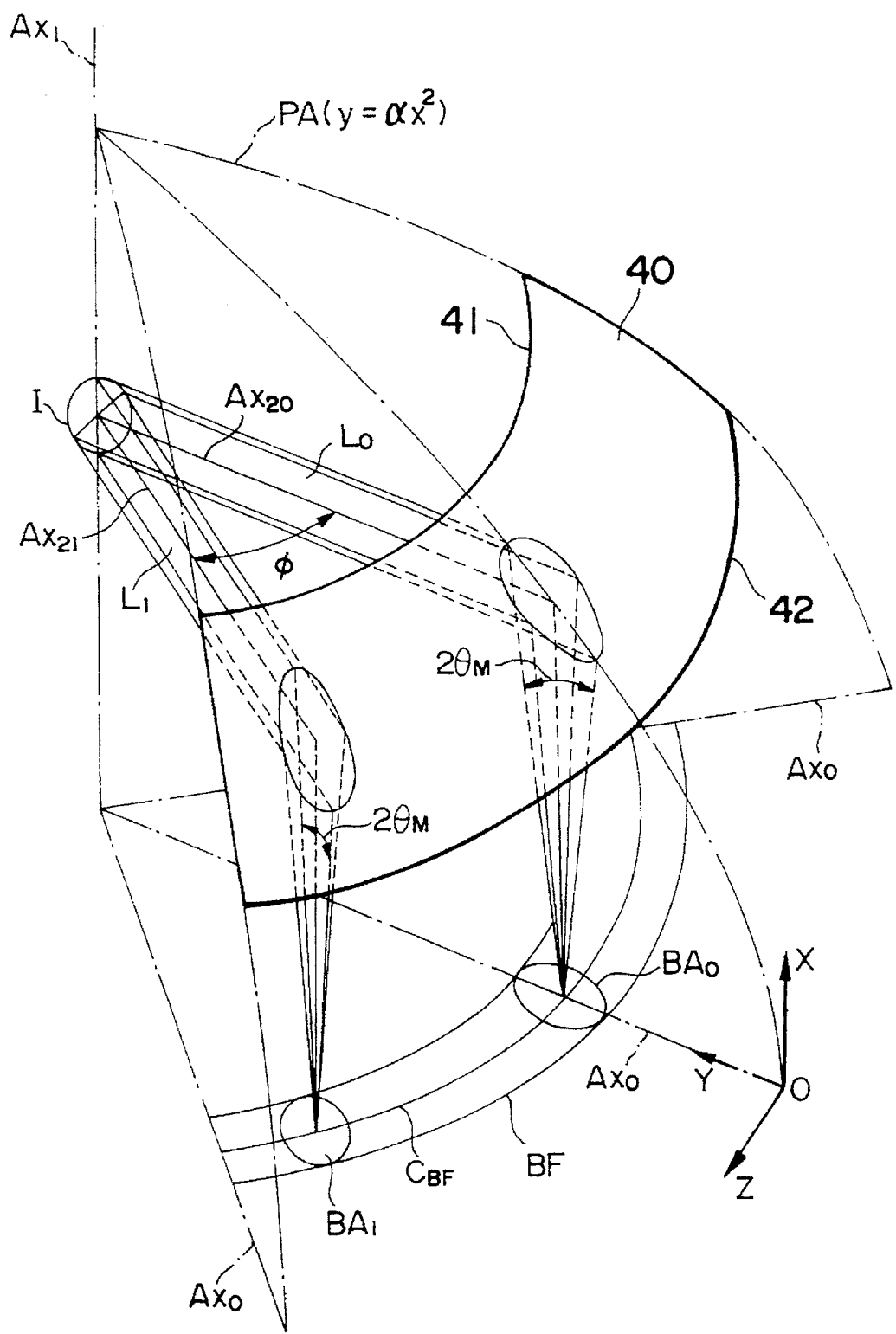
FIG. 7 is a perspective view to show an optical reflector.

The optical reflector 40 is next described. FIG. 6 and FIG. 7 show the structure of the optical reflector. FIG. 6 is a cross sectional view of the optical reflector 40 in the meridional direction, and FIG. 7 is a perspective view of the optical reflector 40.

In FIG. 6, the origin is at the vertex O of an arbitrary parabola PA, the Y axis on the symmetry axis $Ax_0$ of the parabola PA passing the vertex O, and the X axis on the axis passing the vertex O and being perpendicular to the symmetry axis $Ax_0$ (as will be denoted by Y).

As shown in FIG. 6, the cross section of the optical reflector 40 in the meridional direction constitutes a part of the parabola PA. Letting D be the directrix of the parabola PA, the reflective plane 40c of the optical reflector 40 is formed in the shape of a curved surface forming a part of parabolic toric surface obtained by rotating the parabola PA about a reference axis $Ax_1$ being parallel to the directrix D and passing a point $Y_0$ on the symmetry axis Y on the opposite side to the directrix D of the parabola PA with respect to the focus position of the parabola PA.

Namely, the optical reflector 40 has the shape of belt-like arc which is a part of a belt area between two latitudes 41 and 42 on the parabolic toric body of rotation, as shown in FIG. 7.

Returning to FIG. 6, the function of optical reflector 40 is now described as to rays in the meridional direction. Meridional rays mean rays in a plane including the reference axis $Ax_1$ of the optical reflector 40 while sagittal rays mean rays in a plane perpendicular to the meridional plane.

When a light source image I of a predetermined size (or light source with a predetermined size) is formed at a certain position on the reference axis $Ax_0$ by an unrepresented optical system, rays from an arbitrary point on the light source image I (or light source) are converted into parallel rays by the converging function of the optical reflector 40.

For example, rays from the center a of the light source image I (or light source) are converted into parallel rays by the optical reflector 40 to illuminate an area $BA_0$ on the illuminated surface normally thereto, and rays from the lower edge b of the light source image I (or light source) are converted into parallel rays by the optical reflector 40 to illuminate the area $BA_0$ on the illuminated surface obliquely from right upper. Also, rays from the upper edge c of the light source image I (or light source) are converted into parallel rays by the optical reflector 40 to illuminate the area $BA_0$ on the illuminated surface obliquely from left upper.

As described, rays from each position of light source image I (or light source) are converted into parallel rays by the optical reflector 40 to uniformly illuminate the area $BA_0$ on the illuminated surface in a superposed manner.

Now let us study the numerical aperture in the meridional direction by the optical reflector 40 in this arrangement. First, parallel rays (rays shown by solid lines) from light source image I (or light source) parallel to the optical axis $Ax_{20}$ are converged at the center of the area $BA_0$ on the illuminated surface under a numerical aperture $NA_M$ (=$\sin\theta_M$) by the optical reflector 40. Parallel rays (rays shown by dotted lines) from light source image I (or light source) having a divergent angle $\epsilon_1$ to the optical axis $Ax_{20}$ are converged at the left edge of the area $BA_0$ on the illuminated surface under a numerical aperture $NA_M$ by the optical reflector 40. Further, parallel rays (rays shown by dotted lines) from light source image I (or light source) having a divergent angle $\epsilon_2$ (=$\epsilon_1$) equal in angle to the divergent angle $\epsilon_1$ but different in divergent direction from the divergent angle $\epsilon_1$ are converged at the right edge of the area $BA_0$ on the illuminated surface under a numerical aperture $NA_M$ by the optical reflector 40. The optical axis $Ax_{20}$ is bent at 90 degrees by the optical reflector 40.

Accordingly, parallel rays having an arbitrary divergent angle from the light source image I (or light source) are converged under a constant numerical aperture $NA:_M$ at any position in the meridional direction on the area $BA_0$ of the illuminated surface. In addition, it is seen that principal rays $P_a$, $P_b$, $P_c$) of the parallel rays from light source image I (or light source) are always parallel to the optical axis $Ax_{20}$, maintaining the telecentricity.

Next described, referring to FIG. 7, is the function of the optical reflector 40 in the sagittal direction. Parallel rays $L_0$ from a light source image I (or light source) formed on the reference axis $Ax_1$ are converged on the area $BA_0$ of the illuminated surface by the optical reflector 40, and parallel rays $L_1$ from light source image I (or light source) outgoing at a divergent angle inclined at angle $\psi$ to the parallel rays $L_0$ are converged on an area $BA_1$ of the illuminated surface by the optical reflector 40.

Here, let us look at rays in the meridional direction among rays from the light source image I forming the area $BA_1$ on the illuminated surface. Then, similarly as in FIG. 6, parallel rays having an arbitrary divergent angle from light source image I (or light source) are converged under a constant numerical aperture $\theta_M$ at any position in the meridional direction on the area $BA_1$ of the illuminated surface, and in addition the principal ray in the parallel rays from the light source image I (or light source) is always parallel to the optical axis $Ax_{21}$, maintaining the telecentricity.

Accordingly, when parallel rays from the light source image I (or light source) formed on the reference axis $Ax_1$ are radially outgoing as spread in the arc direction of optical reflector 40 (in the direction along the latitudes 41, 42 of the parabolic toric body of rotation), an arcuate illumination region BF is formed while maintaining the telecentricity.

The arcuate illumination region BF corresponds to the illuminated surface, and the light source image or light source is present at infinity to the illuminated surface. A projection optical system telecentric on the entrance side is provided below the illuminated surface, as will be detailed hereinafter. A light source image is formed at the position of entrance pupil of the projection optical system. It is therefore understood that the illuminated surface can be illuminated under so-called Köhler illumination.

Next studied referring to FIGS. 8A to 8F are the analysis of the above description using equations, a suitable shape of the optical reflector, a suitable position of the light source image I (or light source), and a suitable position of the illumination region BF.

Figure 8A:
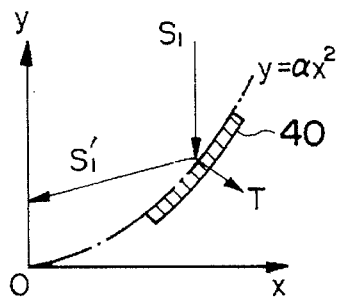
FIGS. 8A to 8F are explanatory drawings to illustrate a shape suitable for the optical reflector.

As shown in FIG. 8A, let us assume that the reflective plane of the optical reflector 40 has a surface which can be expressed in the meridional direction by a quadratic function with the origin of XY coordinate system at the vertex O of a parabola PA, that is, by $y=\alpha x^2$ (where $\alpha$ is a constant). First studied are rays parallel to the Y axis in the meridional direction.

I) Rays parallel to the Y axis in the meridional direction

A normal vector T is expressed by Equation (21) at an arbitrary point on a parabola PA ($y=\alpha x^2$).

$$T = \left( \frac{2\alpha x}{(4\alpha^2 x^2 + 1)^{0.5}}, \frac{-1}{(4\alpha^2 x^2 + 1)^{0.5}} \right) \quad (21)$$

Let a unit vector $S_1$ parallel to the Y axis in the plane of FIG. 8A be $S_1$=(0, 1), an intersection between the unit vector $S_1$ and the parabola PA ($y=\alpha x^2$) be (u, $\alpha u^2$), and a unit vector $S_1'$ of a ray reflected by the parabola PA be $S_1'$=($S_{X1}$, $S_{Y1}$). Then following Equation (22) holds.

$$S_1' = S_1 - 2T(T \cdot S_1) \quad (22)$$

Thus, the unit vector $S_1'$ after reflection is obtained as in Equation (23) from Equations (21) and (22).

$$S_1' = (S_{X1}, S_{Y1}) = \left( \frac{-4\alpha u}{(4\alpha^2 u^2 + 1)}, \frac{2}{(4\alpha^2 u^2 + 1)} - 1 \right) \quad (23)$$

A line being parallel to the unit vector $S_1'$ after reflection and passing through the point (u, $\alpha u^2$) on the parabola PA is expressed by following Equations (24) and (25).

$$x = S_{X1} t + u \quad (24)$$

$$y = S_{Y1} t + \alpha u^2 \quad (25)$$

In the equations, t is a variable.

As shown in FIG. 8A, a ray reflected at the point (u, $\alpha u^2$) on the parabola PA intersects with the y axis at x=0. The intersecting position is obtained as follows.

From Equation (24), $x = S_{X1} t + u = 0$. Then $t = -u/S_{X1}$. Substituting this value into t in above Equation (25) and using the relation of Equation (23), the following Equation (26) is obtained after arranged.

$$y = S_{Y1}\left[-\frac{u}{S_{X1}}\right] + \alpha u^2 = \frac{1}{4\alpha} \quad (26)$$

Therefore, it is seen from Equation (26) that any ray in the meridional plane parallel to the unit vector $S_1$, that is, parallel to the Y axis is converged irrespective of the value of u at the point $(0, (4\alpha)^{-1})$ on the Y axis, which is the focus position of the parabola and that the position of convergence is the illuminated surface.

As shown in FIG. 6, the ray traveling on the optical axis $Ax_{20}$ is reflected at the point $((2\alpha)^{-1}, (4\alpha)^{-1})$ on the parabola PA and turns by 90 degrees. The distance $(2\alpha)^{-1}$ from the reflection point to the illuminated surface is the focal length of the optical reflector 40.

II) Rays parallel to the X axis in the meridional direction

Figure 8B:
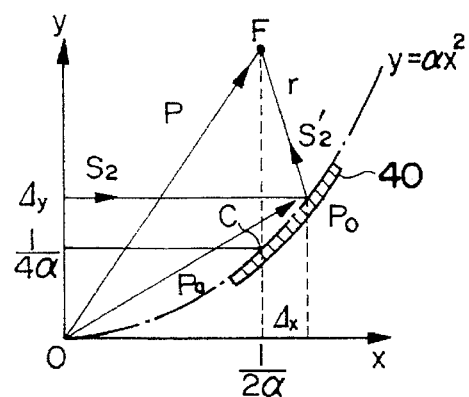

Next described, referring to FIG. 8B, are rays parallel to the X axis in the meridional direction.

When a ray from the point $(0, (4\alpha)^{-1})$ on the Y axis is reflected at the point c $((2\alpha)^{-1}, (4\alpha)^{-1})$ on the parabola PA, the ray becomes parallel to the Y axis, as described above. Then, let us obtain a position F where a ray reflected at a position $p_0$ $((2\alpha)^{-1}+\Delta x, (4\alpha)^{-1}+\Delta y)$ apart by $\Delta x$ and $\Delta y$ on the parabola PA from the point c intersects with a line $x=(2\alpha)^{-1}$.

Let a unit vector $S_2$ parallel to the X axis in the plane of FIG. 8B be $S_2=(1, 0)$ and a unit vector $S_2'$ after reflected by the parabola PA be $S_2'=(S_{X2}, S_{Y2})$. Then following Equation (27) holds.

$$S_2' = S_2 - 2T(T \cdot S_2) \quad (27)$$

Thus, the unit vector $S_2'$ after reflection is given by Equation (28) from Equations (21) and (27).

$$S_2' = (S_{X2}, S_{Y2}) = \left(1 - \frac{8\alpha^2 u^2}{(4\alpha^2 u^2 + 1)}, \frac{4\alpha u}{(4\alpha^2 u^2 + 1)}\right) \quad (28)$$

Further, let a position vector $P_0$ be a vector between the origin O (0, 0) and the point $P_0$ $((2\alpha)^{-1}+\Delta x, (4\alpha)^{-1}+\Delta y)$, P be a vector between the origin O (0, 0) and the position F, and r be a distance between the point $p_0$ and the position F. Then the following relation of Equation (29) stands.

$$P = P_0 + rS_2' \quad (29)$$

Defining the vector P as $P=(P_X, P_Y)$ where $P_X=(2\alpha)^{-1}$, Equation (30) is obtained.

$$P_X = \frac{1}{2\alpha} + \Delta x + r\left[1 - \frac{8\alpha^2(1/2\alpha + \Delta x)^2}{4\alpha^2(1/2\alpha + \Delta x)^2 + 1}\right] = \frac{1}{2\alpha} \quad (30)$$

Reforming Equation (30), the following Equation (31) is obtained.

$$r = \Delta x \frac{2\alpha^2 \Delta x^2 + 2\alpha \Delta x + 1}{2\alpha^2 \Delta x^2 + 2\alpha \Delta x} = \frac{2\alpha^2 \Delta x^2 + 2\alpha \Delta x + 1}{2\alpha^2 \Delta x + 2\alpha} \quad (31)$$

If $\Delta x$ unlimitedly approaches zero, the limit of Equation (31) is expressed by the following Equation (32).

$$\lim_{\Delta x \to 0} r = \frac{1}{2\alpha} \quad (32)$$

As apparent from Equation (32), rays parallel to the unit vector $S_2$, that is, rays parallel to the X axis are converged at a focal position of the position F $((2\alpha)^{-1}, (4\alpha)^{-1}+(2\alpha)^{-1})$ by the parabola PA. It is seen that this relation holds in the paraxial region. It is thus understood that if a light source or light source image is formed at the position F, then rays diverging from this position F can be converted into parallel beams by the reflective plane of the optical reflector 40 to illuminate the point $(0, (4\alpha)^{-1})$ on the illuminated surface and a region on the Y axis near the point. In addition, rays diverging from the center $(0, (4\alpha)^{-1})$ of the light source or light source image are always parallel to the Y axis after passed through the optical reflector 40. In other words, the exit pupil of the optical reflector 40 appears at infinity when the optical reflector 40 is seen from the illuminated surface side. Therefore, it is understood that the telecentricity is maintained.

Figure 8C:
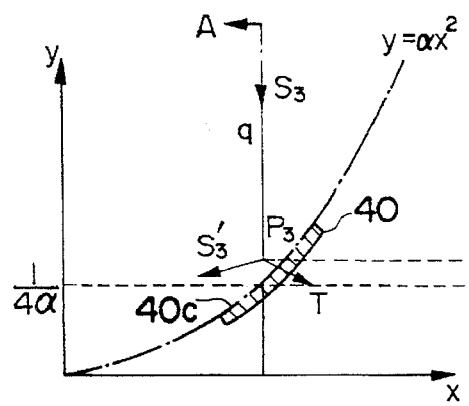
Figure 8D:
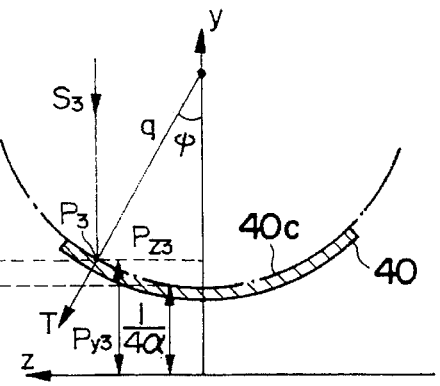

III) Rays parallel to the Y axis and passing $x=(2\alpha)^{-1}$ in the sagittal direction Rays in the sagittal direction are next studied referring to FIG. 8C and FIG. 8D.

FIG. 8C shows a state in the XY plane (meridional plane), and FIG. 8D is a drawing to show a section along AA' in FIG. 8C as seen in the direction of arrows A, A', which shows a state in a plane parallel to the YZ plane at a height of $x=(2\alpha)^{-1}$.

Consider a ray passing $x=(2\alpha)^{-1}$ in parallel with the Y axis, as shown in FIG. 8C and in FIG. 8D. Let $p_3=((2\alpha)^{-1}, P_{y3}, P_{z3})$ be a point $P_3$ where the ray is reflected at the reflective plane 40c on the optical reflector 40, q be a distance between the reference axis $Ax_1$ and the reflection point $p_3$, and $\psi$ be an angle expanded by a line connecting between the reference axis $Ax_1$ and the reflection point $p_3$ with respect to the YZ plane including the origin O. Then $P_{y3}$ and $P_{z3}$ may be expressed by Equations (33) and (34), respectively.

$$P_{y3} = q + \frac{1}{4\alpha} - q\cos\psi \quad (33)$$

$$P_{z3} = q\sin\psi \quad (34)$$

A normal vector T at the reflection point $p_3$ may be expressed by following Equation (35).

$$T = \left(\frac{1}{2^{0.5}}, -\frac{1}{2^{0.5}} \cdot \cos\psi, \frac{1}{2^{0.5}} \cdot \sin\psi\right) \quad (35)$$

Now let a unit vector $S_3$ of ray parallel to the Y axis and passing $x=(2\alpha)^{-1}$ be $S_3=(0, -1, 0)$ and a unit vector $S_3'$ of ray reflected at the point $p_3$ on the reflective plane 40c be $S_3'=(S_{X3}, S_{Y3}, S_{Z3})$. Then the following relation of Equation (36) holds.

$$S_3' = S_3 - 2T(T \cdot S_3) \quad (36)$$

Thus, the unit vector $S_3'$ after reflection is given by Equation (37) from Equations (35) and (36).

$$\begin{aligned}S_3' &= (S_{X3}, S_{Y3}, S_{Z3}) \\ &= (-\cos\psi, -1+\cos^2\psi, -\sin\psi\cos\psi)\end{aligned} \quad (37)$$

Let us consider a line passing through the reflection point $p_3$ and being parallel to the unit vector $S_3'$ after reflection. The line may be expressed by Equations (38), (39) and (40).

$$x = S_{X3}t + \frac{1}{2\alpha} \quad (38)$$

$$y = S_{Y3}t + q + \frac{1}{4\alpha} - q\cos\psi \quad (39)$$

$$z = S_{Z3}t + q\sin\psi \quad (40)$$

In the equations, t is a variable.

Now let us calculate a position where the line parallel to the unit vector $S_3'$ after reflection and passing through the reflection point $p_3$ intersects with the YZ plane including the origin O, as shown in FIG. 8D. Since x=0 in this case, putting x=0 into Equation (38) yields $t=-1/(2\alpha S_{X3})$. Substituting this value of t into Equation (39) and using the relation of Equation (37), Equation (41) is obtained after arranged.

$$y = (\cos\psi - 1) \cdot \left[ \frac{\cos\psi + 1}{2\alpha\cos\psi} - q \right] + \frac{1}{4\alpha} \quad (41)$$

As seen from Equation (41), $\cos\psi=1$. Namely, $y=(4\alpha)^{-1}$ in the paraxial region on the YZ plane at $P_{z3}=0$ as shown in FIG. 8D.

Also, substituting $t=-1/(2\alpha S_{X3})$ into Equation (40), Equation (42) is obtained after arranged.

$$z = \left[ q - \frac{1}{2\alpha} \right] \sin\psi \quad (42)$$

From this Equation (42), z=0 irrespective of the value of $P_{z3}$, when the radius of the arcuate reflective plane 40c with the center at the reference axis $Ax_1$ is $q=(2\alpha)^{-1}$, that is, when a rotation radius of the reference axis $Ax_1$ with respect to the origin O is $3(4\alpha)^{-1}(=(2\alpha)^{-1}+(4\alpha)^{-1})$.

It is thus understood that if the rotation radius of the reference axis $Ax_1$ to the origin O is $3(4\alpha)^{-1}$, then the rays parallel to the Y axis in the sagittal direction in the plane parallel to the YZ plane at height of $x=(2\alpha)^{-1}$ as shown in FIG. 8D are converged at the position $(0, (4\alpha)^{-1}, 0)$ in the paraxial region where the rays in the meridional direction are converged as described above.

IV) Rays parallel to the X axis in the sagittal direction

Figure 8E:
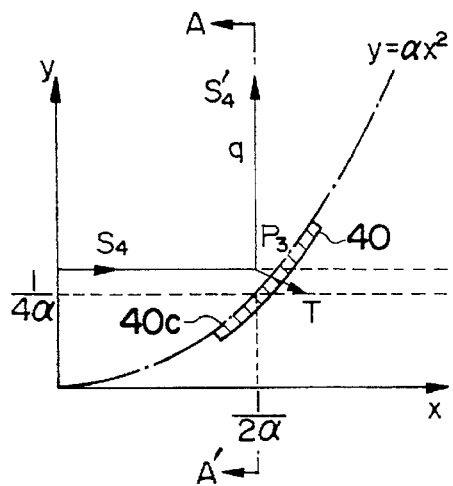
Figure 8F:
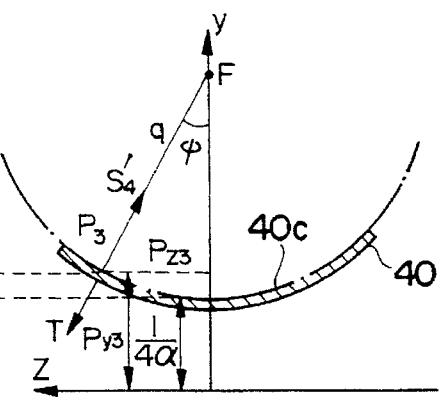

Finally studied, referring to FIG. 8E and FIG. 8F, are rays parallel to the X axis in the sagittal direction which are reflected at the reflection point $p_3$ shown in FIG. 8C and FIG. 8D.

FIG. 8E shows the state in the XY plane (meridional plane), and FIG. 8F is a cross section along AA' as seen in the direction of arrows A, A' in FIG. 8E, which shows the state in the plane parallel to the YZ plane at a height of $x=(2\alpha)^{-1}$.

Let $S_4=(1, 0, 0)$ be a unit vector $S_4$ of ray going to the reflection point $p_3$ in parallel with the X axis, and $S_4'=(S_{X4}, S_{Y4}, S_{Z4})$ be a unit vector $S_4'$ of ray reflected at the point $p_3$ on the reflective plane 40c, as shown in FIGS. 8E and 8F. Then the following relation of Equation (43) holds.

$$S_4' = S_4 - 2T(T \cdot S_4) \quad (43)$$

Thus, the unit vector $S_4'$, after reflection, is expressed by Equation (44), from Equations (35) and (43).

$$S_4' = (S_{X4}, S_{Y4}, S_{Z4}) = (0, \cos\psi, -\sin\psi) \quad (44)$$

Here, consider a line passing through the reflection point $p_3$ and being parallel to the unit vector $S_4'$ after reflection. Then the line is expressed by Equations (45), (46) and (47).

$$x = \frac{1}{2\alpha} \quad (45)$$

$$y = S_{Y4}t + q + \frac{1}{4\alpha} - q\cos\psi \quad (46)$$

$$z = S_{Z4}t + q\sin\psi \quad (47)$$

Now let us obtain a point where the ray reflected at the reflection point $p_3$ intersects with the XY plane (plane of FIG. 8E) including the origin O, as shown in FIG. 8E and FIG. 8F.

Then, since z=0, $t=-q\sin\psi/S_{Z4}$ by putting z=0 into Equation (47). Substituting this value of t into the above Equation (46) and using the relations of Equations (44) and (42), Equation (48) is obtained after arranged.

$$y = q + \frac{1}{4\alpha} = \frac{1}{2\alpha} + \frac{1}{4\alpha} = \frac{3}{4\alpha} \quad (48)$$

Accordingly, the ray passing through the reflection point $p_3$ in parallel with the X axis in the sagittal direction is converged at the point F $((2\alpha)^{-1}, 3(4\alpha)^{-1}, 0)$, which coincides with the converging point of the rays parallel to the X axis in the meridional direction as described in section II. It is thus understood that this relation holds outside the paraxial region in the absence of aberration.

Thus, diverging rays from the point F $((2\alpha)^{-1}, 3(4\alpha)^{-1}, 0)$ at the center of light source image or light source are always parallel to the XZ plane so that parallel rays illuminate the illuminated plane in the shape of arc. It is thus understood that the telecentricity is maintained over the illuminated surface of arc.

The result of the above analysis finds the fact that the optical reflector 40 is preferably formed by a part of parabolic toric body of rotation satisfying the following Equations (49) and (50) when the origin is at the vertex O of parabola ($y=\alpha x^2$) where, the Y axis is defined along the direction parallel to the symmetry axis of the parabola while passing through the origin O, the reference axis $Ax_1$ is normal to the symmetry axis Y at the position apart by a certain distance along the symmetry axis from the vertex O of the parabola, the X axis extends along the direction in parallel with the reference axis $Ax_1$ while passing through the vertex O, the Z axis is normal to the reference axis $Ax_1$ and to the symmetry axis Y while passing through the vertex O, and R is a distance from the vertex O to the intersection between the reference axis $Ax_1$ and the symmetry axis Y.

$$\left[ y - \frac{3}{4\alpha} \right]^2 + z^2 = \left[ \frac{3}{4\alpha} - \alpha x^2 \right]^2, \quad 0 \leq x \leq \frac{3^{0.5}}{2\alpha} \quad (49)$$

$$R = \frac{3}{4\alpha} \quad (50)$$

If the entrance to the optical reflector 40 is located at the position of the light source side focus $((2\alpha)^{-1})$ of the optical reflector 40 on the reference axis $Ax_1$, as shown in FIG. 6, while satisfying the relations of Equations (49) and (50) and if a generally circular light source image or light source is formed thereat, rays from the light source or light source image are converted by the optical reflector 40 into parallel rays having an arcuate cross section of beam to form an arc illumination area, in which the telecentricity and Köhler illumination state is maintained.

The center of light source image I (or light source) is at coordinates $((2\alpha)^{-1}, 3(4\alpha)^{-1}, 0)$ and the center $C_{BF}$ of the illuminated surface BF shown in FIG. 7 is a part of circle in the YZ plane satisfying following Equation (51).

$$\left[ y - \frac{3}{4\alpha} \right]^2 + z^2 = \left[ \frac{1}{2\alpha} \right]^2 \quad (51)$$

As described above, the conditions for Köhler illumination are satisfied at each point in the arc illumination area.

Figure 9:
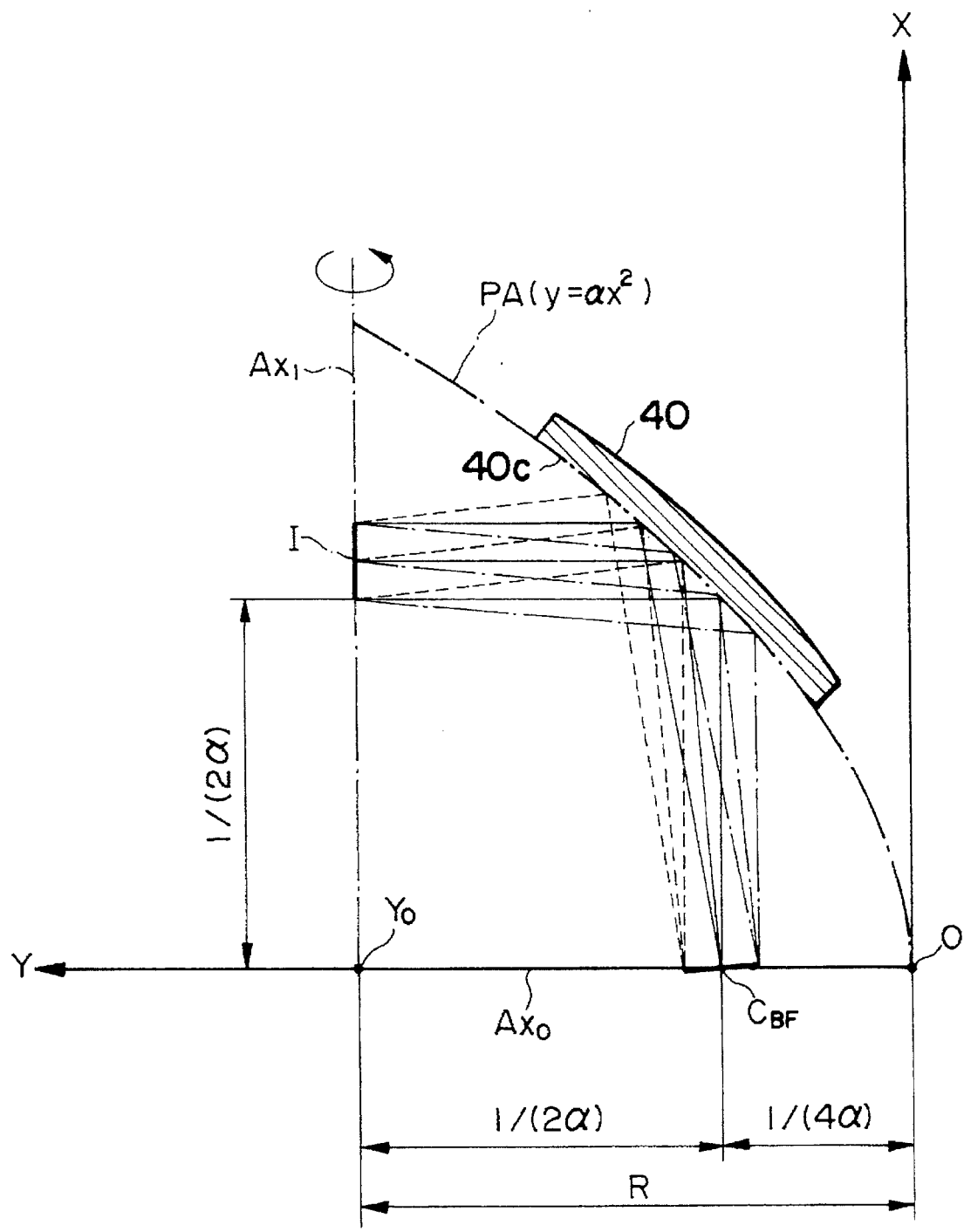
FIG. 9 is a cross sectional drawing of an optical reflector in a meridional direction.

Incidentally, the above description concerns an example in which the center of light source image I (or light source) is formed at the coordinates $((2\alpha)^{-1}, 3(4\alpha)^{-1}, 0)$ on the reference axis $Ax_1$ of the optical reflector 40. However, as far as a generally circle light source image (or light source) is formed on the reference axis $Ax_1$ of the optical reflector 40, as shown in FIG. 9, rays therefrom are converted by the optical reflector 40 into parallel rays having an arcuate cross section of beam to form an arc illumination area under Köhler illumination. In this case, the center of illumination area is formed on the symmetry axis $Ax_0$ and the coordinates thereof is $((2\alpha)^{-1}, 3(4\alpha)^{-1}, 0)$. Accordingly, the center $C_{BF}$ of the illuminated surface in the YZ plane is a part of circle satisfying above Equation (51).

Figure 10:
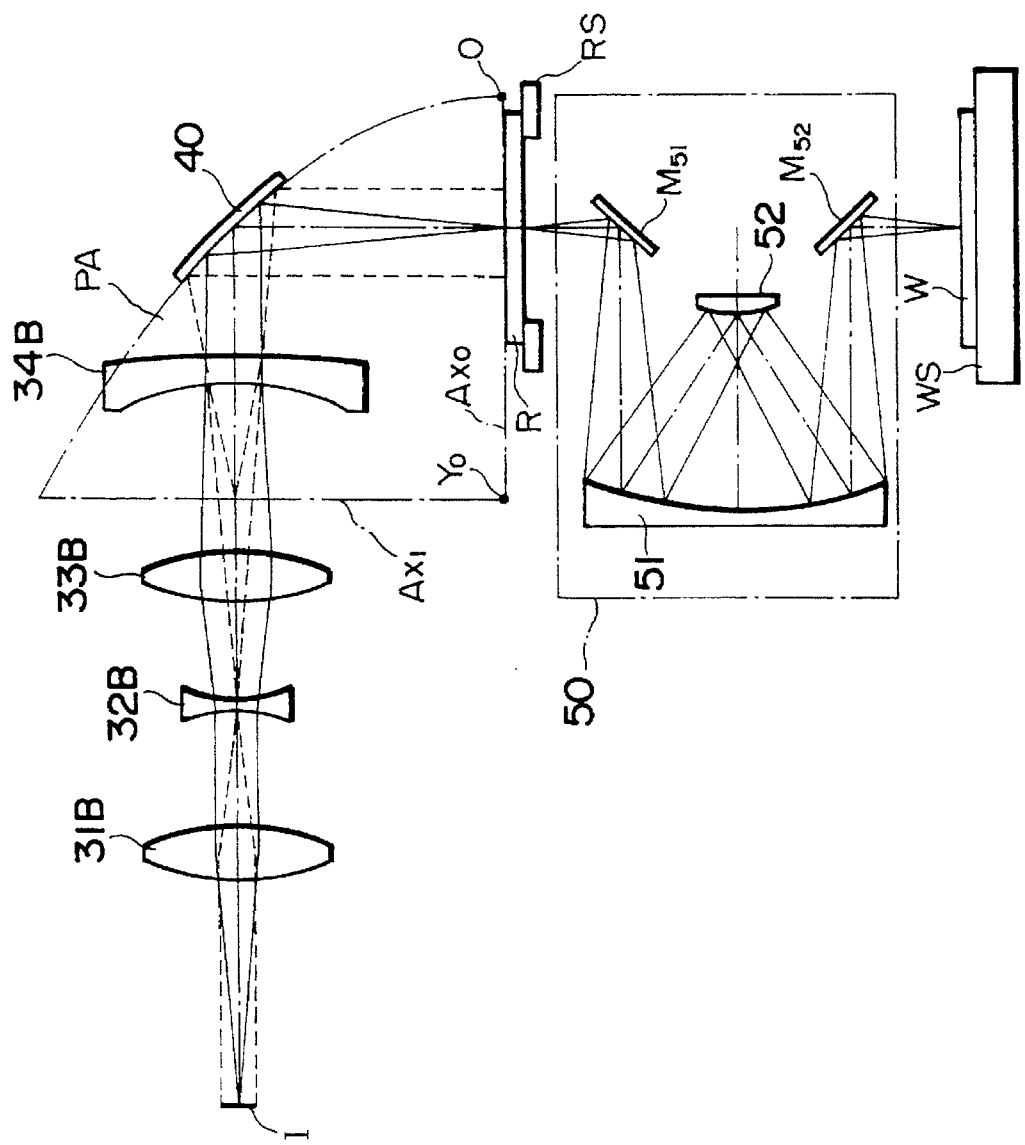
FIG. 10 is a schematic constitutional drawing to show the structure of an exposure portion.

As described above, there is a 1:1 double side telecentric projection optical system 50 provided between the reticle R and the wafer W (FIG. 10). The projection optical system 50 has basic constituents of concave mirror 51 and convex mirror 52 and further includes reflection mirrors $M_{51}$, $M_{52}$ for bending an optical path between the reticle R and the concave mirror 51 and between the concave mirror 51 and the wafer W, respectively. The center of curvature of the concave mirror 51 is approximately coincident with that of the convex mirror 52, and the radius of curvature of the convex mirror 52 is a half of that of the concave mirror 51.

The position $A_1$ of light source image formed by the optical integrator comprised in the light source image forming optical system 20, the position $A_2$ of light source image re-imaged by the re-imaging optical system 30, the position $A_{20}$ of exit pupil of the re-imaging optical system 30, and the position of entrance pupil of the projection optical system 50 (position at or near the convex mirror 52) are conjugate with each other, and the shape of light source image and pupil is circular at all the positions.

It is thus seen that an arc illumination area is formed on the reticle R and that the telecentricity is maintained under Köhler illumination.

The position $B_1$ where parallel rays outgoing at respective exit angles from the optical integrator comprised in the light source image forming optical system 20 are focused by the first optical system 30A, is conjugate with the position $B_2$ of object plane on the reticle R.

Figure 11:
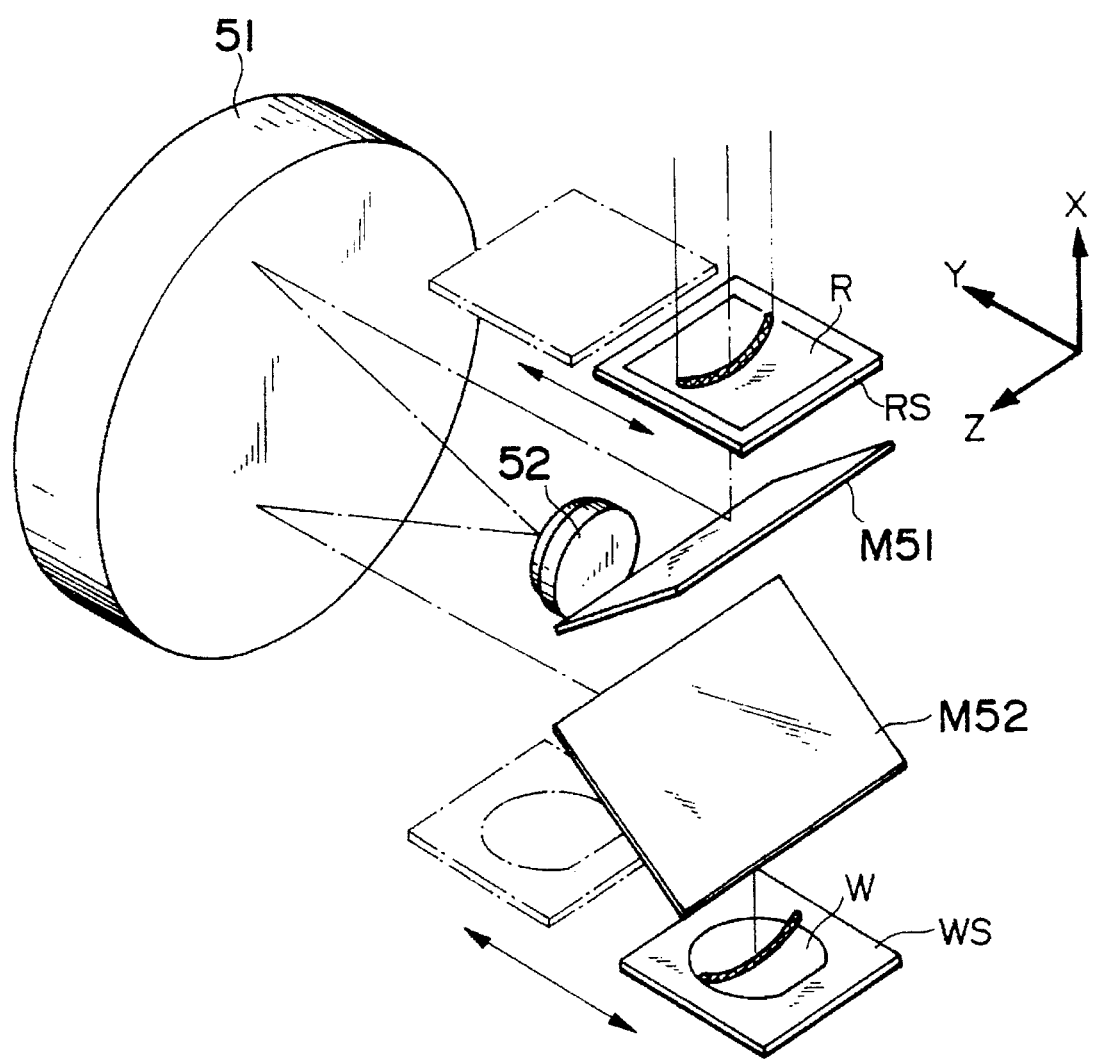
FIG. 11 is a schematic perspective view to show an extracted main part of the exposure portion.

The reticle R is held by the reticle stage RS, and the wafer W by the wafer stage WS. The reticle stage RS and the wafer stage WS are driven by a drive system as described below during exposure to move in the directions shown by arrows so that the exposure of entire pattern on the reticle R may be effected on the wafer W (see FIG. 11).

Figure 12:
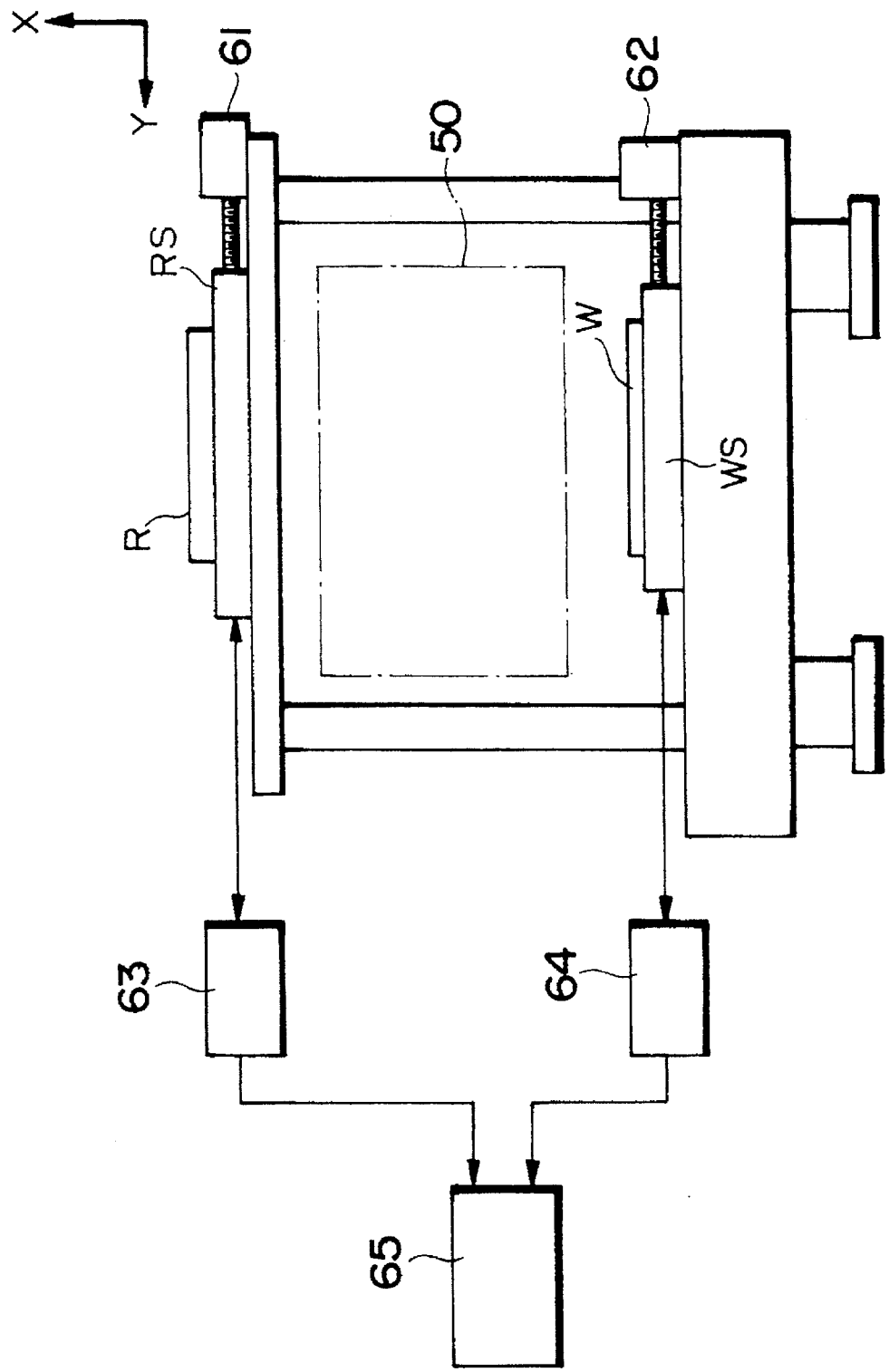
FIG. 12 is a drawing schematically to show the structure of a stepper.

Now described referring to FIG. 12 is the structure of a stepper for sequentially moving the reticle stage RS and the wafer stage WS in exposure. This stepper has the general structure for example as disclosed in Japanese Laid-open Patent Application No. 61-251025. The reticle stage RS carries the reticle R thereon and is constructed as movable in the Y direction, in the oblique and in the oblique direction to the YZ plane in the coordinate system as defined before. Also, the wafer stage WS below the reticle stage RS similarly carries the wafer W thereon and is constructed as movable in the Y direction, in the Z direction and in the oblique direction to the YZ plane in the coordinate system as defined before.

The reticle stage RS or the wafer stage WS is intermittently driven along the Y direction by a pulse motor 61 or 62, and a movement position thereof is detected by a laser interferometer 63 or 64, respectively. Detection results are input into a drive control unit 65, and the drive control unit 65 synchronization-controls a movement amount of reticle stage RS or wafer stage WS, based on the detection results. Namely, the drive control unit 65 supplies pulse signals as control signals to the pulse motors 61, 62.

The stages RS, WS do not necessarily have to be moved at the same speed but may be moved at respective speeds arranged at an appropriate ratio. Also, the stages RS, WS may be moved in different directions opposite to each other.

As described above, the apparatus shown in the present embodiment permits the reticle to be uniformly illuminated in the shape of arc at high illumination efficiency and under uniform numerical aperture, whereby the circuit pattern on the reticle R may be replicated on the wafer W in the shape of arc in short exposure time and at high resolution.

Although Embodiment 1 shows an example in which the projection optical system 50 is constituted as a 1:1 system, the projection optical system may be constituted as a demagnifying system or as a magnifying system, of course.

Embodiment I-2

FIGS. 13A and 13B show another example of the re-imaging optical system 30 in Embodiment 1 as described above. In FIGS. 13A and 13B, the same reference numerals denote the same constituent elements as those in FIGS. 3A and 3B.

Figure 14:
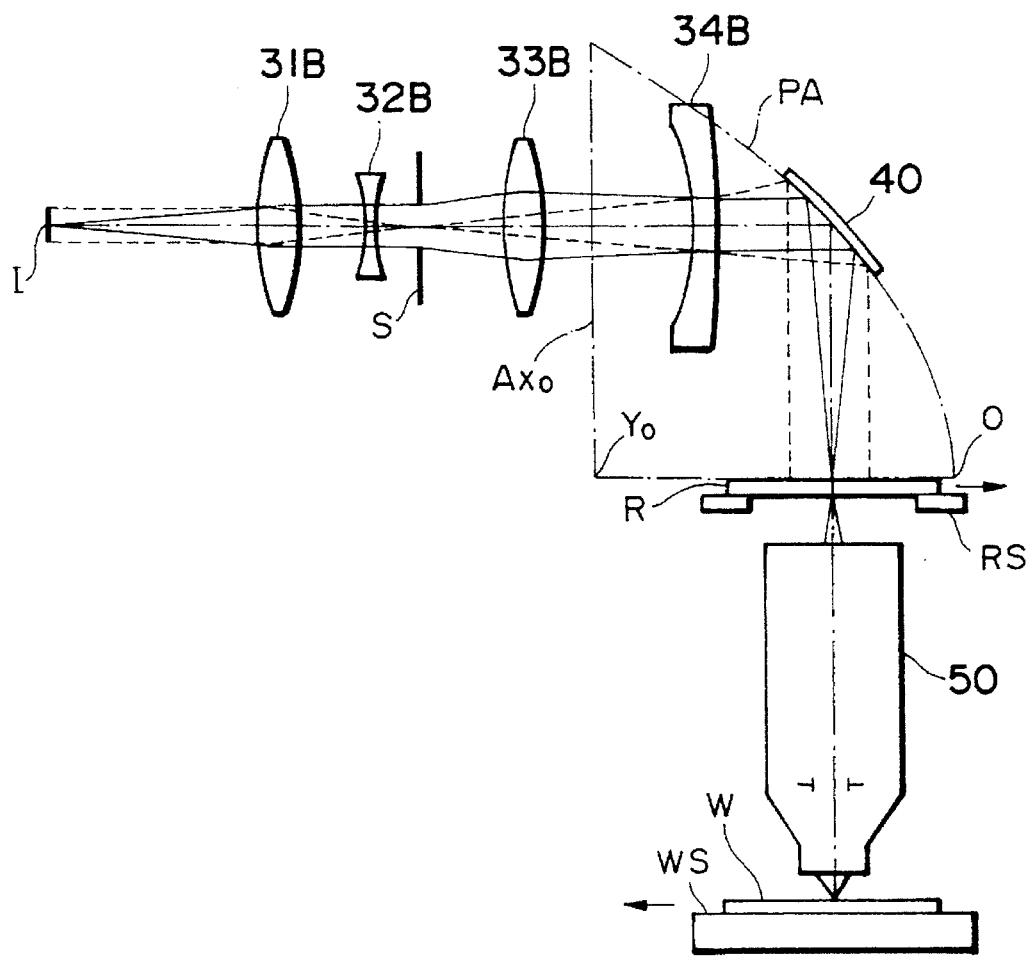
FIG. 14 is a schematic constitutional drawing to show the structure of exposure portion in the case that the re-imaging optical system shown in FIG. 13 is employed.

In Embodiment 1, the aperture stop S is disposed on the exit side of optical integrator, while in the present embodiment, a real image of secondary light source of optical integrator is formed in a space within a second optical system 30B of re-imaging optical system 30 and an aperture stop S is placed at the position $A_2$ where the real image is formed. Further, the present embodiment shows an example in which a projection optical system 50 is constituted as a refraction type demagnifying projection system as shown in FIG. 14. The arrangement of this embodiment can expect the same effect as in Embodiment 1 as described.

In case that the projection optical system 50 is constituted as a refraction-type demagnifying projection system with replication magnification of 1/n, a scan speed of wafer W will be 1/n of that of reticle R. Further, the scan direction of wafer W is opposite to that of reticle R.

Recently proposed was the oblique illumination technology attracting great attention, in which a reticle R is obliquely illuminated by shaped light from a secondary light source formed by optical integrator, for example, whereby the resolution and the depth of focus are greatly improved as compared with what the projection optical system originally has.

An example is the ring illumination method, in which a ring (doughnut) aperture portion is provided in an aperture stop disposed on the exit side of optical integrator to form a secondary light source of ring shape and to obliquely illuminate the reticle R, whereby the resolution and the depth of focus of projection optical system may be improved. Also known is the special oblique illumination method, in which the aperture stop has two or four eccentric apertures to form two or four eccentric secondary light sources and thereby to obliquely illuminate the reticle R, whereby a higher resolution and a deeper depth of focus are obtainable than those in the ring illumination method. This method is disclosed, for example, in Japanese Laid-open Patent Application No. 4-101148.

Figure 15:
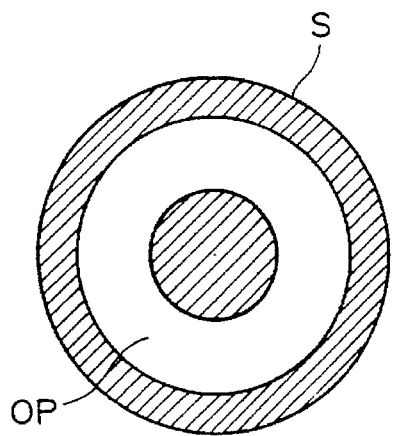
FIG. 15 is plan views to show shapes of aperture stop.

Then, if an aperture stop S having a ring aperture portion OP as shown in FIG. 15A is disposed in a second optical system 30B of a re-imaging optical system 30, rays from a ring light source formed by this aperture stop S could evenly and obliquely illuminate the area on the reticle R in the shape of arc under a unique numerical aperture, which permits faithful replication of finer reticle pattern on the wafer W in a deep depth of focus.

Also, if an aperture stop S having four eccentric aperture portions OP as shown in FIG. 15B is disposed in the second optical system of the re-imaging optical system 30 for example, rays from four eccentric light sources formed by the aperture stop S could evenly and obliquely illuminate the area on the reticle R in the shape of arc under a unique numerical aperture, which also permits faithful replication of further finer reticle pattern on the wafer W in a deep depth of focus. This is very advantageous.

The advantage of the oblique illumination method can also be expected, if the aperture stop S as shown in FIG. 15A or in FIG. 15B is applied to Embodiment 1 shown in FIGS. 3A and 3B. In such an arrangement, the reflection type projection optical system 50 shown in FIG. 10 should be preferably replaced by the demagnifying system shown in FIG. 14.

Although Embodiments 1 and 2 showed the examples in which the light source such as laser is used as means for supplying parallel rays, the means is not limited to that. For example, the means for supplying parallel rays may be constituted, for example, by an elliptic mirror, a light source of mercury arc lamp provided at the first focus position of the elliptic mirror, and a collimator lens for converting light of mercury arc lamp condensed by the elliptic mirror into parallel rays.

Further, Embodiments 1 and 2 showed the examples in which the secondary light source (surface illuminant having an area) composed of a plurality of light source images are formed by the light source 10 supplying parallel rays and the optical integrator, which serve substantially as light source means for supplying rays outgoing at respective exit angles, but the means is not limited to that. For example, the light source means may be constituted by a mercury arc lamp supplying rays radiated at respective radiation angles and a concave reflection mirror for effectively guiding the rays emitted from the mercury arc lamp to the optical system. In this case, a preferable arrangement is that a re-imaging optical system is opposed to the concave reflection mirror with the mercury arc lamp being in between and that a light emission point of mercury arc lamp is made coincident with the entrance pupil of the re-imaging optical system.

Embodiment I-3

It is preferred in the optical systems shown in Embodiments I-1 and I-2 that a field stop 35 be further provided at the position B1 shown, for example, in FIG. 3A in order to set the arcuate shape of illumination region BF.

A preferred embodiment of the field stop 35 is described in the following.

FIG. 23A is a plan view of a projection exposure apparatus in the present embodiment and FIG. 23B is a front view of the projection exposure apparatus, partly in cross section. In the drawings, the same constituents are denoted by the same reference numerals as those in the previous embodiments.

A lot of light source images are formed on the exit plane of optical integrator 22, and beams from these numerous light source images are converged through a first optical system 30A consisting of an f·sinθ lens on an aperture 36 in the field stop 35. A bundle of rays passing through the aperture 36 is converted into a bundle of parallel rays by a second optical system 30B consisting of an fθ lens, whereby the ray bundle is directed to an aperture stop 38 located on a plane P1. On the plane where the field stop 35 is set, ξ-axis is taken in the direction parallel to the plane of FIG. 23B, η-axis is taken in the direction parallel to the plane of FIG. 23A, and the origin is set at a point of intersection where the optical axis AX3 of first optical system 30A and second optical system 30B intersects with the ξη plane.

When the field stop 35 is located as described above, the light from the light source images formed by a light source image forming optical system 20 comprising the optical integrator 22 is converged on the field stop 35 on the second plane (ξη plane) by the first optical system 30A. The beam passing through the aperture 36 in the field stop 35 is converted into the bundle of parallel rays by the second optical system 30B to impinge on an optical reflector 40. A beam reflected by the optical reflector 40 illuminates the arcuate illumination region BF on the first plane (P2).

In the above arrangement, the plane of the light source images formed by the light source image forming optical system 20 is conjugate with the plane of the entrance pupil of optical reflector 40 and the ξη plane, which is the plane where the field stop 35 is set, is conjugate with the first plane (P2), which is the plane of the arcuate illumination region BF. Thus, the shape of the arcuate illumination region BF can be set in a desired shape by changing the shape of the aperture 36 in the field stop 35. Since the reflective surface of the optical reflector 40 is a part of a parabolic toric body of rotation obtained by rotating a parabola (PA) having the symmetry axis on the first plane (P2) about the reference axis (AX1) being perpendicular to the first plane (P2) and crossing the optical axis (AX3) of second optical system 30B, the arcuate illumination region BF is illuminated with nearly uniform illuminance in a state where the telecentricity and the Köhler illumination is maintained. Further, the shape of illumination region BF becomes arcuate when the shape of aperture 36 in the field stop 35 is rectangular with use of the optical reflector 40.

Figure 25:
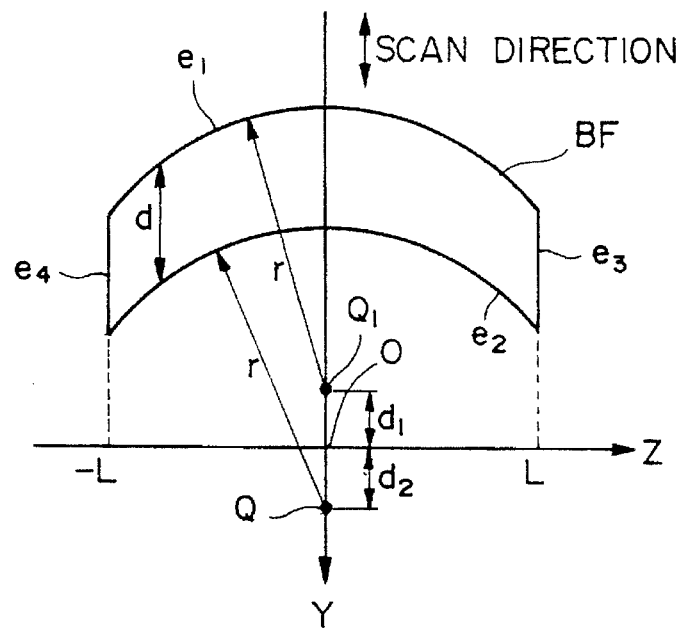
FIG. 25 is a plan view to show the shape of an illumination region set in the embodiment.

In the cases where the illumination optical system of the present embodiment is applied to scanning exposure apparatus, the reticle R is moved relative to the arcuate illumination region BF at a predetermined speed in the directions along the shorter sides thereof. In order to make uniform a distribution of integral exposure energy on the photosensitive substrate after scanning exposure, for example as shown in FIG. 25, it is necessary that a distance d along the scan directions between two arcuate contour lines $e_1$, $e_2$ in the scan directions of illumination region BF be constant at any position in the longitudinal direction (z direction). One of the ways to realize it is to make the radii of curvature of the two arcuate contour lines $e_1$, $e_2$ in the scan directions of illumination region BF equal to each other, for example, equal to r.

Figure 24:
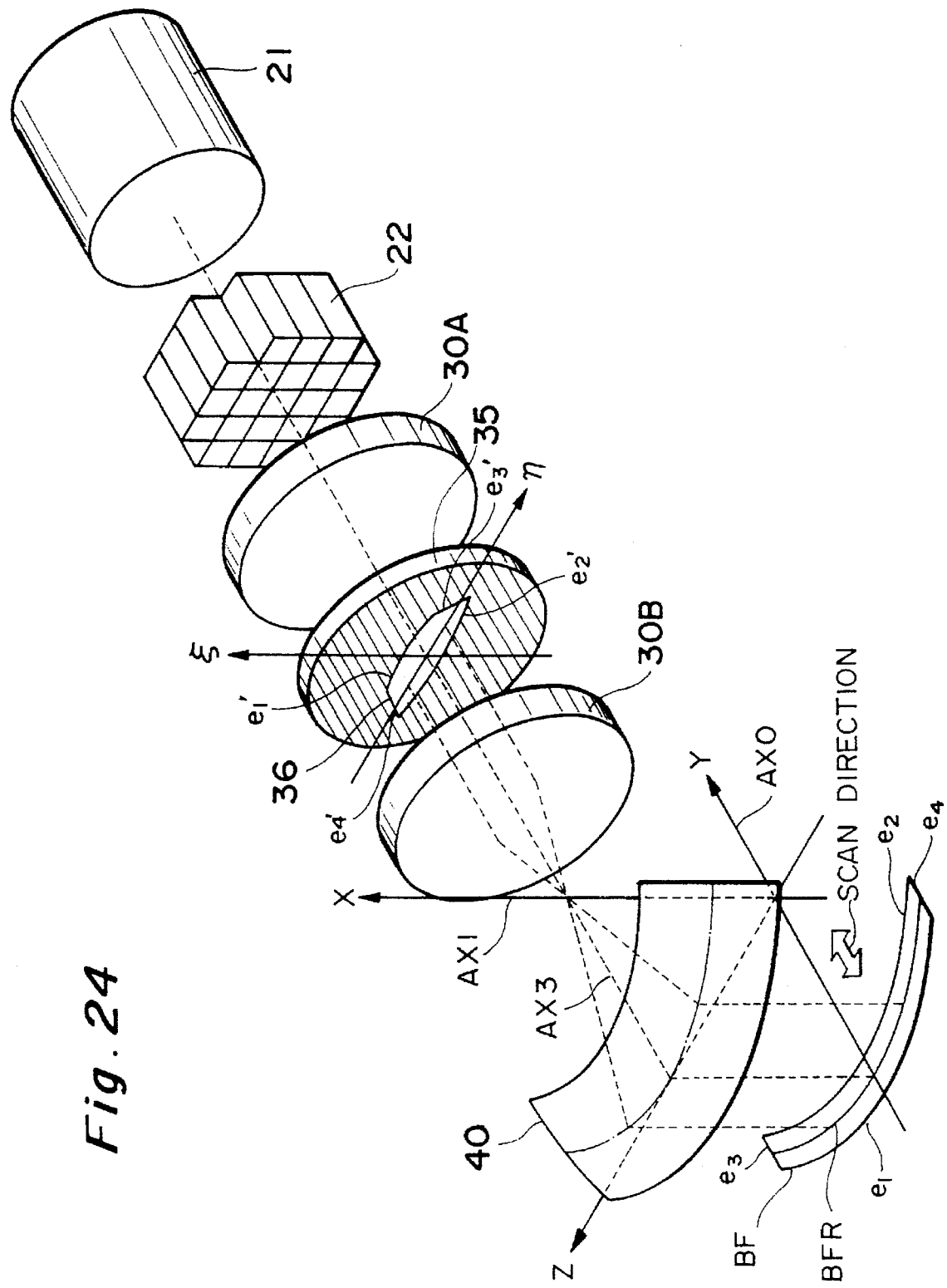
FIG. 24 is a perspective view to show the major part extracted from FIGS. 23A and 23B.

With regard to this, where the optical reflector 40 is used, the radii of curvature of the two arcuate contour lines $e_1$, $e_2$ of the illumination region BF become nearly equal to each other by such an arrangement that the shape of the aperture 36 in the field stop 35 is determined, for example as shown in FIG. 24, to be rectangular and to gradually narrow the width along the transverse direction from the center toward the either side edge. This arrangement can make the distribution of integral energy after scanning exposure nearly uniform.

Next described are conditions for the shape of the aperture 36 in the field stop 35 to have the two arcuate contour lines $e_1$, $e_2$ of illumination region BF with the equal radius of curvature r and for the shape of the aperture 36 to have two contour lines $e_3$, $e_4$ in the longitudinal direction of illumination region BF as straight lines parallel with each other along the scan directions. For simplicity, for example in FIGS. 23A and 23B, the y axis is taken along the symmetry axis AX0 of the parabola PA defining the shape of optical reflector 40, the x axis along the predetermined reference axis AX1, and the parabola PA is represented by $y=\alpha x^2 - 3/(4\alpha)$. Also, the optical axis AX3 of the second optical system 30B is so arranged as to be parallel with the y axis and to be located at a distance of $1/(2\alpha)$ from the y axis. For further simplicity, the following description concerns a case where a function $g(\theta)$ defining the image height h by parallel rays incident at an incident angle θ into the second optical system 30B with focal length f is simply θ, that is, where the second optical system 30B is an fθ lens.

First, as shown in FIGS. 23A and 23B, the z axis is taken perpendicular to the y axis and the x axis, coordinates on the plane where the field stop 35 is located are taken as (ξ, η), and the origin of coordinates (ξ, η) is taken on the optical axis AX3 of the second optical system 30B. The ξ axis is parallel to the x axis and the η axis is parallel to the z axis. Also, as shown in FIG. 25, let r be the radius of the arcuate contour lines $e_1$ and $e_2$ of the arcuate illumination region BF (hereinafter this common radius is called as "reference radius"), and let us suppose that the center of curvature $Q_1$ of the contour line $e_1$ is located at a distance $d_1$ from the origin O in the negative direction of the y axis on the yz plane and that the center of curvature $Q_2$ of the contour line $e_2$ is located at a distance $d_2$ from the origin O in the positive direction of the y axis. Then the reference radius r is equal to $1/(2\alpha)$ and the y-directional width d of illumination region BF becomes constant ($=d_1+d_2$) at any position. Also, the contour lines $e_3$ and $e_4$ in the longitudinal direction (z direction) of illumination region BF are straight lines parallel with the y axis, which are expressed by straight lines z=L and z=−L, respectively. Namely, the z-directional width of the illumination region BF is 2L.

In the following description, backward light from the contour lines of illumination region BF toward the optical reflector 40 is imaginarily considered in order to obtain the shape of the aperture 36 in the field stop 35. Namely, as shown in FIG. 24, the contour lines of the aperture 36 in the field stop 35 are determined as contour lines $e_1'$ to $e_4'$ obtained by continuously connecting coordinates of intersections where the backward light from the contour lines $e_1$ to $e_4$ of illumination region BF intersects with the ξη plane.

Figure 26:
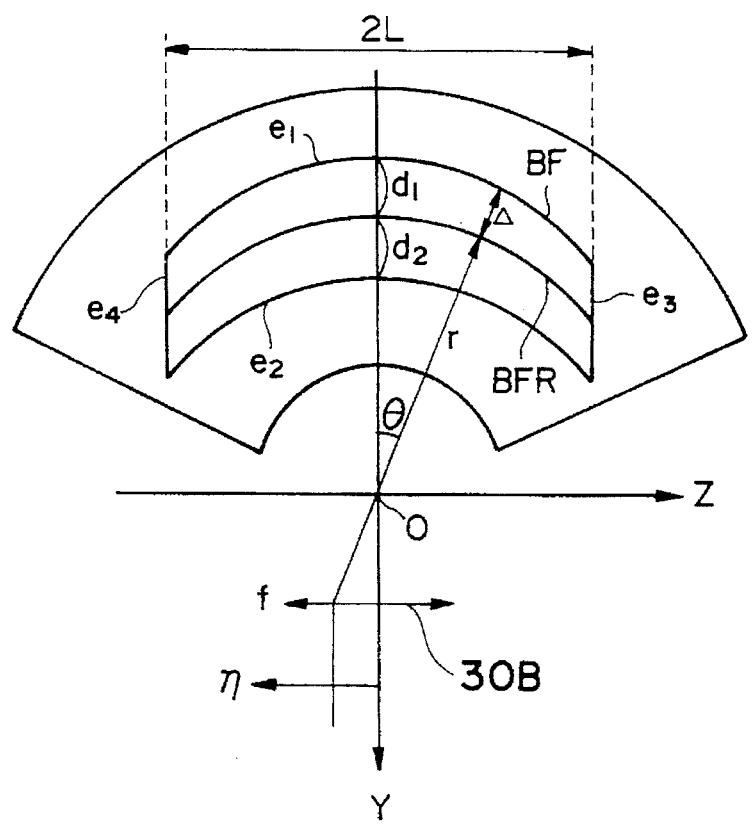
FIG. 26 is an explanatory drawing of an angular parameter θ for determining the shape of illumination region.

For that, as shown in FIG. 26, the reference is set as a reference arc BFR with the reference radius r about the origin O in the illumination region BF, a deviation amount Δ between the reference arc BFR and the contour line $e_1$ is obtained on a straight line passing the origin O and intersecting there at an angle θ with the y axis, and the backward light from the contour line $e_1$ is traced to obtain coordinates (ξ, η) of the backward light on the ξη plane. For the other contour lines $e_2$ to $e_4$, the deviation amount Δ is similarly obtained at the angle θ and then the backward light from the respective contour lines is traced. First obtained are ξ coordinates.

Figure 27A:
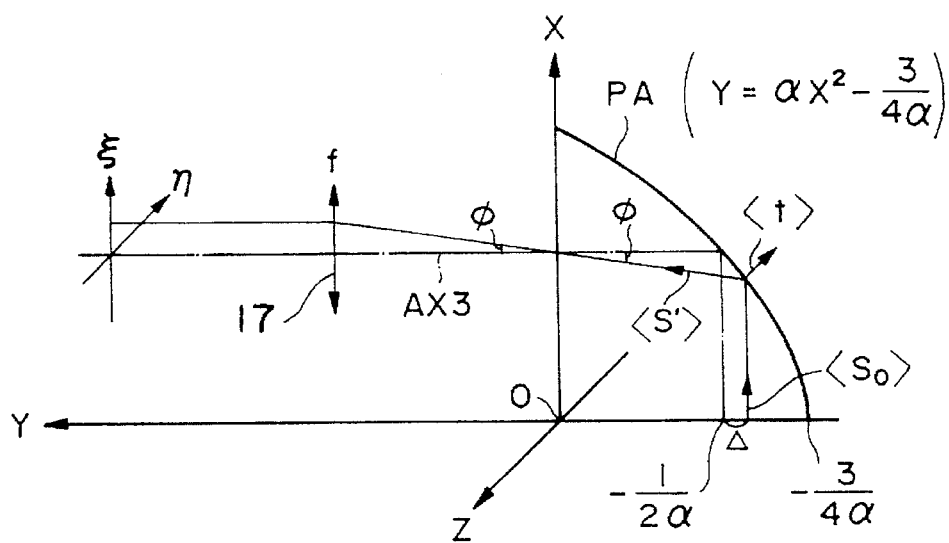
FIG. 27A and FIG. 27B are explanatory drawings to illustrate a case where backward light from a position of a deviation amount Δ on the yz plane travels via a toric reflective mirror and intersects at an angle Φ with the yz plane, and FIG. 27C an FIG. 27D are explanatory drawings to illustrate the way of obtaining the deviation amount Δ for each contour line of the illumination region.

FIG. 27A shows the xy plane and the ξη plane. In FIG. 27A, the parabola PA defining the optical reflector 40 is shown in the xy plane. Let <t> be a normal vector to the optical reflector 40 at an arbitrary point on the parabola PA, and there is a relation of dy/dx=2αx on the parabola PA. Accordingly, because the slope m of the normal vector <t> is $-1/(2\alpha x)$, the normal vector <t> can be expressed as follows.

$$<t> = \left( \frac{1}{\sqrt{1+\frac{1}{4\alpha^2 x^2}}}, \frac{-\frac{1}{2\alpha x}}{\sqrt{1+\frac{1}{4\alpha^2 x^2}}} \right) \quad (52)$$

$$= \left( \frac{2\alpha x}{\sqrt{4\alpha^2 x^2 + 1}}, \frac{-1}{\sqrt{4\alpha^2 x^2 + 1}} \right)$$

Next, let $<S_0>$ be a unit normal vector to the yz plane at a position of the deviation amount Δ from the reference arc (at the position of $-1/(2\alpha)$ of y coordinate) on the y axis. Then, $<S_0>=(1, 0)$ on the xy plane. The backward light traveling along this unit normal vector $<S_0>$ toward the optical reflector 40 is reflected by the optical reflector 40 and thereafter the reflected light travels along a unit vector <S'> indicating the traveling direction, which is given by the following equation.

$$<S'> = <S_0> - 2<t>(<S_0> \cdot <t>) \quad (53)$$

$$= (1, 0) - 2 \frac{2\alpha x}{\sqrt{4\alpha^2 x^2 + 1}} <t>$$

$$= \left( 1 - \frac{8\alpha^2 x^2}{\sqrt{4\alpha^2 x^2 + 1}}, \frac{4\alpha x}{\sqrt{4\alpha^2 x^2 + 1}} \right)$$

Figure 27B:
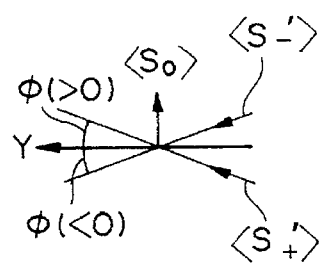

Let Φ be an angle of the unit vector <S'> with the axis parallel with the y axis. As shown in FIG. 27B, the sign convention is determined in such a manner that the sign of angle Φ is negative when the unit vector <S'> becomes a vector $<S_-'>$ rotated counterclockwise with respect to the y axis while the sign of angle Φ is positive when the unit vector <S'> becomes a vector $<S_+'>$ rotated clockwise with respect to the y axis. Under this convention, the angle Φ in FIG. 27A is expressed as follows.

$$\Phi = \pi/2 - \cos^{-1}(<S_0> \cdot <S'>) \quad (54)$$
$$= \pi/2 - \cos^{-1}\{1 - 8\alpha^2 x^2/(4\alpha^2 x^2 + 1)\}$$

Here is considered that for the parabola PA of the equation $y=\alpha x^2 - 3/(4\alpha)$, y is replaced by the deviation amount Δ. In this case, Equation (54) can be expressed as follows, using the relation of $\Delta = -1/(2\alpha) - y$.

$$\Phi = \pi/2 - \cos^{-1}[1 - \{8\alpha(1/4\alpha - \Delta)/4\alpha(1/4\alpha - \Delta)\}] \quad (55)$$
$$= \pi/2 - \cos^{-1}\{1 - (1 - 4\alpha\Delta)/(1 - 2\alpha\Delta)\}$$

Here, the deviation amount Δ is zero on the reference arc BFR, and the deviation takes positive values as it goes away from the origin O but negative values as it approaches the origin.

Figure 27C:
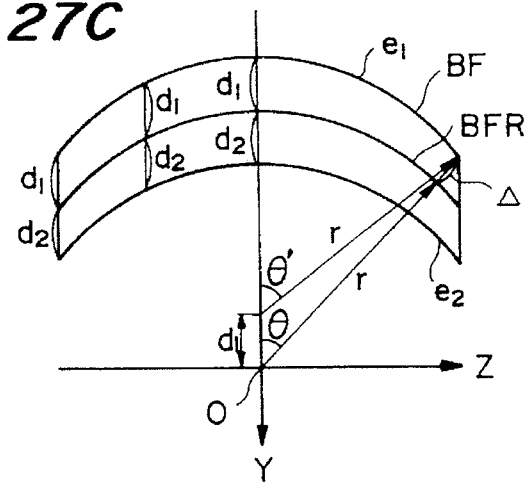

Next analyzed is the deviation amount Δ of the arcuate contour line $e_1$ of the illumination region BF from the reference arc BFR for the straight line of angle θ passing across the reference arc BFR, as shown in FIG. 27C. An equation for the contour line $e_1$ is as follows.

$$(y+d_1)^2 + z^2 = r^2 \ (-L \leq z \leq L, \ y<0)$$

Also, in FIG. 27C, supposing a straight line passing through a point $d_1$ away from the origin O on the y axis and intersecting there at an angle θ' with the y axis intersects on the contour line $e_1$ with the straight line passing through the origin O and intersecting there at the angle θ with the y axis, the following relation hold.

$$\begin{cases} (r+\Delta)\sin\theta = r\sin\theta' \\ (r+\Delta)\cos\theta = r\cos\theta' + d_1 \end{cases} \quad (56)$$

Squaring the both sides of the first equation and the second equation in Equation (56) and adding the respective sides thereof to each other, the following equations are obtained.

$$\begin{cases} (r+\Delta)^2\sin^2\theta + \{(r+\Delta)\cos\theta - d_1\}^2 = r^2 \\ (r+\Delta)^2 - 2d_1(r+\Delta)\cos\theta + d_1^2 - r^2 = 0 \end{cases} \quad (57)$$

Solving the second equation in Equation (57) by the method of solution for quadratic equations, the following solution is obtained.

$$\Delta = d_1 \cos\theta \pm \sqrt{d_1^2\cos^2\theta - d_1^2 + r^2} - r \tag{58}$$

Here, when the angle $\theta=0$, the deviation amount $\Delta=d_1$ from FIG. 27C. Taking the positive sign among the double signs in Equation (58), the following solution is obtained.

$$\Delta = d_1\cos\theta + \sqrt{d_1^2\cos^2\theta - d_1^2 + r^2} - r \tag{59}$$

Similarly, a solution of deviation amount $\Delta$ is obtained for the contour line $e_2$ of the illumination region BF. Since the contour line $e_2$ is expressed by $(y-d_2)^2+z^2=r^2(-L \leq z \leq L, Y<0)$, the deviation amount $\Delta$ is as follows.

$$\Delta = -d_2\cos\theta - \sqrt{d_2^2\cos^2\theta - d_2^2 + r^2} + r \tag{60}$$

Figure 27D:
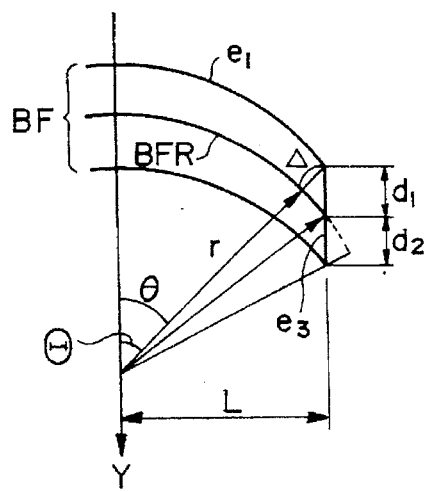

Next, returning to FIG. 26, the deviation amount $\Delta$ is obtained only for the contour line $e_3$, because the contour lines $e_3$, $e_4$ of the illumination region BF in the longitudinal direction are different only in sign of angle $\theta$ from each other. As shown in FIG. 27D, because the contour line $e_3$ is expressed by the straight line $z=L$, the following relations hold.

$$L/(r+\Delta)=\sin\theta, \ \Delta=L/\sin\theta - r \tag{61}$$

Now, let us obtain an intersection between $e_1$ and $e_3$. Here, letting $\sin\Theta=L/r$, the following relations of Equation (62) and Equation (63) are obtained for the angle $\theta$.

$$(r+\Delta)\sin\theta = L = r\sin\Theta \tag{62}$$

$$(r+\Delta)\cos\theta = r\cos\Theta + d_1 \tag{63}$$

Dividing Equation (62) by Equation (63), the following relation is derived.

$$\tan\theta = \frac{r\sin\Theta}{r\cos\Theta + d_1} = \frac{r\sin\Theta}{r\sqrt{1-\sin^2\Theta} + d_1} = \frac{L}{\sqrt{r^2 - L^2} + d_1} \tag{64}$$

From the relation obtained as Equation (64), a value of angle $\theta$ at a point of intersection between $e_1$ and $e_3$ is given by the following equation.

$$\theta = \tan^{-1}\left(\frac{L}{\sqrt{r^2 - L^2} + d_1}\right) \tag{65}$$

Similarly, the following relations are obtained for the point of intersection between $e_2$ and $e_3$ with the angle $\theta$ as to the portion of distance $d_2$ in FIG. 27D. Also, Equation (67) is obtained from Equation (66).

$$\begin{cases} (r+\Delta)\sin\theta = L = r\sin\Theta \\ (r+\Delta)\cos\theta = r\cos\Theta - d_2 \end{cases} \tag{66}$$

$$\theta = \tan^{-1}\left(\frac{L}{\sqrt{r^2 - L^2} - d_2}\right) \tag{67}$$

Then the range of angle $\theta$ defining the region of the straight contour line $e_3$ becomes as follows from Equation (65) and Equation (67).

$$\tan^{-1}\left(\frac{L}{\sqrt{r^2-L^2} + d_1}\right) \leq \theta \leq \tan^{-1}\left(\frac{L}{\sqrt{r^2-L^2} - d_2}\right) \tag{68}$$

Now, returning to FIG. 27A and considering backward light from a position of deviation amount $\Delta$ (where the angle $\theta$ is arbitrary) from the reference arc with reference radius r ($=1/(2\alpha)$) about the origin O on the yz plane (the plane of the slit illumination region BF), the angle $\Phi$ of backward light which the backward light makes with the yz plane after reflected is given by Equation (55). Since the second optical system 30B is assumed to be the f$\theta$ lens, a $\xi$ coordinate of the backward light on the $\xi\eta$ plane, which is the plane of the field stop 35, is f$\Phi$.

For example, as shown in FIG. 27B, the backward light returning as perpendicular to the yz plane from the point of intersection between the straight line crossing the y axis at the angle $\theta$ and the contour line of illumination region BF, to the optical reflector 40 is reflected by the optical reflector 40 and thereafter goes into the second optical system 30B at the angle $\theta$ in the $\eta$ direction with respect to the optical axis AX3 of the second optical system 30B. Accordingly, the $\eta$ coordinate of the backward light on the $\xi\eta$ plane, which is the plane of the field stop 35, is f$\theta$.

As a consequence, supposing the field stop 35 is placed at a position conjugate with the illumination region BF between the first optical system 30A and the second optical system 30B as an f$\theta$ lens, the contour lines $e_1'$ to $e_4'$ of the aperture 36 in the field stop 35 need to be lines expressed by the following equations in order to obtain the contour lines $e_1$ to $e_4$ shown in FIG. 25 as those of the illumination region BF.

(1) Contour line $e_1'$:

$$\xi = f\Phi = f\left(\frac{\pi}{2} - \cos^{-1}\left(1 - \frac{1-4\alpha\Delta}{1-2\alpha\Delta}\right)\right), \tag{69}$$

where $$\Delta = d_1\cos\theta + \sqrt{d_1^2\cos^2\theta - d_1^2 + r^2} - r$$

$$\eta = f\theta$$

Here, the following defines conditions for the range of angle $\theta$, etc.

$$-\tan^{-1}\left(\frac{L}{\sqrt{r^2-L^2} + d_1}\right) \leq \theta \leq \tan^{-1}\left(\frac{L}{\sqrt{r^2-L^2} + d_1}\right) \tag{70}$$

$$r = \frac{1}{2\alpha}$$

(2) Contour line $e_2'$:

$$\xi = f\left(\frac{\pi}{2} - \cos^{-1}\left(1 - \frac{1-4\alpha\Delta}{1-2\alpha\Delta}\right)\right), \tag{71}$$

where $$\Delta = -d_2\cos\theta - \sqrt{d_1^2\cos^2\theta - d_2^2 + r^2} + r$$

$$\eta = f\theta$$

Here, the following defines conditions for the range of angle $\theta$, etc.

$$-\tan^{-1}\left(\frac{L}{\sqrt{r^2-L^2}-d_2}\right) \leq \theta \leq \tag{72}$$

$$\tan^{-1}\left(\frac{L}{\sqrt{r^2-L^2}-d_2}\right)$$

(3) Contour line $e_3'$:

$$\xi = f\left(\frac{\pi}{2} - \cos^{-1}\left(1 - \frac{1-4\alpha\Delta}{1-2\alpha\Delta}\right)\right), \tag{73}$$

where $$\Delta = \frac{L}{\sin\theta} - r$$

$$\eta = f\theta$$

$$\tan^{-1}\left(\frac{L}{\sqrt{r^2-L^2}+d_1}\right) \leq \theta \leq \tag{74}$$

$$\tan^{-1}\left(\frac{L}{\sqrt{r^2-L^2}-d_2}\right)$$

(4) Contour line $e_4'$:

$$\xi = f\left(\frac{\pi}{2} - \cos^{-1}\left(1 - \frac{1-4\alpha\Delta}{1-2\alpha\Delta}\right)\right), \tag{75}$$

where $$\Delta = \frac{-L}{\sin\theta} - r$$

$$\eta = f\theta$$

Here, the following defines conditions for the range of angle $\theta$, etc.

$$-\tan^{-1}\left(\frac{L}{\sqrt{r^2-L^2}-d_2}\right) \leq \theta \leq \tag{76}$$

$$-\tan\left(\frac{L}{\sqrt{r^2-L^2}+d_1}\right)$$

Figure 28:
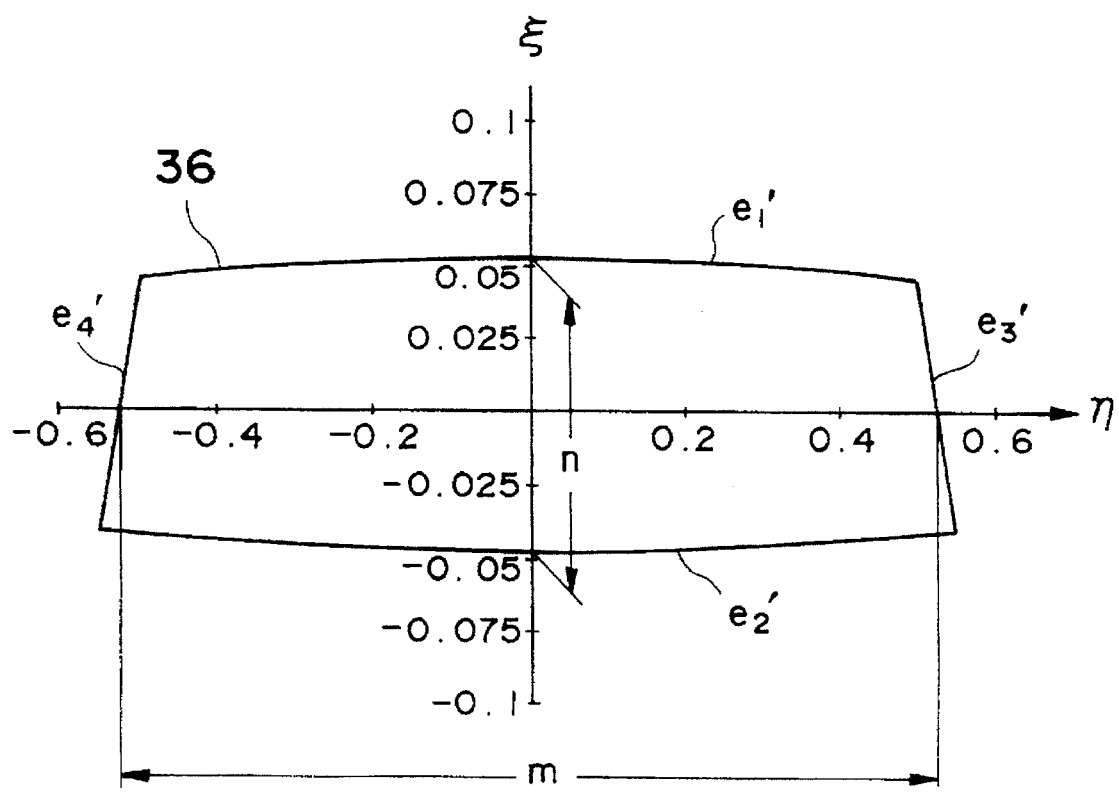
FIG. 28 is a drawing to show an example of the aperture in the field stop in the embodiment.

In the cases where the second optical system 30B is a general $f \cdot g(\theta)$ lens, Equations (69) to (75) should be rewritten with $\xi = f \cdot g(\Phi)$ and $\eta = f \cdot g(\theta)$. Further, the following equations (77) to (80) are equations obtained by substituting angles $\theta_1$ and $\theta_2$ into the angles $\Phi$ and $\theta$, respectively, and $\Delta_1$ to $\Delta_4$ into the respective deviation amounts $\Delta$ for the contour lines $e_1'$ to $e_4'$. FIG. 28 shows an example of the aperture 36 in the field stop 35 having the contour lines $e_1'$ to $e_4'$ expressed by these Equations (77) to (80). As seen from FIG. 28, the aperture 36 has a tendency that the width in the $\xi$ direction becomes gradually narrower toward the both edges in the longitudinal direction ($\eta$ direction).

$$\xi = f \cdot g(\theta_1) \tag{77}$$
$$\eta = f \cdot g(\theta_2)$$
where $$\theta_1 = \frac{\pi}{2} - \cos^{-1}\left(1 - \frac{1-4\alpha\Delta_1}{1-2\alpha\Delta_1}\right),$$

$$\Delta_1 = d_1\cos\theta_2 + \sqrt{d_1^2\cos^2\theta_2 - d_1^2 + r^2} + r$$

$$\xi = f \cdot g(\theta_1) \tag{78}$$
$$\eta = f \cdot g(\theta_2)$$
where

-continued $$\theta_1 = \frac{\pi}{2} - \cos^{-1}\left(1 - \frac{1-4\alpha\Delta_2}{1-2\alpha\Delta_2}\right),$$

$$\Delta_2 = -d_2\cos\theta_2 - \sqrt{d_2^2\cos^2\theta_2 - d_2^2 + r^2} + r$$

$$\xi = f \cdot g(\theta_1) \tag{79}$$
$$\eta = f \cdot g(\theta_2)$$
where $$\theta_1 = \frac{\pi}{2} - \cos^{-1}\left(1 - \frac{1-4\alpha\Delta_3}{1-2\alpha\Delta_3}\right),$$

$$\Delta_3 = \frac{L}{\sin\theta_2} - r$$

$$\xi = f \cdot g(\theta_1) \tag{80}$$
$$\eta = f \cdot g(\theta_2)$$
where $$\theta_1 = \frac{\pi}{2} - \cos^{-1}\left(1 - \frac{1-4\alpha\Delta_4}{1-2\alpha\Delta_4}\right),$$

$$\Delta_4 = \frac{-L}{\sin\theta_2} - r$$

FIG. 24 is a perspective view to show the major part of FIGS. 23A and 23B. In FIG. 24, the contour lines of the aperture 36 in the field stop 35, which are conjugate with the contour lines $e_1$ to $e_4$ of the illumination region BF, are expressed as $e_1'$ to $e_4'$. Because of the effect of the optical reflector 40, even if the illumination region BF is arcuate, the shape of the aperture 36 can be nearly rectangular where the width of the aperture becomes gradually narrower toward the edges in the direction perpendicular to the direction conjugate with the moving directions of reticle R ($\xi$ direction). The more strict shape of the contour lines $e_1'$ to $e_4'$ on the $\xi\eta$ plane is expressed by Equations (69), (71), (73), and (75) as already described. Also, the range of angle $\theta$ as a parameter is expressed by each of Equation (70), Equation (72), Equation (74), and Equation (76). The meaning of this angle $\theta$ is that when a straight line is drawn so as to pass the origin O on the yz plane and to cross the y axis at the angle $\theta$, as shown in FIG. 26, the coordinates ($\xi$, $\eta$) of each contour line of the aperture 36 in the field stop 35, conjugate with a point of intersection between the straight line and the contour line of illumination region BF, are expressed by each of Equation (69), Equation (71), Equation (73), and Equation (75).

FIG. 28 shows an example of the shape on the $\xi\eta$ plane, of the contour lines $e_1'$ to $e_4'$ of the aperture 36 in the aperture stop 35, as determined by the above method. Specifically, the shape is determined with such values of parameters as L=50 (mm), $\alpha=1/(2r)=0.005$ (mm$^{-1}$), $d_1=5$ (mm), and $d_2=5$ (mm), as normalizing the focal length f of the second optical system 30B to 1.

Placing such a field stop 35 on the $\xi\eta$ plane of FIGS. 23A and 23B, the second optical system 30B and the optical reflector 40 work to make the radii of curvature of the upper arc and lower arc of the arcuate illumination region on the reticle R equal to r. Since the moving directions of reticle R relative to the illumination region BF are parallel with the y axis and the width of the illumination region BF in the moving directions is constant, i.e., equal to ($d_1+d_2$) anywhere, the distribution of integral exposure energy is uniform on the wafer W after scanning exposure. In this case, as seen from FIG. 28, the shape of the contour lines of the aperture 36 in the field stop 35 is nearly rectangular, which facilitates formation of the aperture as compared with formation of an arcuate aperture. If the width of the aperture 36 on the ξ-axis is n and the length thereof on the η-axis is m, a width-to-length ratio of the aperture 36 can be regarded as n:m.

Then, returning to FIGS. 23A and 23B, a cross section of each of lens elements constituting the fly's eye lens in the optical integrator 22 is determined as a rectangular shape with the same width-to-length ratio as that (n:m) of the aperture 36 in the field stop 35 of FIG. 28. A loss of beams from the optical integrator 22 is very small because of the arrangement that the width-to-length ratio of the cross section of each lens element in the optical integrator 22 is arranged to be equal to that of the aperture 36 in the field stop 35. In addition, all of the beams passing through the aperture 36 illuminate the illumination region BF, thereby obtaining an illumination system with little loss in quantity of light as a whole.

Further, because part of the relay lens and the optical reflector 40 is used to project an image of the field stop 35 onto the reticle R so as to illuminate the reticle R in the arcuate region, there is no need to use the re-imaging optical system as used in the conventional apparatus to illuminate the reticle R. In this case, the illumination region BF is greater than the aperture 36 in the field stop 35, and therefore the first and second optical systems 30A, 30B as a relay lens system in the present embodiment are smaller than the conventional re-imaging optical system, thus making the illumination optical system smaller as a whole.

Since the above embodiment is so arranged that the relay lens in the first optical system 30A is the f·sinθ lens and the relay lens in the second optical system 30B is the fθ lens, the numerical aperture (NA) of the illumination light on the reticle plane as an illuminated surface is constant. Further, such an arrangement is possible that two optical integrators 22 are arranged along the optical axis and a relay lens is set between the two optical integrators to make the entrance planes of the fly's eye lenses conjugate with each other and to make the exit planes thereof conjugate with each other. This arrangement can greatly increase the number of light source images, which is advantageous especially when an excimer laser light source or the like is used as a light source 10.

Another embodiment of the present invention will be described referring to FIGS. 29A and 29B. This embodiment is substantially the same in the basic structure of illumination optical system as the embodiment shown in FIGS. 23A and 23B, except that the shape of the aperture 36 in the field stop 35 is slightly modified.

Figure 29A:
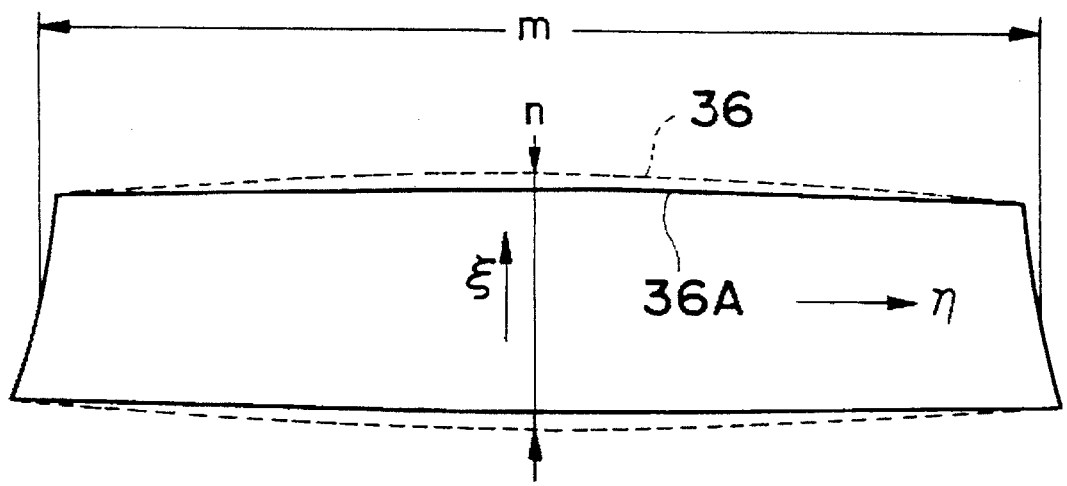
FIG. 29A and FIG. 29B are drawings to show another embodiment of the aperture in the field stop.

FIG. 29A shows the shape of the aperture in the field stop 35 on the ξη plane, used in the present embodiment, in which the contour lines shown by the dotted lines represent the aperture 36 shown in FIG. 28.

As shown, the width of the aperture 36A is narrower in the central portion than that of aperture 36. This also makes the center width of the arcuate illumination region BF on the reticle R narrower, which can be used to adjust illuminance unevenness of scanning exposure apparatus for exposure with simultaneously moving the reticle R and the wafer W onto which an image of reticle R is to be transferred. Namely, when the reticle R is moved in the direction of the width of the arcuate illuminated region BF (in the y direction), the direction of the length of the arcuate illumination region BF (z direction) determines the exposure region and the direction of the width (y direction) determines the quantity of light. When the power of illumination light is biased to the central portion as compared with the peripheral region of the illumination region BF, the field stop 35 with the aperture 36A formed therein is used to make thinner the width of the central portion of the illumination region BF in the scan directions, whereby the integral light quantity on the wafer W becomes constant in the z direction, thus performing exposure without illuminance unevenness.

Figure 29B:
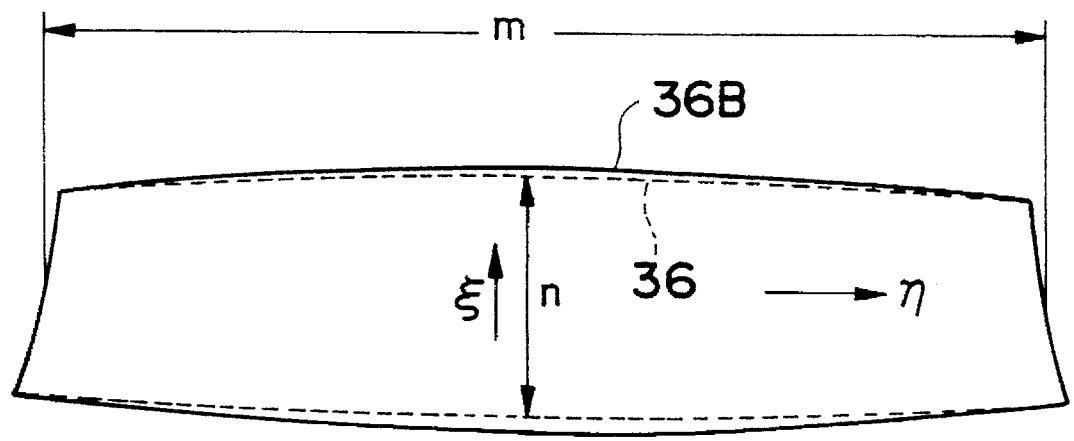

Also, another aperture 36B with a wider central portion than the peripheral portions as shown in FIG. 29B, opposite to the above aperture 36A, can be used if the power of illumination light is biased to the peripheral regions as compared with the central portion of illumination region BF, whereby the illuminance unevenness biased to the peripheral regions can be corrected.

The embodiments as described can be similarly applied to the X-ray reflecting illumination system as well as the illumination systems for ordinary exposure apparatus.

According to the above embodiments, the field stop for cutting excessive light unnecessary for illumination is set between the relay optical systems, obviating the projection means for projecting the illuminated region and thereby decreasing the number of components. Since the shape of the aperture in the field stop is determined as rectangular with the width becoming narrower toward the both edges in the longitudinal direction, the radii of curvature of the two arcuate contour lines of the arcuate illumination region are approximately equal to each other and the width of the illumination region is nearly constant. Accordingly, when the illumination optical system is applied to applications in which the scanning exposure is performed, there is an advantage that the distribution of exposure energy becomes uniform after exposure.

When the shape of the aperture in the field stop is defined in the predetermined shape, the radii of curvature of the two arcuate contour lines of the arcuate illumination region become equal to each other, and the width of the illumination region becomes constant.

Embodiment I-4

Figure 16:
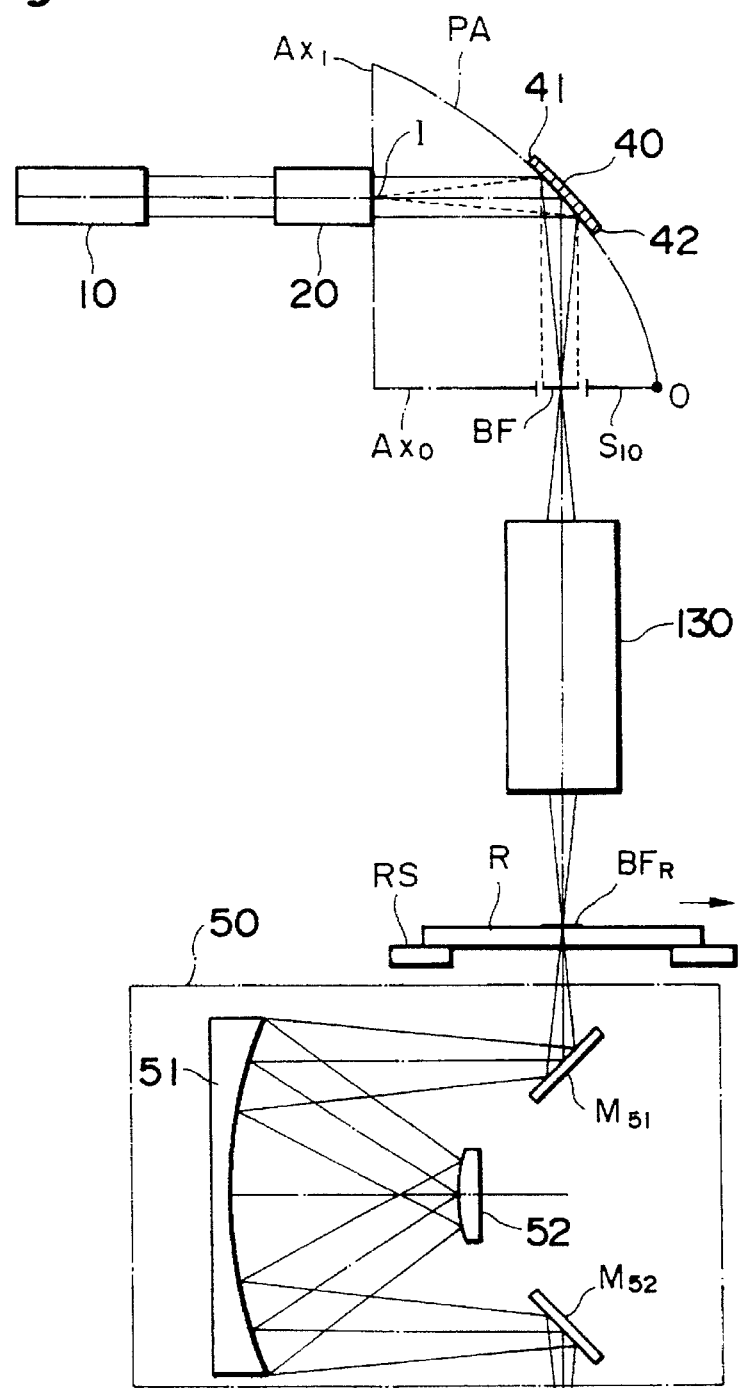
FIG. 16 is a schematic constitutional drawing to show another embodiment of optical exposure apparatus.

FIG. 16 shows another embodiment of the present invention. In this embodiment a re-imaging optical system 130 is disposed below an illumination area BF of optical reflector 40 and a reticle R is placed further below the re-imaging optical system 130.

Figure 17:
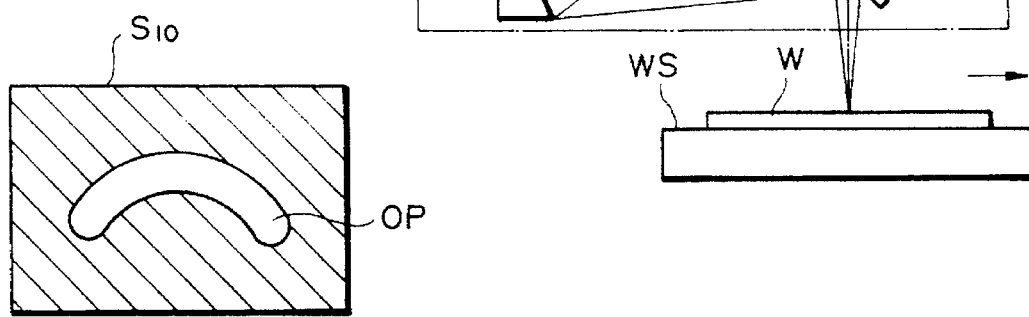
FIG. 17 is a plan view to show a slit plate.

A slit plate $S_{10}$ (see FIG. 17) is provided at the position of the illumination area BF as a field stop having an arcuate aperture portion OP for accurately defining an illumination area $BF_R$ on the reticle R. Rays passing through the slit plate $S_{10}$ are again converged through the re-imaging optical system 130 on the reticle R to form the arc illumination area $BF_R$ thereon while maintaining the telecentricity.

The rays passing through the slit plate $S_{10}$ are focused at the position of pupil (entrance pupil) of the re-imaging optical system 130 to form a light source image I' thereat.

A light source image I formed by the light source image forming optical system 20 (at the light source side focus position of optical reflector 40) is substantially conjugate with the entrance pupil of the re-imaging optical system 130 and with the entrance pupil of a projection optical system 50 (at or near a convex mirror 52). In addition, the light source image I, the entrance pupil of re-imaging optical system 130, and the entrance pupil of projection optical system 50 all are circular in shape.

It is thus seen that the arc illumination area is formed on the reticle R and that the telecentricity is maintained under Köhler illumination.

Accordingly, the apparatus as so arranged also permits the reticle R to be uniformly illuminated in the shape of arc at high illumination efficiency, whereby the circuit pattern on the reticle R may be faithfully replicated on the wafer W in a short exposure time.

Next described is the structure of the re-imaging optical system 130 in the present embodiment.

The same reference numerals denote the same constituent elements as those in the preceding embodiments.

Figure 18:
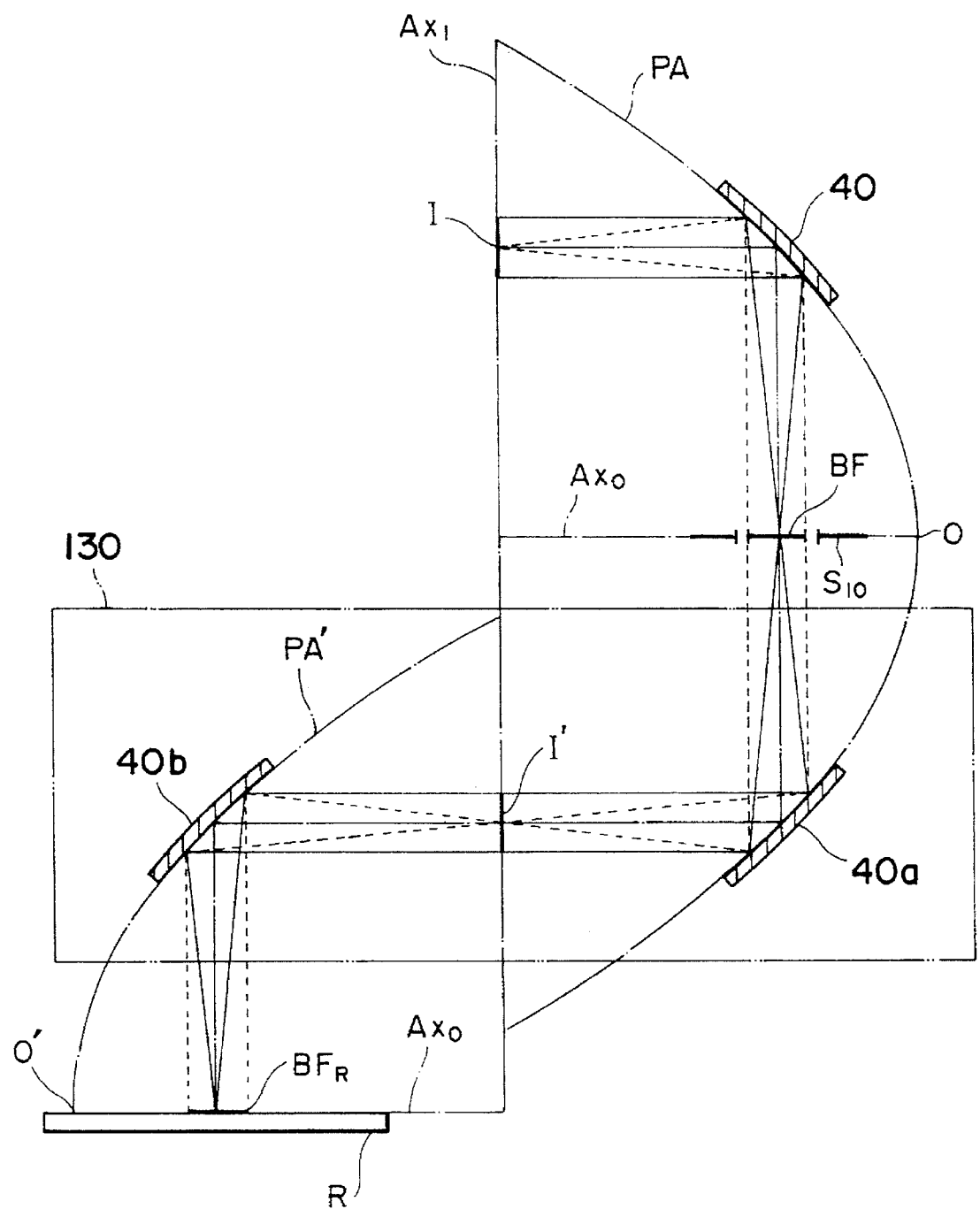
FIG. 18 is a drawing to show another example of the structure of re-imaging optical system.

FIG. 18 shows an example in which the re-imaging optical system 130 is constituted by a combination of two optical reflectors 40 as described referring to FIG. 6, FIG. 7, etc.

As shown in FIG. 18, a secondary light source I (light source images) comprised of an assembly of plural point sources is formed by a light source image forming optical system 20 on the reference axis $Ax_1$ of optical reflector 40. Rays from the secondary light source I are converted through the optical reflector 40 into parallel rays as shown by dotted lines to form an arcuate illumination area BF at the arcuate aperture portion OP in the slit plate $S_{10}$. After that, rays passing through the slit plate $S_{10}$ enter the re-imaging optical system 130 composed of two optical reflectors 40a, 40b, which are identical to the optical reflector 40.

The optical reflector 40a is located at the position where the optical reflector 40a is symmetric to the optical reflector 40 with respect to the line of symmetry axis $Ax_0$ of the parabola PA on the extension of the parabola PA in the meridional direction (on the plane of figure) of the optical reflector 40, as shown by the alternate long and short dash line. The optical reflector 40b is located at the position where the optical reflector 40b is in a relation of 180 rotation with the optical reflector 40a about the light source image I' re-imaged by the optical reflector 40 and the optical reflector 40a.

The light source image I and the light source image I' are conjugate with each other with respect to the optical reflector 40 and the optical reflector 40a, as shown by the dotted lines in FIG. 18, and the two light source images (I, I') both are circular. Also, the slit plate $S_{10}$ and the reticle R are conjugate with each other with respect to the re-imaging optical system 130, as shown by the solid lines in FIG. 18, and the illumination area BF formed on the aperture portion in the slit plate $S_{10}$ and the illumination area $BF_R$ on the reticle both have the shape of arc.

Consequently, the light source image I may be re-imaged on the entrance pupil of the projection optical system 50 by the re-imaging optical system 130 composed of the combination of two optical reflectors 40a, 40b identical to the optical reflector 40, whereby the telecentric Köhler illumination may be achieved with arcuate illumination area $BF_R$ being formed on the reticle R.

Figure 19:
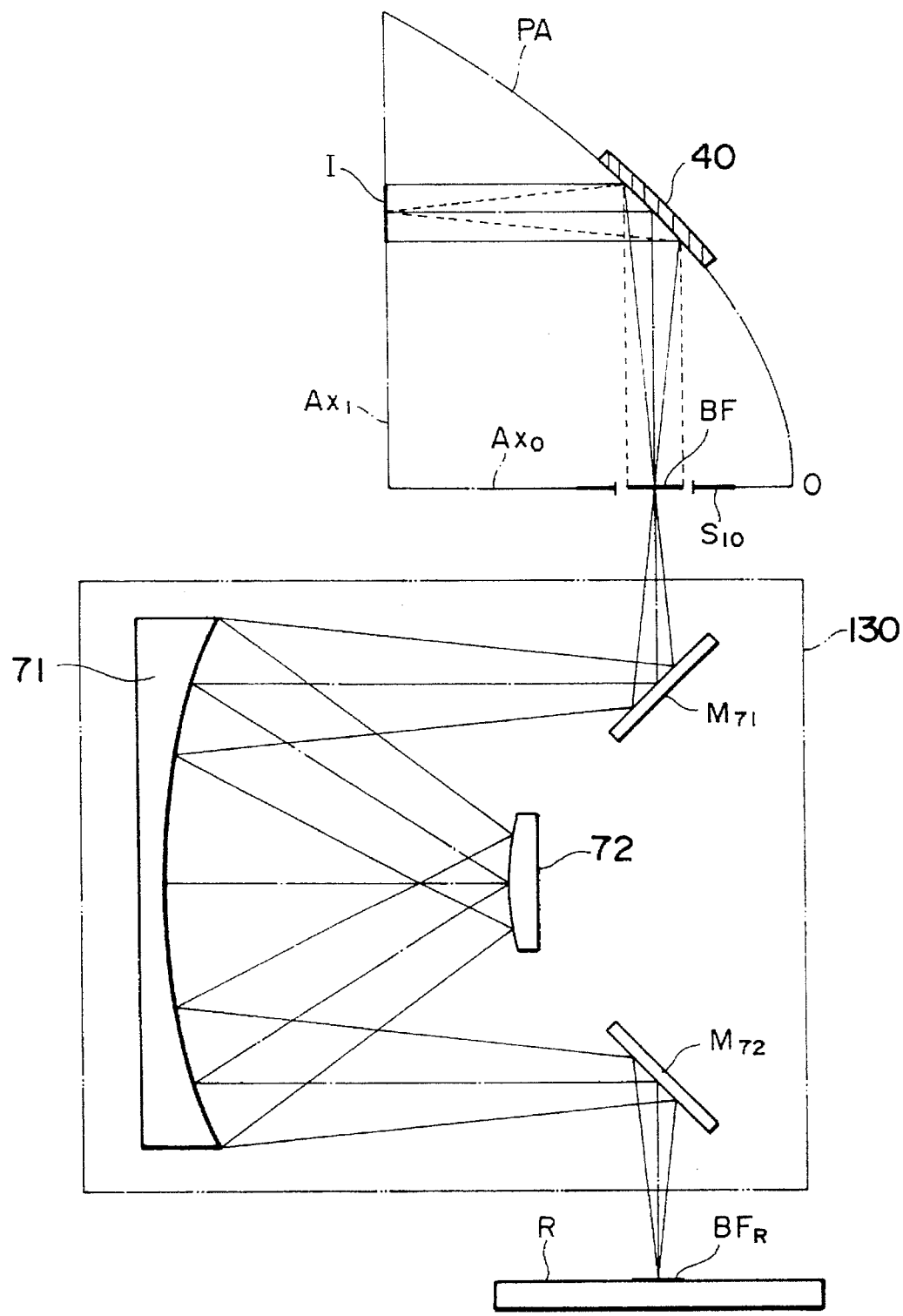
FIG. 19 is a drawing to show another example of the structure of re-imaging optical system.

Next described, referring to FIG. 19, is an example in which the re-imaging optical system 130 is constituted by a concave mirror and a convex mirror similarly as the projection optical system 50 shown in FIG. 16.

As shown in FIG. 19, the re-imaging optical system 130 has basic constituents of concave mirror 71 and convex mirror 72 and further includes reflection mirrors $M_{71}$, $M_{72}$ for bending an optical path between the slit plate $S_{10}$ and the concave mirror 71 and between the concave mirror 71 and the reticle R, respectively. Similarly as in the projection optical system 50 shown in FIG. 16, the center of curvature of the concave mirror 71 is approximately coincident with that of the convex mirror 72, and the radius of curvature of the convex mirror 72 is a half of that of the concave mirror 71.

The light source images I formed by the light source image forming optical system 20 (at the light source side focus position of the optical reflector 40) are substantially conjugate with the entrance pupil of the re-imaging optical system 130 (at or near the convex mirror 72). In addition, the shape of the plural light source images I and the shape of the entrance pupil of re-imaging optical system 130 all are circular.

Accordingly, the light source images I may be re-imaged on the entrance pupil of projection optical system 50 by the re-imaging optical system 130 composed of the concave mirror 71 and the convex mirror 72 similarly as in the projection optical system 50 shown in FIG. 16, whereby the telecentric Köhler illumination may be achieved with the arcuate illumination area $BF_R$ being formed on the reticle R.

Figure 20:
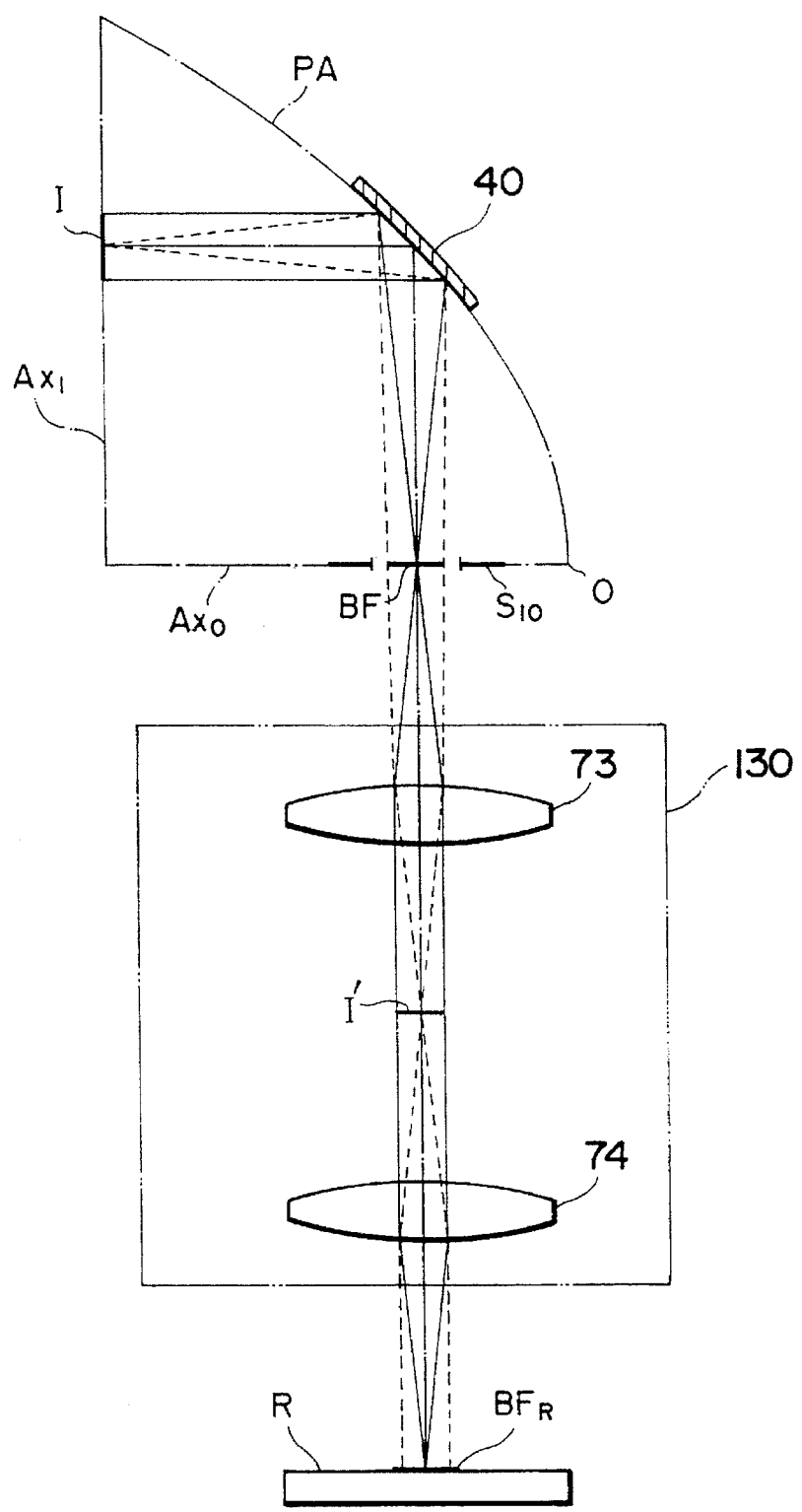
FIG. 20 is a drawing to show another example of the structure of re-imaging optical system.
Figure 21:
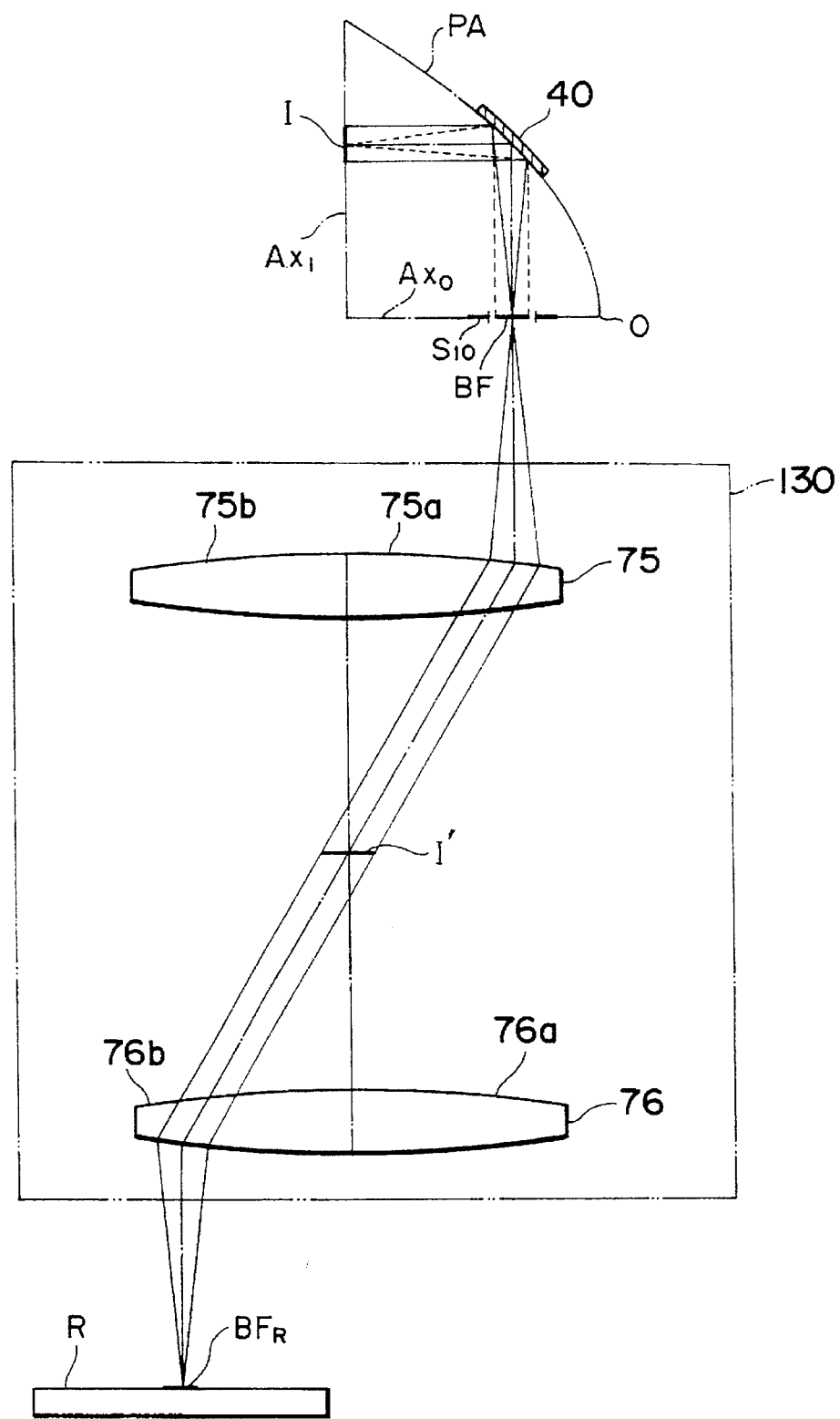
FIG. 21 is a drawing to show another example of the structure of re-imaging optical system.

FIG. 18 and FIG. 19 illustrated the examples with re-imaging optical system 130 of reflection type optical system, while FIG. 20 and FIG. 21 illustrate examples with re-imaging optical system of refraction type optical system.

FIG. 20 shows an example in which the re-imaging optical system 130 is constituted by two refracting lenses. As shown in FIG. 20, the re-imaging optical system 130 is composed of a first re-imaging lens 73 and a second re-imaging lens 74. A substantially circular light source image I' is formed through the optical reflector 40 and the first re-imaging lens 73 between the first re-imaging lens 73 and the second re-imaging lens 74.

Accordingly, the light source image I may be re-imaged on the entrance pupil of projection optical system 50 by the re-imaging optical system 130 composed of the two refracting lenses, whereby telecentric Köhler illumination may be achieved with the arcuate illumination region $BF_R$ being formed on the reticle R.

FIG. 20 showed the example in which the re-imaging optical system 130 is composed of the two refracting lenses for simplicity of description, but the first re-imaging lens 73 or the second re-imaging lens 74 may be of course constituted by a plurality of refracting lenses.

FIG. 21 shows an example in which the re-imaging optical system 130 is composed of two refracting lenses and the optical axis of the re-imaging optical system 130 is made coincident with the reference axis $Ax_1$ of the optical reflector 40.

As shown by the dotted lines in FIG. 21, rays from a light source image I formed by the light source image forming optical system 20 are converted through the optical reflector 40 into parallel rays to arc-illuminate an arcuate aperture portion in slit plate $S_{10}$. After that, rays passing through the arcuate aperture portion in slit plate $S_{10}$ enter away from the optical axis the re-imaging optical system 130 composed of a first re-imaging lens 75 and a second re-imaging lens 76, and pass through a right half lens portion 75a of the first re-imaging lens 75 with respect to the optical axis to form a light source image I' at the illuminated plane side focus position of the first re-imaging lens 75. Then, the rays from light source image I' pass through a left half lens portion 76b of the second re-imaging lens 76 with respect to the optical axis to form an arcuate illumination area $BF_R$ on the reticle R.

Since the re-imaging optical system 130 of this example uses only the off-axial rays, good aberration correction is necessary only for a very small area at height of incidence apart by a certain distance from the optical axis of the re-imaging optical system 130, which is advantageous in requiring no consideration on correction of spherical aberration. Therefore, the re-imaging optical system 130 having the structure as shown in FIG. 21 can achieve theoretically excellent aberration correction by the smaller number of constituent lenses.

Although FIG. 21 showed the example of re-imaging optical system 130 composed of the two refracting lenses, the re-imaging optical system 130 may be constituted by a single refracting lens cut into two halves, one of which is used for the first re-imaging lens 75a and the other of which for the second re-imaging lens 76b.

Also, another arrangement is such that a plane mirror is located at the illuminated surface side focus position of the first re-imaging lens 75 (at the position of light source image I'), that rays from the optical reflector 40 passing through a right half lens portion 75a of the re-imaging lens 75 are reflected by the plane mirror then to pass through a left half lens portion 75b of the re-imaging lens 75, and that the rays passing through the left lens portion 75b are guided onto the reticle R. This arrangement obviates the second re-imaging lens 76.

Embodiment I-5

Next described is another embodiment where the re-imaging optical system 130 is constructed as a refracting optical system.

Figure 31A:
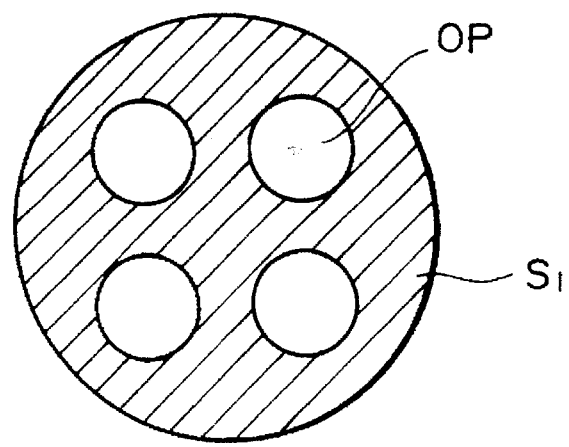
FIG. 31A is a plan view to show an aperture stop in which four symmetric transparent portions are provided.

First, let us suppose an aperture stop $S_1$ as shown in FIG. 31A is located at the position $A_1$ of the pupil of illumination optical system or at the position $A_2$ in FIG. 13A. In this case, a state of projection of the aperture stop $S_1$ in the illumination region (a relation of relative position) would rotate in accordance with a position in the arcuate shape of illumination region. This state will be schematically illustrated with FIGS. 32A and 32B.

The light emitted from the light source reaches the aperture stop $S_1$ positioned at the pupil position $A_1$ or $A_2$ and the light is outgoing with respective exit angles from apertures OP in the aperture stop $S_1$ (FIG. 13A). Thus, the light outgoing from the apertures OP radially travels toward the optical reflector 40. Observing this from the optical reflector 40 side, the shape of projection of the aperture stop $S_1$ is seen as confronting the reflector at a position of each radial angle. Namely, the aperture stop $S_1$ is observed in the same orientation at either angle.

Figure 32B:
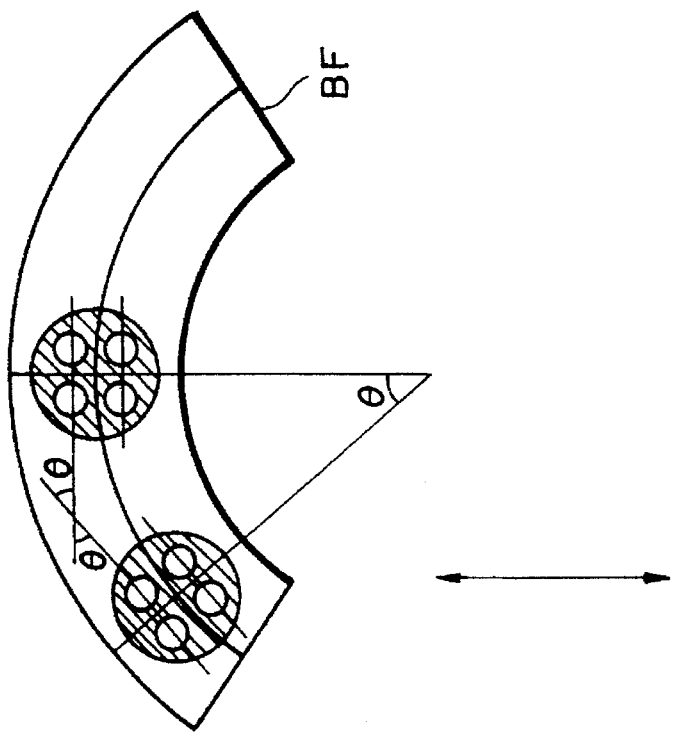
FIG. 32A and FIG. 32B are explanatory drawings to schematically show illumination states by light passing through the aperture stop in the conventional technology, using the shape of aperture stop.
Figure 32A:
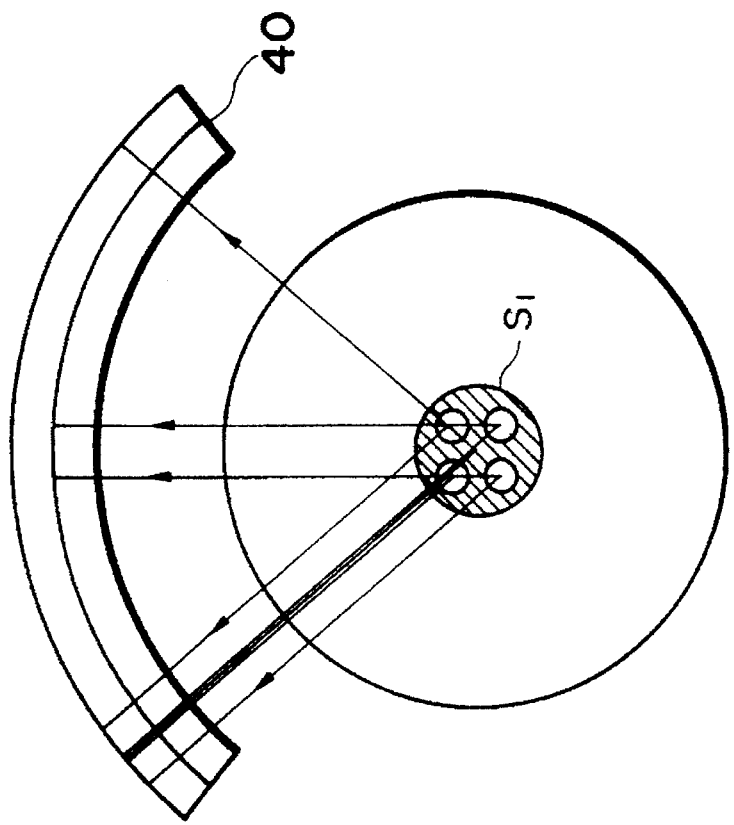

Because of this, while the beam reflected by the optical reflector 40 travels toward the arcuate illumination region BF, the effect to rotate the aperture stop $S_1$ occurs depending upon the position of reflection on the optical reflector 40 (i.e., depending upon the angular direction or depending upon the angular direction of exit from the light source image forming optical system 20 comprising the optical integrator 22). Namely, as shown in FIG. 32B, a beam traveling straight on the optical axis of the illumination optical system (with exit angle of ±0 degree) is projected as maintaining the state of setting position of the aperture stop $S_1$, but the illumination light from the aperture stop $S_1$ is projected as rotated depending upon the angular position in the arcuate illumination region (or depending upon the exit angle θ).

Since this is the same state as the aperture stop $S_1$ is rotated depending upon the position in the arcuate illumination region, a relation of a relative setting position with a projection pattern also changes (depending upon the position in the arcuate illumination region). Thus, the state of image formation changes in the illumination region, so that only the central portion of the illumination region (the portion corresponding to the exit angle of 0 degree and neighbors thereof) can have an improvement in imaging characteristics with desired performance even if the positions of the apertures OP in the aperture stop $S_1$ (the directions of illumination of oblique illumination light) are set to match with the arrangement direction of circuit pattern. Then, the imaging characteristics would be degraded gradually toward the peripheral portions of the arcuate region.

Figures 30A, 30B:
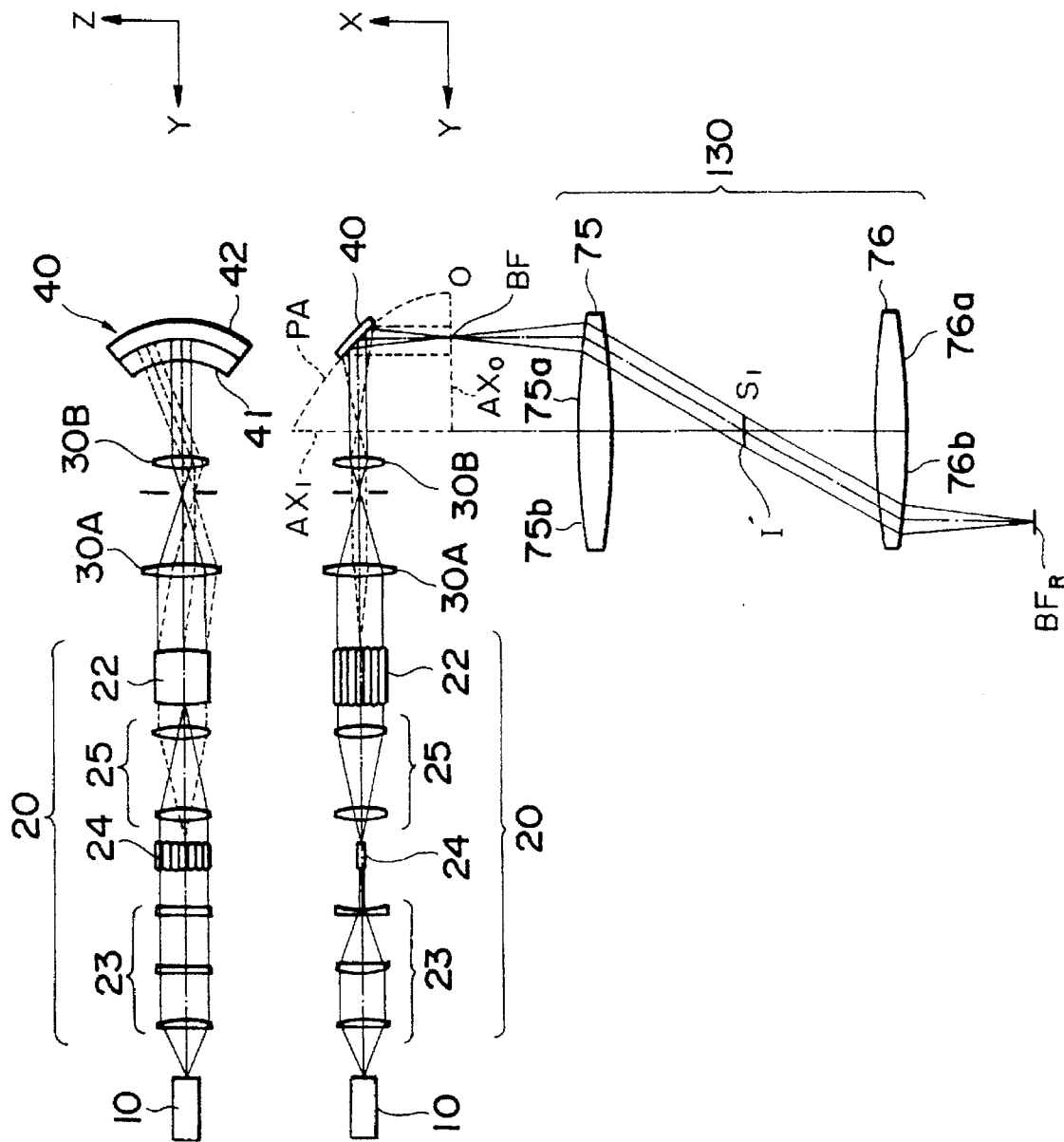
FIG. 30A is a plan view to show schematic structure of an illumination optical apparatus according to an embodiment.
FIG. 30B is a side view thereof.

Now, the structure of the present embodiment is shown in FIGS. 30A and 30B.

The illumination optical system itself is substantially the same as the illumination optical system in the previously described embodiments, except that the system is provided with a re-imaging optical system 130 as a relay optical system for relay of the arcuate illumination region BF and that an aperture stop $S_1$ is set at the position of the pupil of the re-imaging optical system 130 (at the position represented by I' in the drawing). Here, the same members will be denoted by the same reference numerals as those in the previously described embodiments.

In the illumination optical apparatus shown in FIGS. 30A and 30B, a beam from a light source 10 consisting of a laser light source is incident into a beam shaping lens system 23 composed of a collimator lens and other lenses, where it is converted into a beam with rectangular cross section. Then the rectangular beam enters a first optical integrator 24. Further, beams emergent from the first optical integrator then pass through a relay lens system 25 to enter a second optical integrator 22 to form images of the light source on the exit plane thereof. Beams emergent with respective exit angles therefrom are guided via a first optical system 30A, a second optical system 30B, and an optical reflector 40 to illuminate an arcuate illumination region BF under Köhler illumination.

This illumination region BF is guided through the re-imaging optical system 130 consisting of re-imaging lenses 75, 76 onto an illuminated object (R), where an illumination region $BF_R$ with the same shape (arcuate shape) is reconstructed. Generally, when such an illumination optical apparatus is applied to the projection exposure apparatus, a reticle (or a mask) R as an illuminated object is placed at the illumination region $BF_R$ to provide exposure light for projection of a mask pattern. The same constructions as in the previously described embodiments can be employed for these exposure apparatus and scanning apparatus for mask and wafer.

The re-imaging lenses 75, 76 are so set that the optical axis thereof is coincident with the reference axis $AX_1$ of the optical reflector 40. Because of this arrangement, this relay system has no axial spherical aberration (or uses no axial beam), thus necessitating no correction. Since the re-imaging lenses 75, 76 are used only in the half portions 75a, 76b, it is possible that a single lens is cut into halves and they are used in alternate arrangement.

The aperture stop $S_1$ provided with transparent portions as shown in FIG. 31A is set at the position I' of the pupil of the re-imaging optical system 130, so that the illumination light is subjected to selection by the aperture stop $S_1$ and then the selected illumination light reaches the illumination region $BF_R$ (as predetermined oblique illumination light). Namely, the aperture stop $S_1$ has the apertures OP defined based on the Fourier transform pattern of a fine pattern on mask, as disclosed in Japanese Laid-open Patent Application No. 4-101148, whereby it selectively transmits only diffracted light of predetermined order.

Figures 33A, 33B:
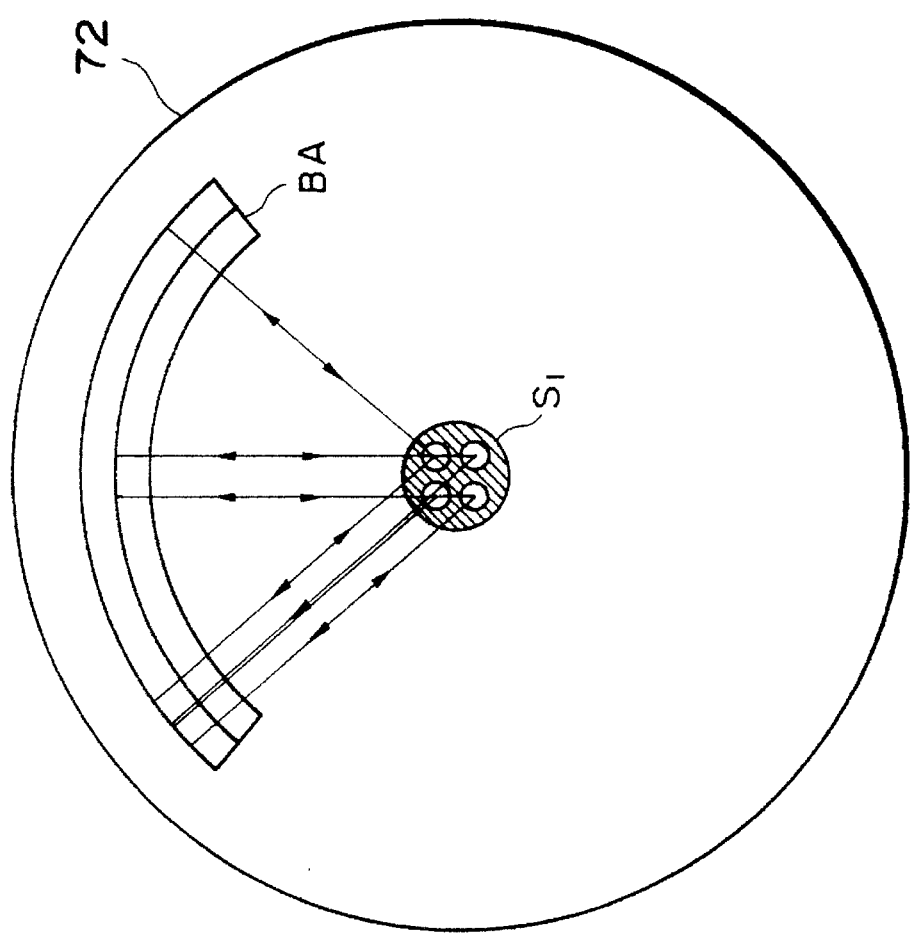

Then the state of projection of the aperture stop $S_1$ located at the position I' of the pupil of the re-imaging optical system 130 is kept always constant in the entire area of the arcuate illumination region BF, as shown in FIGS. 33A and 33B. In other words, the state of projection of the aperture stop $S_1$ becomes constant at any position in the illumination region BF in the scan directions (i.e., in the arrow directions). This means that the incident direction of oblique illumination light with the aperture stop $S_1$ is constant at all positions in the illumination region BF.

Figure 31B:
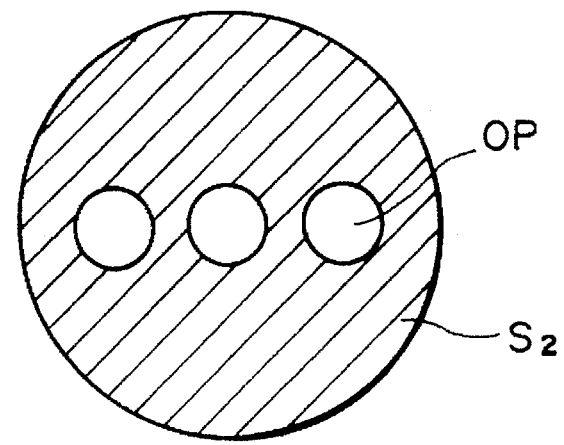
FIG. 31B is a plan view to show another aperture stop in which two symmetric transparent portions and a central transparent portion are provided.

The aperture stop to be set may be replaced by an aperture stop $S_2$ of the type shown in FIG. 31B. Either of the aperture stops $S_1$, $S_2$ has the apertures at offset positions from the central portion. Since the center of the aperture stop is arranged as to match with the optical axis of the re-imaging optical system, the central portion of the aperture stop is coincident with the optical axis. Then the aperture stop is set with specific directionality depending upon directions of lines or the density thereof in a projected pattern when applied to the projection exposure apparatus or the like.

FIG. 31A shows the aperture stop $S_1$ having four circular apertures OP offset from the center, which have the same size and are located at positions symmetric with each other around the central portion (with two apertures being in line symmetry with the other two apertures). Accordingly, with oblique illumination in the two orthogonal directions of the apertures, the resolution can be improved in the directions.

Since in the present embodiment the projection (state) of such a special aperture stop is always constant in the entire area in the illumination region BF, a projected image can be obtained with a deeper depth of focus from an illuminated object such as a reticle illuminated by the illumination light, than those by the conventional methods, and the state of the image formed is kept uniform independent of the position in the illumination region BF (in the projected image).

Figures 34A, 34B:
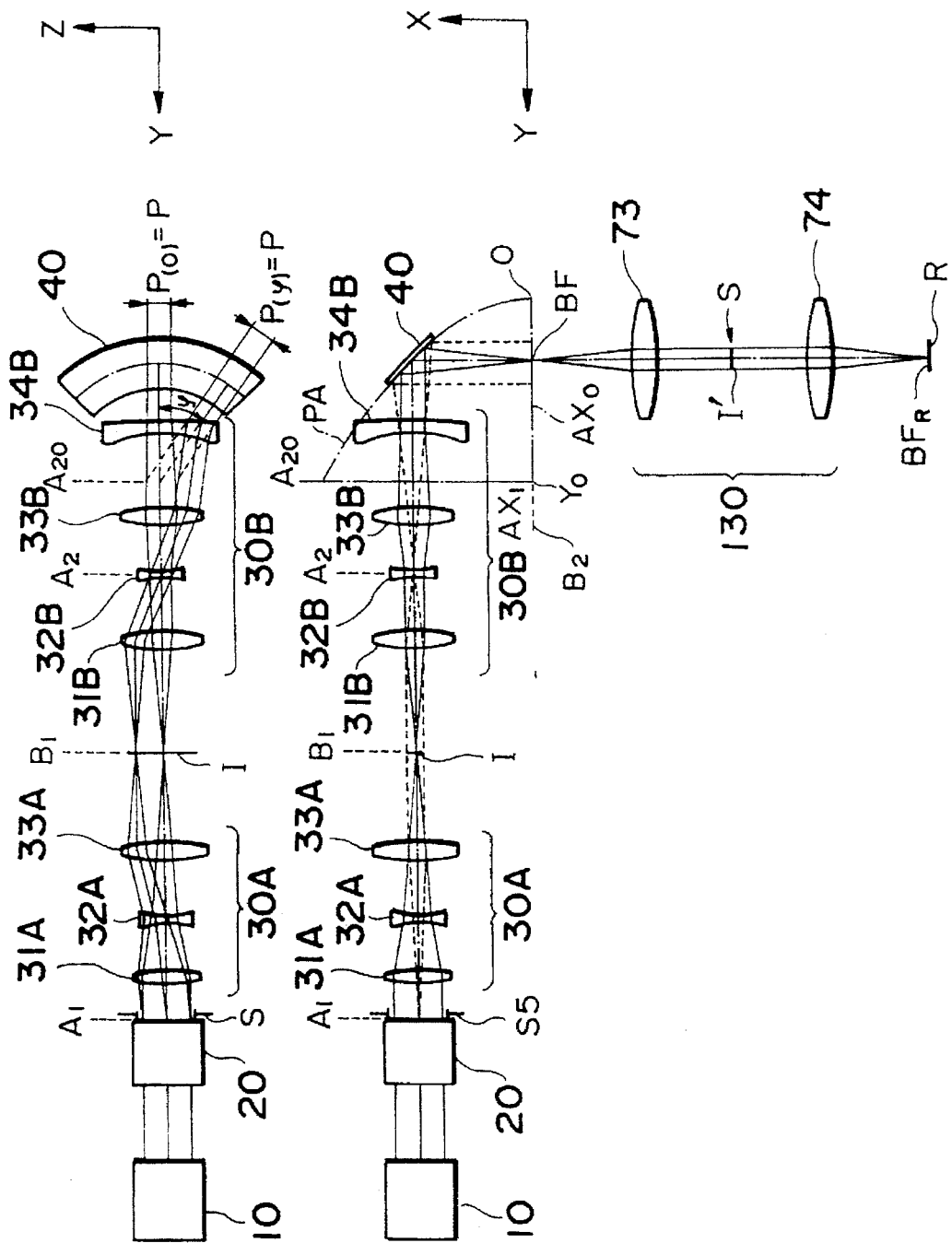
FIG. 34A is a plan view to show an example of another construction of the illumination optical apparatus.
FIG. 34B is a side view thereof.

Also, where the re-imaging optical system 130 is constructed as shown in FIGS. 34A and 34B, the aperture stop $S_1$ or $S_2$ can also be set at the position of the pupil of the optical system 130 (at the position shown by T in the drawing).

In the present embodiment, the optical path connecting the illumination regions BF and $BF_R$ is not offset with respect to the re-imaging lenses 73 and 74, using the central portions of the lenses. Thus, the relaying portion is different from that in the previously described embodiment, but the shape of projection of the aperture stop $S_1$, $S_2$ on the illuminated surface (reticle R) is also uniform independent of the position in the illumination region BF, similarly as in the previously described embodiment. The size of the optical system itself can be made compact by such use of the central portion of the re-imaging optical system.

As described above, the arrangement that the aperture stop $S_1$, $S_2$ is set near the position of the pupil in the re-imaging optical system can enjoy such an advantage that the effect is uniform in the entire area in the arcuate illumination region in applications of the so-called oblique illumination method which could affect the depth of focus or the contrast of projected image. Therefore, if this illumination optical apparatus is applied to the projection exposure apparatus, a projected image can be obtained with a deep depth of focus in the entire area of the projected region and a brightness difference of the image becomes larger, also providing an advantage that those are uniform over the entire area of the projected region. This permits projection exposure apparatus which can perform projection exposure with high resolution while maintaining a high throughput, to be constructed.

Here, the type of the illumination optical system itself as described above has no specific limitation as long as it can form the arcuate illumination region. For example, when the illumination system described in Japanese Laid-open Patent Application No. 60-232552 is provided with the re-imaging optical system and the aperture stop of the present embodiment, the depth of focus becomes deeper in applications to the projection exposure apparatus than those in the conventional methods. Thus, the total illumination (projection) characteristics can be improved. Also, the depth of focus becomes deeper in applications to the illumination optical system with a special reflective mirror having a reflective surface consisting of a rotational parabolic surface or a parabolic toric surface, as in the illumination optical system described in Japanese Laid-open Patent Application No. 6-97047 or as in the illumination optical system described in Japanese Patent Application No. 5-323718, whereby the illumination characteristics can be improved as compared with the conventional methods.

The aperture stop of the present embodiment utilizes the aperture stop as described in Japanese Laid-open Patent Application No. 4-101148 as explained previously, which has a plurality of apertures offset from the optical axis of the re-imaging optical system. This means that there is directionality of arrangement of the apertures at least between the offset positions of the apertures and the center portion, specifically in the arrangements as shown in FIGS. 31A and 31B.

As described previously, the four circular apertures OP are provided at positions symmetric with each other with respect to the center and offset from the center portion in FIG. 31A. This case is the same as the beams passing through the four apertures OP become illumination light beams having respective predetermined angles, and the four beams (mainly, each of the two pairs of beams) are related to the orientation.

Also, in FIG. 31B, the three circular apertures OP are located at the center and on both sides thereof in symmetry with each other. The aperture stop may be one as shown in Japanese Laid-open Patent Application No. 4-101148, in which two circular apertures are provided at positions symmetric with each other on both sides of the center. With these aperture stops, oblique illumination is effected especially by beams from the apertures located in symmetry at the offset positions, thus having the issue of directionality of incident directions.

It is general in either case that the aperture stop is used with the center on the optical axis. Since the apertures are formed at the offset positions, they have such directionality (to define the direction of the incident plane of the oblique illumination light) that the apertures are aligned in the direction of a line connecting the center portion with the positions of the apertures (the offset positions) (or in the direction perpendicular thereto).

Namely, Japanese Laid-open Patent Application No. 4-101148 utilizes the regularity of a fine pattern to be transferred and positively uses diffracted light emerging from the fine pattern, wherein a light-shielding plate has apertures determined based on the Fourier transform pattern of the fine pattern. In the present embodiment, such a structure for letting transmission beams pass in a limiting manner is considered as an aperture stop.

For applications of the illumination optical system using such special aperture stops to the projection exposure apparatus, a necessary condition is that one or more pairs of apertures are provided at angular positions depending upon the direction of the transfer pattern and at an interval depending on the fineness of the pattern and on the wavelength of exposure light. Since such a pair of apertures are provided in symmetry with each other with respect to the center of the optical axis (generally with respect to the center of the aperture stop), some apertures are located at offset positions.

With provision of such an aperture stop, diffracted light of the exposure light is selectively transmitted thereby and the incident angle of projected light onto the mask is limited. Thus, the depth of focus is improved and the contrast of the projection pattern is also improved, thus making the brightness difference clearer.

In these aperture stops, the apertures are arranged at least as to readily transmit the exposure light, which may be constructed of a transmissive member. On the other hand, the light-shielding portion (the hatched portion in FIG. 31A or other drawings) may be formed of any material with characteristics hardly to transmit the exposure light, for example, of one selected from materials perfectly shielding the light or materials partly interfering transmission of the exposure light.

Further, as described in Japanese Laid-open Patent Application No. 4-101148, these aperture stops can be so arranged that they are selectively exchanged with necessity depending upon a pattern on a used mask and that the relation of setting position is determined depending thereon. For example, employing a filter using a liquid crystal display device or an EC (electrochromic) device or the like, the exchange mechanism can be made compact and, in addition, the size, the positions, and the shape of apertures can be readily adjusted in a short time.

It is preferred that the aperture stop be located at the position of the pupil of the relay optical system. Namely, the position of the pupil of the re-imaging optical system in the present embodiment is the position where the beams from the arcuate illumination region by the illumination system are converged. Thus, setting the aperture stop there, the projection state becomes constant in positional relation (or is directed in a same direction), independent of the position in the illumination region.

It should be noted that the position of the pupil herein does not always mean only the strict position where the pupil is present, but may include positions near the position of the pupil (or positions around the pupil), as long as the aperture stop is effective there, and positions conjugate with such positions (which is the case throughout the specification). In either case, there is no specific restriction on the position as long as the aperture stop can reveal the effect of selection of diffracted light.

Embodiment I-6

Figure 22:
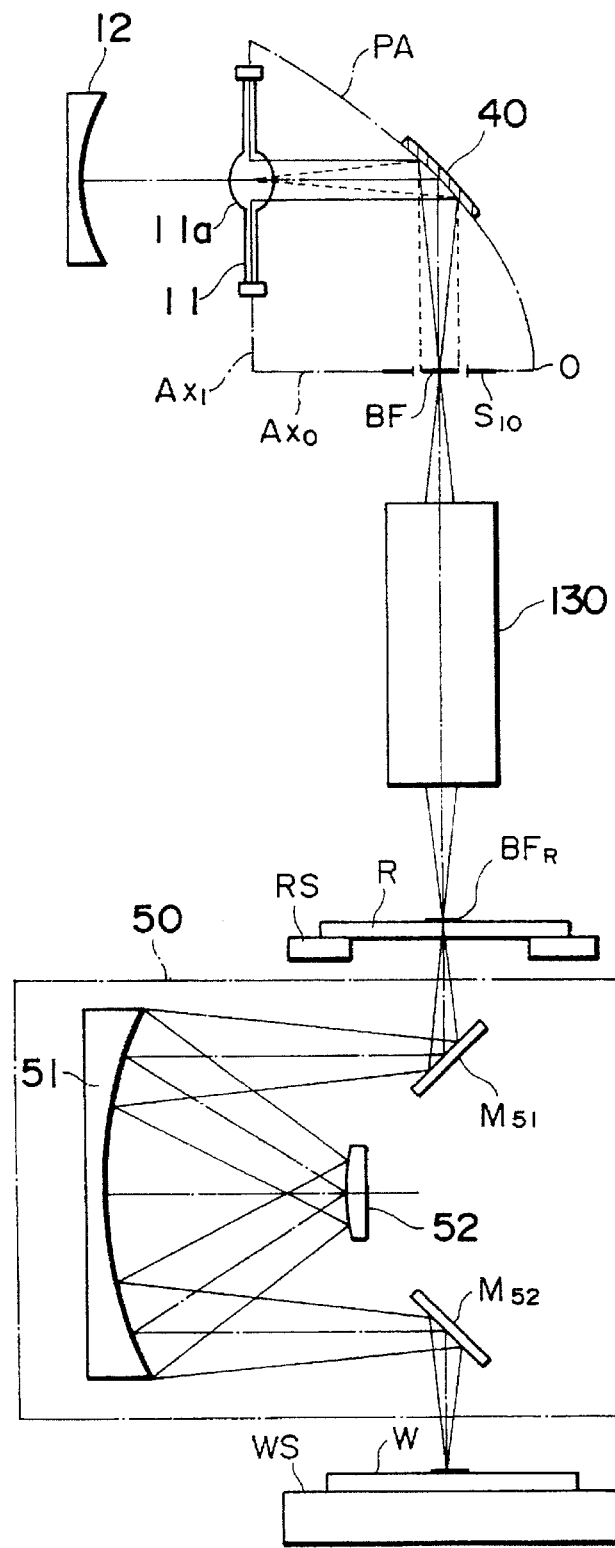
FIG. 22 is a schematic constitutional drawing to show another embodiment of illumination optical apparatus.

FIG. 22 shows another embodiment of the illumination optical apparatus.

The apparatus in the present embodiment is different from the apparatus in the preceding embodiments in that a light source is located directly at the light source side focus position of optical reflector 40 (with focal length f on the light source side as $f=(2\alpha)^{-1}$). The same reference numerals denote the same constituent elements as those in the other embodiments.

As shown in FIG. 22, a mercury arc lamp 11 as light source is located on the reference axis $Ax_1$ of optical reflector 40 so that a light emission area 11a of the mercury arc lamp 11 is coincident with the light source side focus position of the optical reflector 40. Disposed on the left side of mercury arc lamp 11 is a concave mirror 12 having a curvature with the center of curvature at the center of light emission area 11a of mercury arc lamp 11. Rays emitted from the mercury arc lamp 11 to the left (toward the concave mirror 12) are reflected toward and converged at the center of the light emission area 11a by the concave mirror 12 then to advance toward the optical reflector 40. Rays emitted from the mercury arc lamp 11 to the right advance toward the optical reflector 40. In the present embodiment light source means is constituted by the mercury arc lamp 11 and the concave mirror 12.

The rays emitted from the mercury arc lamp 11 are converted through the optical reflector 40 into parallel rays having an arcuate cross section to arc-illuminate an arcuate aperture portion in slit plate $S_{10}$. Rays passing through the slit plate $S_{10}$ are converged by the re-imaging optical system 130 onto the reticle R to form an arcuate illumination area $BF_R$ thereon in which the telecentricity is maintained.

The light emission area 11a of the mercury arc lamp 11 (at the light source side focus position of optical reflector 40) is substantially conjugate with the entrance pupil of projection optical system 50 (at or near the convex mirror 52). In addition, a light source image of the light emission area 11a is formed at the entrance pupil position of projection optical system 50 as being similar to the shape of the pupil (circular).

Accordingly, an arcuate illumination area is formed on the reticle R, in which the telecentricity is maintained under Köhler illumination. Thus, since the reticle R is evenly illuminated in the shape of arc at high illumination efficiency, by moving the reticle stage RS and the wafer stage WS in the directions shown by arrows, the scan exposure can be achieved at remarkably higher illumination efficiency and higher throughput than by conventional apparatus.

The re-imaging optical system 130 shown in FIG. 22 may be replaced by one shown in any one of FIG. 17 to FIG. 21.

Also, in the illumination optical system shown in FIG. 16 and in FIG. 22, the arcuate illumination area BF formed by the optical reflector 40 is shaped by the re-imaging optical system 130 to form the arcuate illumination area $BF_R$ on the reticle R, but without using the re-imaging optical system 130 the object to be illuminated may be directly arc-illuminated by positioning the illuminated object such as the reticle R on the arcuate illumination area BF formed by the optical reflector 40.

Further, as long as a light source image or light source is located on the reference axis of optical reflector as shown in FIG. 9, the illuminated surface can be evenly illuminated in the shape of arc theoretically at remarkably higher illumination efficiency than in conventional apparatus while maintaining the Köhler illumination state, of course. In this case, since the arc-illuminated surface is slightly inclined, the optical system after the illuminated surface should be preferably inclined at the inclination of the surface.

In the embodiments, as described the shape of optical reflector itself was described as a belt-like arc shape, but the shape is not limited to that. The requirement is that the reflective plane itself has the curved surface comprising a part of the parabolic toric surface shown in the figures. The reflective plane may be also formed in the shape of belt-like annulus forming a part of the parabolic toric surface. In that case, the illuminated surface can be evenly illuminated in the shape of ring.

An example of optical reflector is an aluminum block ground on the internal plane to have the shape as described in the embodiments and to utilize the so-called internal reflection. Another example is a transparent solid body having the reflection area on the outer surface utilizing the so-called external reflection. There are no restrictions on the structure of optical reflector as long as the reflective plane is formed in the shape of curved surface forming a part of the parabolic toric surface.

Embodiment II-1

Figure 35:
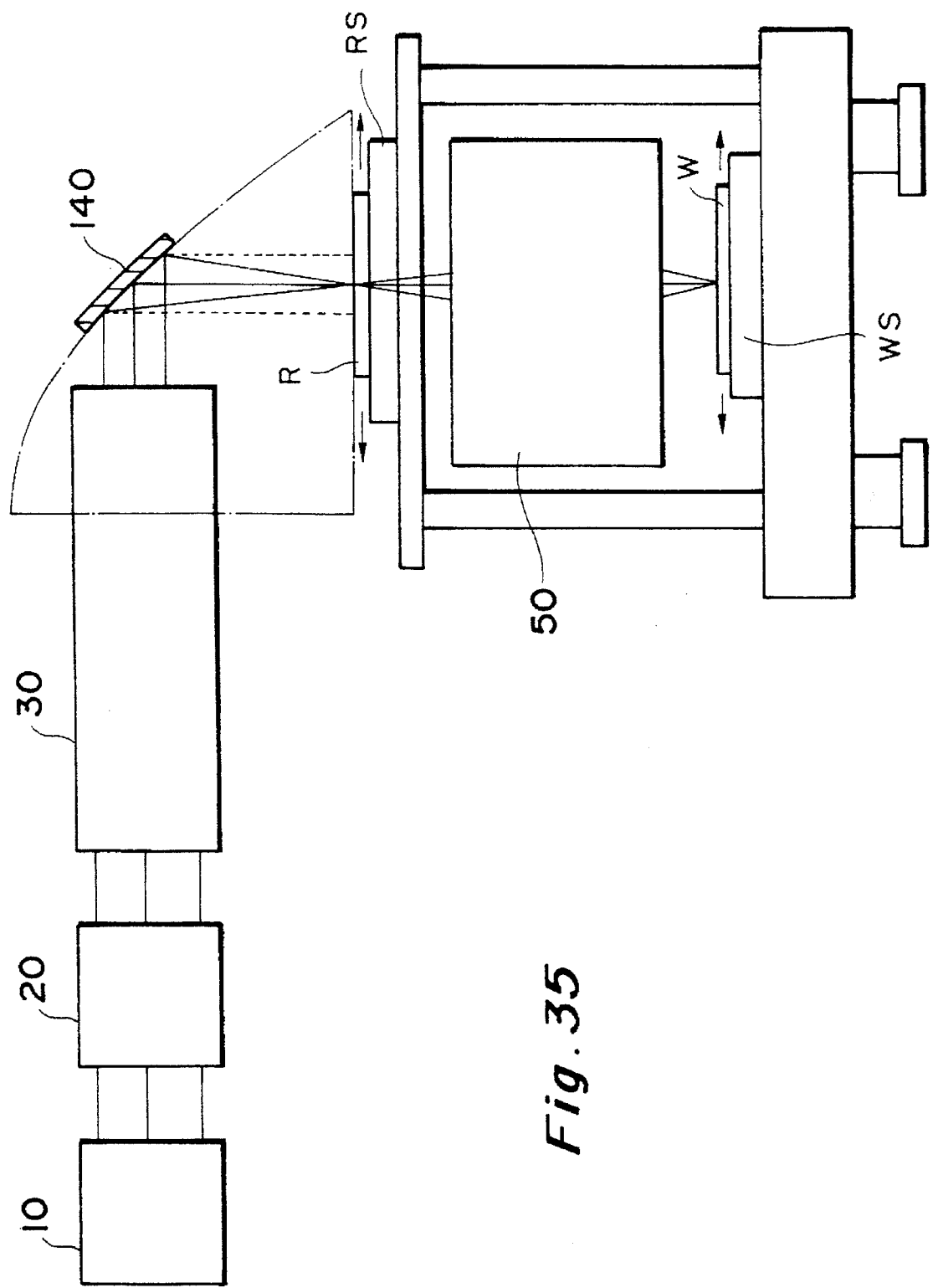
FIG. 35 is a block diagram to show the schematic structure of an exposure apparatus provided with the illumination optical apparatus.

FIG. 35 schematically shows the structure of the illumination optical apparatus in the present embodiment. The illumination optical apparatus is composed of a light source 10 for example of an excimer laser, a light source image forming optical system 20 comprising an optical integrator formed of an assembly of plural lenses, a re-imaging optical system 130 for re-imaging a plurality of light source images formed by the optical integrator, and an optical reflector 140.

Further, the illumination optical apparatus has a reticle stage RS in the vicinity of an illuminated surface by the illumination optical apparatus. The reticle stage RS holds a reticle on which a circuit pattern of IC is formed, as it can move the reticle. The illumination optical apparatus is also provided below the reticle stage RS with a wafer stage WS movably holding a wafer W and with a projection optical system 50 for projecting an image of circuit pattern on the reticle R onto the wafer W. A drive control unit as will be described hereinafter sequentially moves the reticle stage RS and the wafer stage WS in predetermined directions. The entire apparatus as described constitutes an optical exposure apparatus which carries out repetitive exposure of the circuit pattern image on the reticle R onto the wafer R chip by chip from the edge thereof.

The structure of the apparatus will be described in detail one by one.

First, FIG. 36A and FIG. 36B are enlarged views to show the arrangement of the light source 10, the light source image forming optical system 20 and the re-imaging optical system 130. FIG. 36A is a top plan view of the arrangement, and FIG. 36B is a side view in cross section of the systems.

The optical integrator constituting the light source image forming optical system 20 is, for example, an assembly of plural lens elements, which focuses parallel rays emitted from the light source 10 and entering the respective lens elements on the exit side. Formed at a position $A_1$ on the exit side are a plurality of light source images I which are an assembly of point sources corresponding to the lens elements, whereby a secondary light source is formed thereon substantially as a surface illuminant. An aperture stop S with circular aperture portion is provided at or near the position $A_1$ where the secondary light source is formed, and it shapes the secondary light source formed by the optical integrator to be circular.

A beam is released from each light source image in the circular secondary light source shaped by the aperture stop S, so that, as seen as the entire secondary light source, parallel beams are outgoing therefrom at each exit angle and incident into the re-imaging optical system 30, as shown in FIG. 36A.

The re-imaging optical system 30 has a function to re-image the plurality of light source images formed by the optical integrator, and is so arranged that the entrance pupil of the re-imaging optical system 30 is coincident with the position $A_1$ of light source images formed by the optical integrator.

The re-imaging optical system 30 is composed of a first optical system 30A with positive refracting power and a second optical system 30B with positive refracting power. The first optical system 30A is constituted by an f·sinθ lens composed of three lenses of a double-convex positive lens 31A, a double-concave negative lens 32A and a double-convex positive lens 33A. The second optical system 30B is constituted by an fθ lens composed of four lenses of a double-convex positive lens 31B, a double-concave negative lens 32B, a double-convex positive lens 33B and a meniscus negative lens 34B with a concave plane facing the light source.

Now described is the principle of the re-imaging optical system 30 so arranged.

Figure 37A:
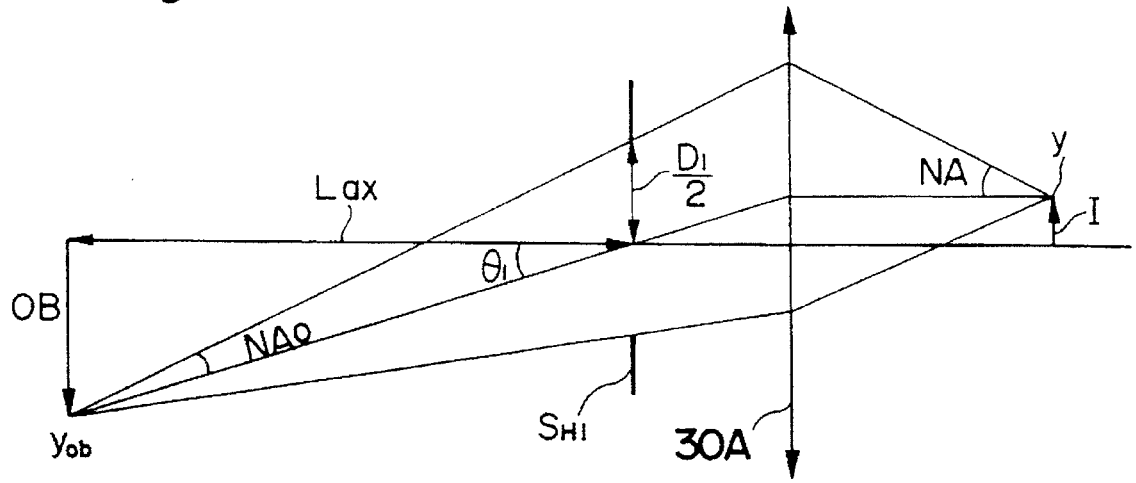
FIG. 37A and FIG. 37B are explanatory drawings to illustrate the principle of the re-imaging optical system.
Figure 37B:
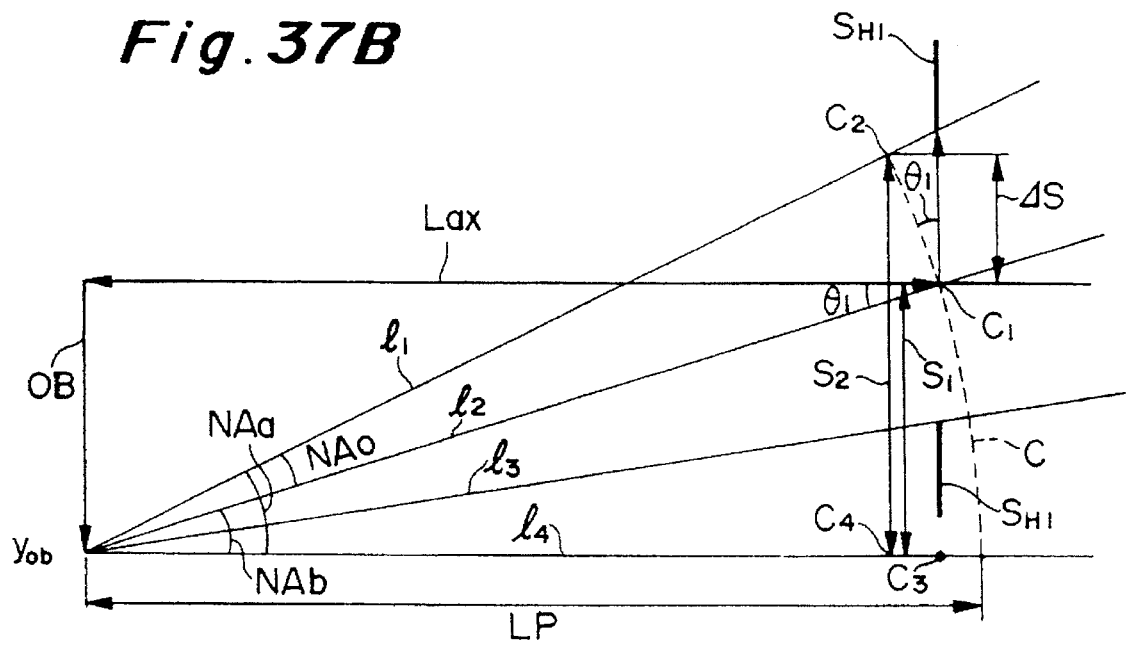

First, let us assume, as shown in FIGS. 37A and FIG. 37B that an imaginary stop $S_{H1}$ is provided as an entrance pupil on the light source side of the first optical system 30A, that an object OB with height $y_{ob}$ is placed at a position apart by a distance $L_{ax}$ from the stop $S_{H1}$ along the optical axis, and that oblique rays from the object OB pass through the stop $S_{H1}$ and the first optical system 30A to form an image I with height y. FIG. 37A is a schematic representation of the first optical system 30A on the light source side, and FIG. 37B is an enlarged drawing to show a ray diagram near the stop $S_{H1}$, where the stop $S_{H1}$ is placed on the light source side of the first optical system 30A.

Before a suitable arrangement is obtained for the re-imaging optical system 30, a numerical aperture (NA) of oblique rays is first obtained on the exit side of the first optical system 30A, referring to FIG. 37A and FIG. 37B.

Let $NA_a$ be a numerical aperture on the entrance side of the first optical system 30A formed by a ray $l_1$ coming from an object point at height $y_{ob}$ of object OB and passing the upper edge of stop $S_{H1}$ and a ray $l_4$ coming from the object point at height $y_{ob}$ of object OB and being parallel to the optical axis, $NA_0$ be a numerical aperture on the entrance side of the first optical system 30A formed by a ray $l_1$ coming from the object point at height $y_{ob}$ of object OB and passing the upper edge of the stop $S_{H1}$ and a ray (principal ray) $l_2$ coming from the object point at height $y_{ob}$ of object OB and passing the center of stop $S_{H1}$, and $NA_b$ be a numerical aperture on the entrance side of the first optical system 30A formed by a ray (principal ray) $l_2$ coming from the object point at height $y_{ob}$ of object OB and passing the center of the stop $S_{H1}$ and a ray $l_4$ coming from the object point at height $y_{ob}$ of object OB and being parallel to the optical axis. Then the following relation stands from FIG. 37B.

$$NA_0 = NA_a - NA_b \quad (101)$$

Also, let $\theta_1$ be an entrance angle of the principal ray $l_2$ into the first optical system 30A, $L_p$ be a length of the principal ray $l_2$ from the object point at height $y_{ob}$ of object OB to the center of stop $S_{H1}$, $c_1$ be a position where a circle C with radius $L_p$ about the object point at height $y_{ob}$ of object OB intersects with the stop $S_{H1}$ at the center thereof, $c_2$ be a position where the circle C intersects with the ray $l_1$ passing the upper edge of stop $S_{H1}$, $c_3$ and $c_4$ be intersections between the ray $l_4$ and normal lines from the positions $c_1, c_2$ to the ray $l_4$, respectively, $s_1$ be a distance between the position $c_1$ and the position $c_3$ along the direction normal to the optical axis, and $s_2$ be a distance between the position $c_2$ and the position $c_4$ along the direction normal to the optical axis. Then above Equation (101) may be expressed by the following Equation (102) from FIG. 37B.

$$NA_0 = \frac{s_2}{L_P} - \frac{s_1}{L_P} = \frac{(s_2 - s_1)\cos\theta_1}{L_{ax}} \quad (102)$$

Here, let $\Delta s$ be a difference between $s_2$ and $s_1$, and $D_1$ be a diameter of aperture in stop $S_{H1}$. Then the following relation holds from FIG. 37B.

$$\Delta s = \left[\frac{D_1}{2} \cos\theta_1\right] \cos\theta_1 = \frac{D_1 \cos^2\theta_1}{2} \quad (103)$$

Consequently, the following relation is derived from Equations (102) and (103).

$$NA_0 = \frac{D_1\cos^3\theta_1}{2L_{ax}} \quad (104)$$

Meanwhile, the following relation of Equation (105) stands between the numerical aperture $NA_0$ on the entrance side of the first optical system 30A and the numerical aperture NA on the exit side of the first optical system A, as shown in FIG. 37A, when an infinitesimal change of height $y_{ob}$ of object OB is $dy_{ob}$ and an infinitesimal change of image height y of image I is dy.

$$\frac{NA}{NA_0} = \frac{dy_{ob}}{dy} \quad (105)$$

Since the relation of $y_{ob} = L_{ax} \cdot \tan\theta_1$ holds from FIG. 37A, the derivative thereof is as follows.

$$\frac{dy_{ob}}{d\theta_1} = \frac{L_{ax}}{\cos^2\theta_1} \quad (106)$$

Suppose there is the following relation between the entrance angle $\theta_1$ of an incident ray into the first optical system 30A and the image height y with focal length $f_1$ of the first optical system 30A.

$$y = f_1 g_1(\theta_1) \quad (107)$$

The derivative of Equation (107) is as follows.

$$\frac{dy}{d\theta_1} = f_1 g_1'(\theta_1) \quad (108)$$

In the equations, $g_1(\theta_1)$ is a function of $\theta_1$ and $g_1'(\theta_1)$ is a derivative of $g_1(\theta_1)$.

Consequently, from Equations (104), (105), (106) and (108), the following relation is derived.

$$NA = \frac{D_1\cos^3\theta_1}{2L_{ax}} \times \frac{L_{ax}}{\cos^2\theta_1} \times \frac{1}{f_1 g_1'(\theta_1)} \quad (109)$$

$$= \frac{D_1\cos\theta_1}{2f_1 g_1'(\theta_1)}$$

It is understood from Equation (109) that the relation of Equation (109) always stands even with object OB at infinity to the first optical system 30A, since the numerical aperture NA on the exit side of the first optical system 30A is irrespective of the distance $L_{ax}$ between the stop $S_{H1}$ and the object OB.

Figure 38A:
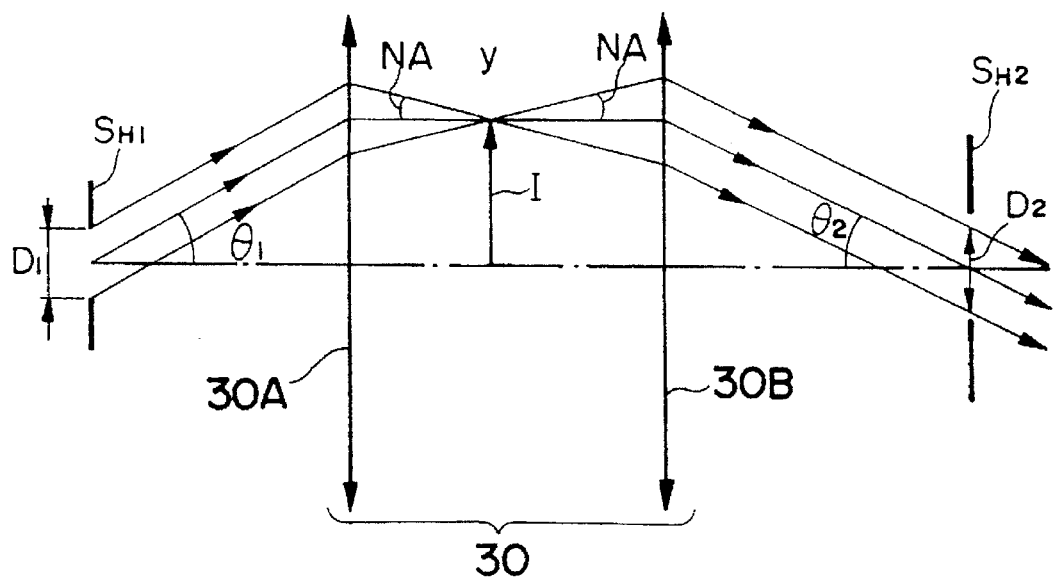
FIG. 38A and FIG. 38B are explanatory drawings to illustrate the principle of the re-imaging optical system.
Figure 38B:
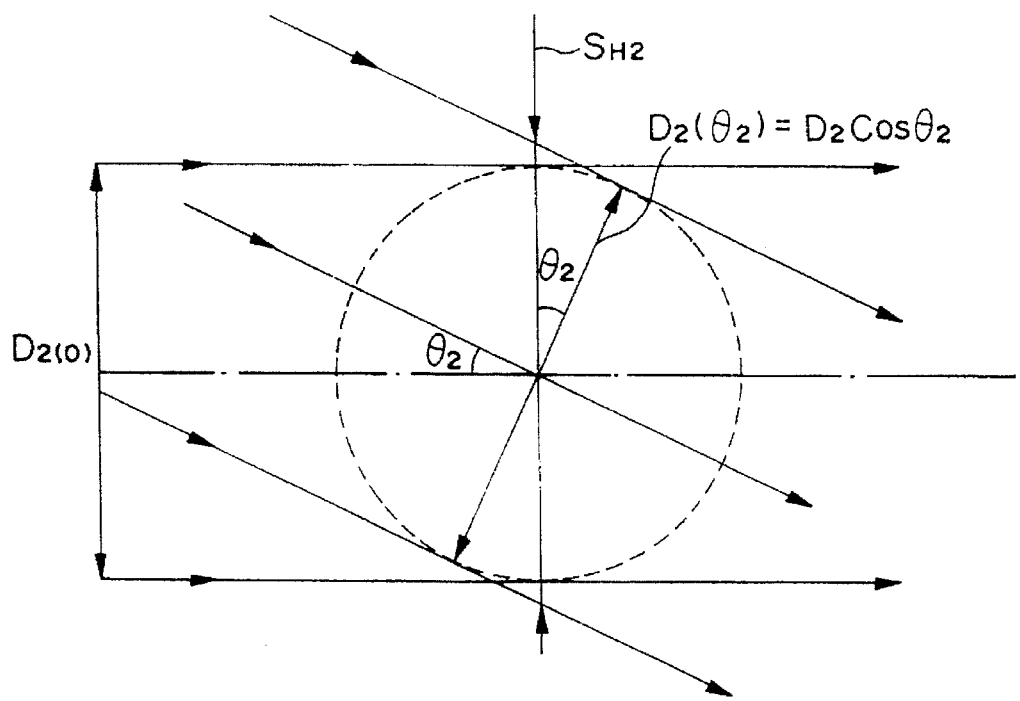

A suitable arrangement of the re-imaging optical system 30 is next obtained referring to FIG. 38A and FIG. 38B. FIG. 38A is a schematic representation of the entire re-imaging optical system 30 and FIG. 38B is an enlarged drawing to show a ray diagram near the exit pupil of the re-imaging optical system 30.

Suppose an imaginary stop $S_{H2}$ is provided as an exit pupil on the exit side of the second optical system 30B. As shown in FIG. 38A, let y be a height of image I formed through the first optical system 30A by rays coming at entrance angle $\theta_1$ through the imaginary stop $S_{H1}$, $\theta_2$ be an exit angle of rays outgoing from the second optical system 30B after the rays from the height y of image I are converged by the second optical system 30B, $f_1$ be a focal length of the first optical system 30A, and $f_2$ be a focal length of the second optical system 30B. Then the following relation holds.

$$y = f_1 g_1(\theta_1) = f_2 g_2(\theta_2) \quad (110)$$

In the equation, $g_1(\theta_1)$ is a function of $\theta_1$ and $g_2(\theta_2)$ is a function of $\theta_2$.

Letting $D_2$ be a diameter of outgoing rays at the exit pupil position out of the second optical system 30B and $y' = f_2 g_2'(\theta_2)$ be a derivative of $y = f_2 g_2(\theta_2)$, the numerical aperture NA is given by the following Equation (111), since the relation of the above Equation (109) also holds for the second optical system 30B. In the equation, $g'(\theta_2)$ is a derivative of $g(\theta_2)$.

$$NA = \frac{D_2 \cos\theta_2}{2f_2 g_2'(\theta_2)} \quad (111)$$

Consequently, the following relation is derived from Equations (109) and (111).

$$D_2 = \frac{D_1 f_2 \cos\theta_1 g_2'(\theta_2)}{f_1 \cos\theta_2 g_1'(\theta_1)} \quad (112)$$

The following relation should be preferably satisfied in order that, letting $D_2(\theta_2)$ be a diameter of outgoing rays at exit angle $\theta_2$, an outgoing beam diameter $D_2(0)$ at exit angle of 0 degrees ($\theta_2 = 0°$) is equal to that at exit angle $\theta_2$, as shown in FIG. 38B.

$$D_2(0) = D_2(\theta_2) = D_2 \cos\theta_2 \quad (113)$$

Then the following relation is derived from Equations (112) and (113).

$$\frac{D_2(0)}{\cos\theta_2} = \frac{D_1 f_2 \cos\theta_1 g_2'(\theta_2)}{f_1 \cos\theta_2 g_1'(\theta_1)} \quad (114)$$

Finally, the following Equation (115) is obtained.

$$\frac{D_1 f_2 g_2'(\theta_2)\cos\theta_1}{D_2(0) f_1} = g_1'(\theta_1) \quad (115)$$

Since a magnification m of the re-imaging optical system 30 is as follows.

$$m = \frac{D_1}{D_2(0)} = \frac{f_1}{f_2} \quad (116)$$

Equation (114) is finally changed into Equation (117).

$$\frac{g_2'(\theta_2)\cos\theta_1}{g_1'(\theta_1)} = 1 \quad (117)$$

Accordingly, if the re-imaging optical system 30 is constructed to satisfy above Equation (117), the diameter of outgoing beam from the re-imaging optical system 30 becomes constant irrespective of the exit angle $\theta_2$.

An example of solution to Equation (117) is as follows.

$$\begin{cases} g_1(\theta_1) = k_1 \sin\theta_1 + k_2 \\ g_2(\theta_2) = k_1 \theta_2 + k_3 \end{cases} \quad (118)$$

In the equations $k_1 \sim k_3$ are constants.

Thus, it is seen that the first optical system 30A may be constituted by a lens satisfying the relation of $y = f_1 k_1 \sin\theta_1 + k_2$ and that the second optical system 30B may be constituted by a lens satisfying the relation of $y = f_2 k_1 \theta_2 + k_3$.

For example, if $k_1 = 1$ and $k_2 = k_3 = 0$, then the first optical system 30A may be constituted by an f·sin$\theta$ lens satisfying the relation of $y = f_1 \sin\theta_1$ and the second optical system 30B by an f$\theta$ lens satisfying the relation of $y = f_2 \theta_2$.

Also, if $k_2 = k_3 = 0$, then the first optical system 30A may be constituted by an $fk_1\sin\theta$ lens satisfying the relation of $y = f_1 k_1 \sin\theta_1$ and the second optical system 30B by an $fk_1\theta$ lens satisfying the relation of $y = f_2 k_1 \theta_2$.

As described above, the re-imaging optical system 30 can convert beams outgoing at respective exit angles from a light source or light source image and incident thereinto into beams having a substantially constant beam diameter in all directions of incidence and entering the optical reflector 140.

Now returning to FIGS. 36A and 36B, the re-imaging optical system 30 is further described.

The first optical system 30A is constructed to satisfy the relation of $y=f_1\sin\theta_1$ where $f_1$ is a focal length of the first optical system 30A, $\theta_1$ an angle of incidence of incident beam from secondary light source, and y an image height of image formed by the first optical system 30A, while the second optical system 30B is constructed to satisfy the relation of $y=f_2\theta_2$ where $f_2$ is a focal length of the second optical system 30B and $\theta_2$ is an exit angle of outgoing beam from the second optical system 30B, which is a beam from the image height y of image formed by the first optical system 30A.

As the re-imaging optical system 30 is so arranged, the first optical system 30A converges parallel rays outgoing at each exit angle from the secondary light source at the position $A_1$ to form an aerial image I at the position $B_1$. The second optical system 30B converges rays from the aerial image I to convert them into parallel rays directed to the optical reflector 140. In other words, the first optical system 30A converges rays from the respective point sources forming the secondary light source at the position $A_1$ so that the rays are converted into parallel rays superposedly illuminating the aerial image I at the position $B_1$, for example as shown by the dotted lines in FIG. 36B. After that, the parallel rays enter the second optical system 30B and are once focused at the position $A_2$ inside the negative lens 32B in the second optical system 30B. Then the rays go to the optical reflector 140 as a condensing optical system.

A real image of secondary light source is formed at the position $A_2$ inside the negative lens 32 in the second optical system 32B, and a virtual image of secondary light source is formed at the exit pupil position $A_{20}$ of re-imaging optical system 30 such that it is always circular when the exit side of re-imaging optical system 30 is seen at an arbitrary angle.

Thus, a beam diameter P(0) of parallel rays outgoing at exit angle of 0 degree ($\psi=0°$) from the re-imaging optical system 30 is equal to a beam diameter P($\psi$) of parallel rays outgoing at exit angle $\psi$ from the re-imaging optical system 30. Therefore, parallel rays are supplied with a constant diameter $P_0$ from the exit pupil of the re-imaging optical system 30. Incidentally, the position $B_1$ of the aerial image I formed by the first optical system 30A is made coincident with the rear focal position (on the illuminated surface side) of the first optical system 30A and with the front focal position (on the light source side) of the second optical system 30B.

Parallel rays emitted at each exit angle from the re-imaging optical system 30 are reflected by the optical reflector 140 to be focused in the shape of arc on the reticle R placed at the illuminated surface.

Figure 39:
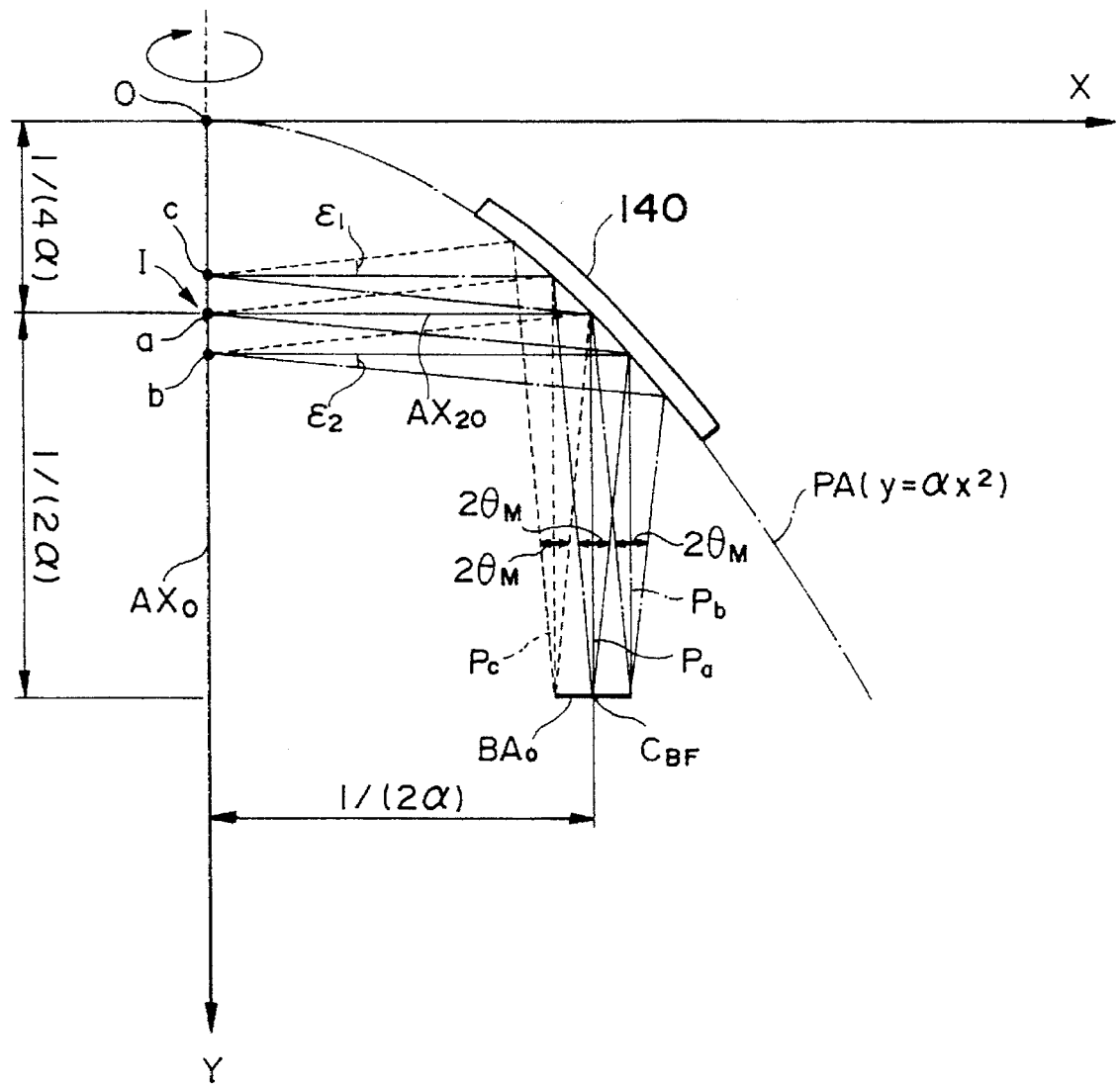
FIG. 39 is a cross sectional drawing of an optical reflector in a meridional direction.
Figure 40:
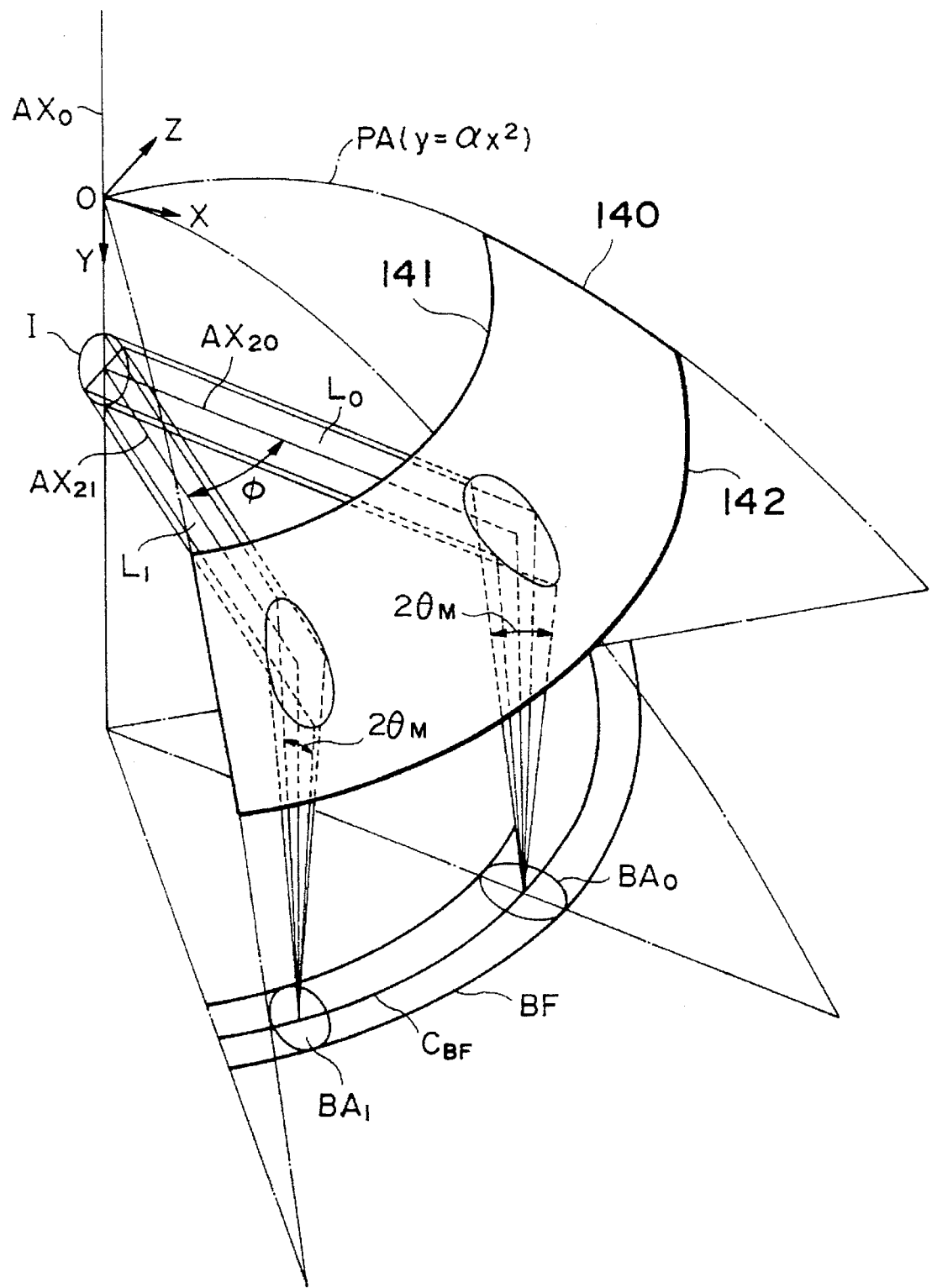
FIG. 40 is a perspective view to show the optical reflector.

The optical reflector 140 is next described. FIG. 39 and FIG. 40 show the structure of the optical reflector. FIG. 39 is a cross sectional view of the optical reflector 140 in the meridional direction, and FIG. 40 is a perspective view of the optical reflector 140.

In FIG. 39, a parabola is PA, the origin is at the vertex O of the parabola PA, the Y axis on the symmetry axis $Ax_0$ of the parabola PA passing the vertex O, and the X axis on the axis passing the vertex O and being perpendicular to the symmetry axis $Ax_0$.

As shown in FIG. 39, the cross section of the optical reflector 140 in the meridional direction constitutes a part of the parabola PA. The reflective plane is formed in the shape of a curved surface obtained by rotating the parabola PA about the symmetry axis $Ax_0$. Namely, the optical reflector 140 has the arc shape occupying a belt area between two latitudes 141 and 142 on the parabola, as shown in FIG. 40.

Returning to FIG. 39, the function of optical reflector 140 is now described as to rays in the meridional direction. Meridional rays mean rays in a plane including the symmetry axis $Ax_0$ of the optical reflector 140 while sagittal rays mean rays in a plane perpendicular to the meridional plane.

When a light source image I of predetermined size (or light source with predetermined size) is formed at a certain position on the symmetry axis $Ax_0$ by an unrepresented optical system, rays from an arbitrary point on the light source image I (or light source) are converted into parallel rays by the converging function of the optical reflector 140.

For example, rays from the center a of the light source image I (or light source) are converted into parallel rays by the optical reflector 140 to illuminate an area $BA_0$ on the illuminated surface normally thereto, and rays from the lower edge b of the light source image I (or light source) are converted into parallel rays by the optical reflector 140 to illuminate the area $BA_0$ on the illuminated surface obliquely from right upper. Also, rays from the upper edge c of the light source image I (or light source) are converted into parallel rays by the optical reflector 140 to illuminate the area $BA_0$ on the illuminated surface obliquely from left upper.

As described, rays from each position of light source image I (or light source) are converted into parallel rays by the optical reflector 140 to uniformly illuminate the area $BA_0$ on the illuminated surface in a superposed manner.

Now let us study the numerical aperture in the meridional direction by the optical reflector 140 in this arrangement. First, parallel rays (rays shown by solid lines) from light source image I (or light source) parallel to the optical axis $Ax_{20}$ are reflected by the optical reflector 140 to be converged at the center of the area $BA_0$ on the illuminated surface under a numerical aperture $NA_M$ ($=\sin\theta_M$). Parallel rays (rays shown by dotted lines) from light source image I (or light source) having a divergent angle $\epsilon_1$ to the optical axis $Ax_{20}$ are reflected by the optical reflector 140 to be converged at the left edge of the area $BA_0$ on the illuminated surface under a numerical aperture $NA_M$. Further, parallel rays (rays shown by dotted lines) from light source image I (or light source) having a divergent angle $\epsilon_2$ ($=\epsilon_1$) equal in angle to the divergent angle $\epsilon_1$ but different in divergent direction from the divergent angle $\epsilon_1$ are reflected by the optical reflector 140 to be converged at the right edge of the area $BA_0$ on the illuminated surface under a numerical aperture $NA_M$. The optical axis $Ax_{20}$ is bent at 90 degrees by the optical reflector 140.

Accordingly, parallel rays having an arbitrary divergent angle from the light source image I (or light source) are converged under a constant numerical aperture $NA_M$ at any position in the meridional direction on the area $BA_0$ of the illuminated surface. In addition, it is seen that principal rays ($P_a$, $P_b$, $P_c$) of the parallel rays from light source image I (or light source) are always parallel to the optical axis $Ax_{20}$, maintaining the telecentricity. In order to keep the numerical aperture $NA_M$ in this case substantially constant, it is preferred that the value of the numerical aperture $NA_M$ be set as to be small.

Next described, referring to FIG. 40, is the function of the optical reflector 140 in the sagittal direction. Parallel rays $L_0$ from a light source image I (or light source) formed on the symmetry axis $Ax_0$ are reflected by the optical reflector 140 to be converged on the area $BA_0$ of the illuminated surface, and parallel rays $L_1$ from light source image I (or light source) outgoing at a divergent angle inclined at angle $\psi$ to the parallel rays $L_0$ are reflected by the optical reflector 140 to be converged on an area $BA_1$ of the illuminated surface.

Here, let us look at rays in the meridional direction among rays from the light source image I forming the area $BA_1$ on the illuminated surface. Then, similarly as in FIG. 39, parallel rays having an arbitrary divergent angle from light source image I (or light source) are converged under a constant numerical aperture $\theta_M$ at any position in the meridional direction on the area $BA_1$ of the illuminated surface, and in addition the principal ray in the parallel rays from the light source image I (or light source) is always parallel to the optical axis $Ax_{21}$, maintaining the telecentricity.

Accordingly, when parallel rays from the light source image I (or light source) formed on the symmetry axis $Ax_0$ are radially outgoing as spread in the arc direction of the optical reflector 140 (in the direction along the latitudes 141, 142 of the parabolic body of rotation), an arcuate illumination region BF is formed while maintaining the telecentricity.

The arcuate illumination region BF corresponds to the illuminated surface, and the light source image or light source is present at infinity to the illuminated surface. A projection optical system telecentric on the entrance side is provided below the illuminated surface, as will be detailed hereinafter. A light source image is formed at the position of entrance pupil of the projection optical system. It is therefore understood that the illuminated surface can be illuminated under so-called Köhler illumination.

Next studied, referring to FIGS. 41A to 41F, are the analysis of the above description using equations, a suitable shape of the optical reflector, a suitable position of the light source image I (or light source), and a suitable position of the illumination region BF.

Figure 41A:
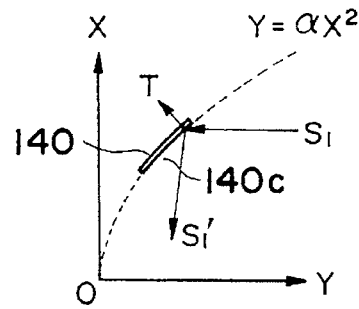
FIGS. 41A to 41F are explanatory drawings to illustrate a shape suitable for the optical reflector.

As shown in FIG. 41A, let us assume that the reflective plane of the optical reflector 140 has a surface which can be expressed in the meridional direction by a quadratic function with the origin of XY coordinate system at the vertex O of a parabola PA, that is, by $y=\alpha x^2$ (where $\alpha$ is a constant). First studied are rays parallel to the Y axis in the meridional direction.

I) Rays parallel to the Y axis in the meridional direction

A normal vector T is expressed by Equation (119) at an arbitrary point on a parabola PA ($y=\alpha x^2$).

$$T = \left( \frac{2\alpha x}{(4\alpha^2 x^2 + 1)^{0.5}}, \frac{-1}{(4\alpha^2 x^2 + 1)^{0.5}} \right) \quad (119)$$

Let a unit vector $S_1$ parallel to the Y axis in the plane of FIG. 41A be $S_1=(0, 1)$, an intersection between the unit vector $S_1$ and the parabola PA ($y=\alpha x^2$) be ($u, \alpha u^2$), and a unit vector $S_1'$ of a ray reflected by the parabola PA be $S_1'=(S_{X1}, S_{Y1})$. Then the following Equation (120) holds.

$$S_1' = S_1 - 2T(T \cdot S_1) \quad (120)$$

Thus, the unit vector $S_1'$ after reflection is obtained as in Equation (121) from Equations (119) and (120).

$$S_1' = (S_{X1}, S_{Y1}) = \left( \frac{-4\alpha u}{(4\alpha^2 u^2 + 1)}, \frac{2}{(4\alpha^2 u^2 + 1)} - 1 \right) \quad (121)$$

A line being parallel to the unit vector $S_1'$ after reflection and passing through the point ($u, \alpha u^2$) on the parabola PA is expressed by following Equations (122) and (123).

$$x = S_{X1} t + u \quad (122)$$

$$y = S_{Y1} t + \alpha u^2 \quad (123)$$

In the equations, t is a variable.

As shown in FIG. 41A, a ray reflected at the point ($u, \alpha u^2$) on the parabola PA intersects with the y axis at $x=0$. The intersecting position is obtained as follows.

From Equation (122), $x = S_{X1} t + u = 0$. Then $t = -u/S_{X1}$. Substituting this value into t in, above Equation (123) and using the relation of Equation (121), the following Equation (124) is obtained after arranged.

$$y = S_{Y1} \left[ -\frac{u}{S_{X1}} \right] + \alpha u^2 = \frac{1}{4\alpha} \quad (124)$$

Therefore, it is seen from Equation (124) that any ray in the meridional plane parallel to the unit vector $S_1$, that is, parallel to the Y axis is converged irrespective of the value of u at the point F' $(0, (4\alpha)^{-1})$ on the Y axis.

Accordingly, it is understood that either where the light source is located for the converging position to be at the center of the light source or where the light source image is formed for the center thereof to be at the converging position, from the reversible property of rays, all the diverging rays from the light source or the center of the light source image are converted into parallel rays by the parabola PA and the illumination region is formed in a state where the telecentricity is perfectly maintained.

As shown in FIG. 39, the ray traveling on the optical axis $Ax_{20}$ is reflected at the point $((2\alpha)^{-1}, (4\alpha)^{-1})$ on the parabola PA and turns by 90 degrees. The distance $(2\alpha)^{-1}$ from the reflection point to the illuminated surface is the focal length of the optical reflector 140.

II) Rays parallel to the X axis in the meridional direction

Figure 41B:
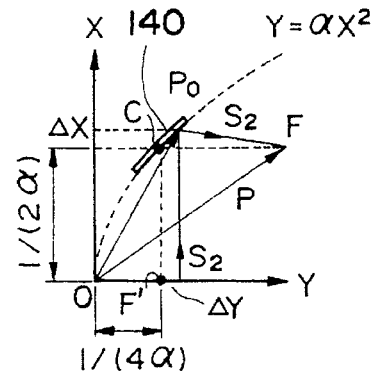

Next described, referring to FIG. 41B are rays parallel to the X axis in the meridional direction.

When a ray from the point F' $(0, (4\alpha)^{-1})$ on the Y axis is reflected at the point c $((2\alpha)^{-1}, (4\alpha)^{-1})$ on the parabola PA, the ray becomes parallel to the Y axis, as described above. Then, let us obtain a position F where a ray reflected at a position $p_0$ $((2\alpha)^{-1}+\Delta x, (4\alpha)^{-1}+\Delta y)$ apart by $\Delta x$ and $\Delta y$ on the parabola PA from the point c intersects with a line $x=(2\alpha)^{-1}$.

Let a unit vector $S_2$ parallel to the X axis in the plane of FIG. 41B, be $S_2=(1, 0)$ and a unit vector $S_2'$ after reflected by the parabola PA be $S_2'=(S_{X2}, S_{Y2})$. Then the following Equation (125) holds.

$$S_2' = S_2 - 2T(T \cdot S_2) \quad (125)$$

Thus, the unit vector $S_2'$ after reflection is given by Equation (126) from Equations (119) and (125).

$$S_2' = (S_{X2}, S_{Y2}) = \left( 1 - \frac{8\alpha^2 u^2}{(4\alpha^2 u^2 + 1)}, \frac{4\alpha u}{(4\alpha^2 u^2 + 1)} \right) \quad (126)$$

Further, let a position vector $P_0$ be a vector between the origin O (0, 0) and the point $p_0$ $((2\alpha)^{-1}+\Delta x, (4\alpha)^{31\ 1}+\Delta y)$, P be a vector between the origin O (0, 0) and the position F, and r be a distance between the point $p_0$ and the position F. Then the following relation of Equation (127) stands.

$$P = P_0 + r S_2' \quad (127)$$

Defining the vector P as $P=(P_X, P_Y)$ where $P_X=(2\alpha)^{-1}$, Equation (128) is obtained.

$$P_X = \frac{1}{2\alpha} + \Delta x + r \left[ 1 - \frac{8\alpha^2 [1/(2\alpha) + \Delta x]^2}{4\alpha^2 [1/(2\alpha) + \Delta x]^2 + 1} \right] = \frac{1}{2\alpha} \quad (128)$$

Reforming Equation (128), the following Equation (129) is obtained.

$$r = \Delta x \frac{2\alpha^2 \Delta x^2 + 2\alpha \Delta x + 1}{2\alpha^2 \Delta x^2 + 2\alpha \Delta x} = \frac{2\alpha^2 \Delta x^2 + 2\alpha \Delta x + 1}{2\alpha^2 \Delta x + 2\alpha} \quad (129)$$

If $\Delta x$ unlimitedly approaches zero, the limit of Equation (129) is expressed by the following Equation (130).

$$\lim_{\Delta x \to 0} r = \frac{1}{2\alpha} \quad (130)$$

As apparent from Equation (130), rays parallel to the unit vector $S_2$, that is, rays parallel to the X axis are converged at a focal position of the position F $((2\alpha)^{-1}, (4\alpha)^{-1}+(2\alpha)^{-1})$ by the parabola PA. It is seen that this relation holds in the paraxial region. It is thus understood that a need is to locate the illuminated surface at the position F.

Figure 41C:
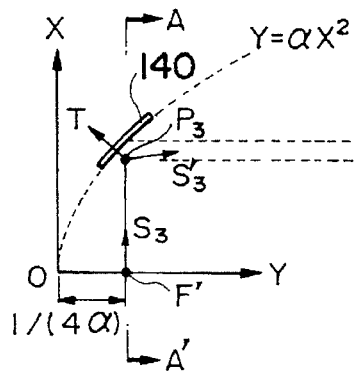
Figure 41D:
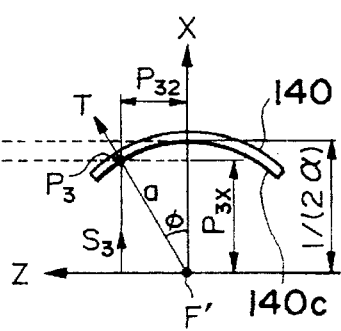

III) Rays parallel to the X axis and passing $x=(4\alpha)^{-1}$ in the sagittal direction Rays in the sagittal direction are next studied referring to FIG. 41C and FIG. 41D.

FIG. 41C shows a state in the XY plane (meridional plane), and FIG. 41D is a drawing to show a section along AA' in FIG. 41C as seen in the direction of arrows A, A', which shows a state in a plane parallel to the XZ plane at a height of $y=(4\alpha)^{-1}$.

Consider a ray passing $y=(4\alpha)^{-1}$ in parallel with the X axis, as shown in FIG. 41C and in FIG. 41D. Let $p_3=(P_{3x}, (4\alpha)^{-1}, P_{3z})$ be a point $p_3$ where the ray is reflected at the reflective plane 140c on the optical reflector 140, q be a distance between the symmetry axis $Ax_0$ (Y axis) and the reflection point $p_3$, and $\psi$ be an angle expanded by a line connecting the symmetry axis $Ax_0$ and the reflection point $p_3$ with respect to the XY plane including the origin O. Then $P_{3x}$ and $P_{3z}$ may be expressed by Equations (131) and (131), respectively.

$$P_{3x} = q\cos\psi \quad (131)$$

$$P_{3z} = q\sin\psi \quad (131)$$

A normal vector T at the reflection point $p_3$ may be expressed by the following Equation (133).

$$T = \left( \frac{1}{2^{0.5}} \cdot \cos\psi, -\frac{1}{2^{0.5}}, \frac{1}{2^{0.5}} \cdot \sin\psi \right) \quad (133)$$

Now let a unit vector $S_3$ of ray parallel to the X axis and passing $y=(4\alpha)^{-1}$ be $S_3=(1, 0, 0)$ and a unit vector $S_3'$ of ray reflected at the point $p_3$ on the reflective plane 140c be $S_3'=(S_{3X}, S_{3Y}, S_{3Z})$. Then the following relation of Equation (134) holds.

$$S_3' = S_3 - 2T(T \cdot S_3) \quad (134)$$

Thus, the unit vector $S_3'$ after reflection is given by Equation (135) from Equations (133) and (134).

$$\begin{aligned} S_3' &= (S_{3X}, S_{3Y}, S_{3Z}) \\ &= (1 - \cos^2\psi, \cos\psi, -\sin\psi\cos\psi) \end{aligned} \quad (135)$$

Let us consider a line passing through the reflection point $p_3$ and being parallel to the unit vector $S_3'$ after reflection. The line may be expressed by Equations (136), (137) and (138).

$$x = S_{3X}t + q\cos\psi \quad (136)$$

$$y = S_{3Y}t + \frac{1}{4\alpha} \quad (137)$$

$$z = S_{3Z}t + q\sin\psi \quad (138)$$

In the equations, t is a variable.

Now let us calculate a position where the line parallel to the unit vector $S_3'$ after reflection and passing through the reflection point $p_3$ intersects with the XY plane including the origin O, as shown in FIG. 41D. Since z=0 in this case, putting z=0 into Equation (138) yields $t=-q\sin\psi/S_{3z}=q/\cos\psi$. Substituting this value of t into Equation (137) and using the relation of Equation (135), Equation (139) is obtained after arranged.

$$y = q + 1/4\alpha \quad (139)$$

As seen from Equation (139), the rays are converged at $y=3/(4\alpha)$ when $q=(2\alpha)^{-1}$.

Also, substituting $t=q/\cos\psi$ into Equation (136), Equation (140) is obtained after arranged.

$$x = q/\cos\psi \quad (140)$$

From above Equations (139) and (140), it is understood that $x \approx q$ when $\psi$ is very small and that the rays are converged at point F $((2\alpha)^{-1}, 3/(4\alpha), 0)$ when $q=(2\alpha)^{-1}$.

IV) Rays parallel to the Y axis in the sagittal direction

Figure 41E:
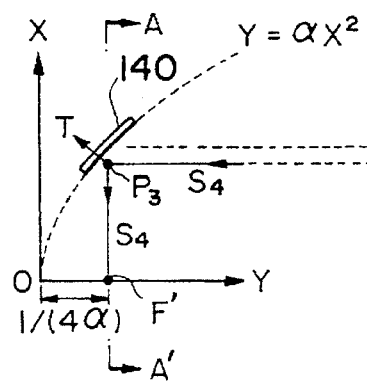
Figure 41F:
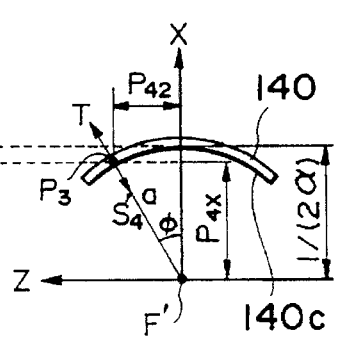

Finally studied, referring to FIG. 41E and FIG. 41F, are rays parallel to the Y axis in the sagittal direction which are reflected at the reflection point $p_3$ shown in FIG. 41C and FIG. 41D.

FIG. 41E shows the state in the XY plane (meridional plane), and FIG. 41F is a cross section along AA' as seen in the direction of arrows A, A' in FIG. 41E, which shows the state in the plane parallel to the XZ plane at a height of $y=(4\alpha)^{-1}$.

Let $S_4=(0, -1, 0)$ be a unit vector $S_4$ of ray going to the reflection point $p_3$ in parallel with the Y axis, and $S_4'=(S_{4X}, S_{4Y}, S_{4Z})$ be a unit vector $S_4'$ of ray reflected at the point $p_3$ on the reflective plane 140c, as shown in FIGS. 41E and 41F. Then the following relation of Equation (141) holds.

$$S_4' = S_4 - 2T(T \cdot S_4) \quad (141)$$

Thus, the unit vector $S_4'$ after reflection is expressed by Equation (142), from Equations (133) and (141).

$$S_4' = (S_{4X}, S_{4Y}, S_{4Z}) = (-\cos\psi, 0, -\sin\psi) \quad (142)$$

Here, consider a line passing through the reflection point $p_3$ and being parallel to the unit vector $S_1'$ after reflection. Then the line is expressed by Equations (143), (144) and (145).

$$x = S_{4X}t + q\cos\psi \quad (143)$$

$$y = S_{4Y}t + \frac{1}{4\alpha} = \frac{1}{4\alpha} \quad (144)$$

$$z = S_{4Z}t + q\sin\psi \quad (145)$$

Now let us obtain a point where the ray reflected at the reflection point $p_3$ intersects with the XY plane (plane of FIG. 41E) including the origin O, as shown in FIG. 41E and FIG. 41F.

Then, since z=0, $t=-q\sin\psi/S_{4Z}$ by putting z=0 into Equation (145). Substituting this value of t into above Equation (143) and using the relation of Equation (142), Equation (146) is obtained after arranged.

$$x = 0 \quad (146)$$

Accordingly, the ray passing through the reflection point $p_3$ in parallel with the Y axis in the sagittal direction is converged at the point F' (0, $(4\alpha)^{-1}$, 0) which coincides with the converging point of the rays parallel to the Y axis in the meridional direction as described in section I. It is thus understood that this relation holds outside the paraxial region in absence of aberration.

Thus, diverging rays from the point F' (0, $(4\alpha)^{-1}$, 0) at the center of light source image or light source are reflected by the reflector 140 to be always parallel to the Y axis so that parallel rays illuminate the illuminated plane in the shape of arc. It is thus understood that the telecentricity is maintained over the arcuate, illuminated surface.

The result of the above analysis finds the fact that the optical reflector 140 is preferably formed by at least a part of the parabolic body of rotation satisfying following Equation (147) when the origin is at the vertex O of parabola ($y=\alpha x^2$), the Y axis is defined along the symmetry axis $Ax_0$ passing through the origin O, the X axis extends along the direction perpendicular to the Y axis and passing through the vertex O, and the Z axis is normal to the X axis and to the Y axis (the symmetry axis $Ax_0$) while passing through the vertex O.

$$x^2+z^2=y/\alpha \qquad (147)$$

If the entrance pupil to the optical reflector 140 is located at the position of the light source side focus (($(2\alpha)^{-1}$) of the optical reflector 140 on the symmetry axis $Ax_0$, as shown in FIG. 39, while satisfying the above relation of Equation (147) and if a generally circular light source image or light source is formed thereat, rays from the light source or light source image are converted by the optical reflector 140 into parallel rays having an arcuate cross section of beam to form an arc illumination area, in which the telecentricity and Köhler illumination state is maintained.

The center of light source image I (or light source) is at coordinates F' (0, $(4\alpha)^{-1}$, 0) and the center $C_{BF}$ of the illuminated surface BF shown in FIG. 40 is a part of circle satisfying following Equations (148) and (149).

$$x^2+z^2=(1/2\alpha)^2 \qquad (148)$$

$$y=3/(4\alpha) \qquad (149)$$

As described above, the conditions for Köhler illumination are satisfied at each point in the arc illumination area.

Figure 42:
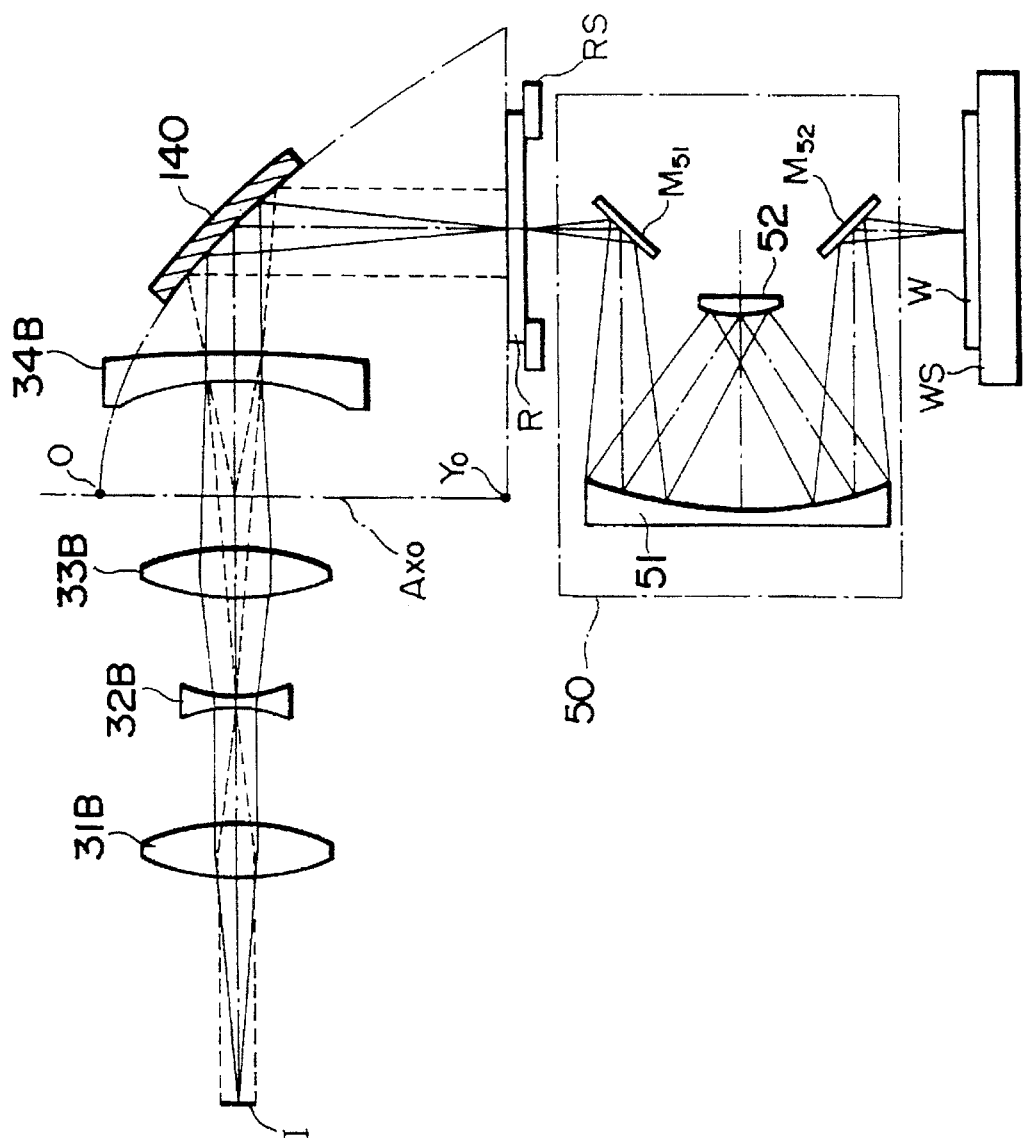
FIG. 42 is a schematic constitutional drawing to show the structure of an exposure portion.

As described above, there is a 1:1 double side telecentric projection optical system 50 provided between the reticle R and the wafer W (FIG. 42). The projection optical system 50 has basic constituents of concave mirror 51 and convex mirror 52 and further includes reflection mirrors $M_{51}$, $M_{52}$ for bending an optical path between the reticle R and the concave mirror 51 and between the concave mirror 51 and the wafer W, respectively. The center of curvature of the concave mirror 51 is approximately coincident with that of the convex mirror 52, and the radius of curvature of the convex mirror 52 is a half of that of the concave mirror 51.

The position $A_1$ of light source image formed by the light source image forming optical system 20, the position $A_2$ of light source image re-imaged by the re-imaging optical system 30, the position $A_{20}$ of exit pupil of the re-imaging optical system 30, and the position of entrance pupil of the projection optical system 50 (position at or near the convex mirror 52) are conjugate with each other, and the shape of light source image and pupil is circular at all the positions.

It is thus seen that an arc illumination area is formed on the reticle R and that the telecentricity is maintained under Köhler illumination.

The position $B_1$ where parallel rays outgoing at respective exit angles from the optical integrator in the light source image forming optical system 20 are focused by the first optical system 30A is conjugate with the position $B_2$ of object plane on the reticle R.

Figure 43:
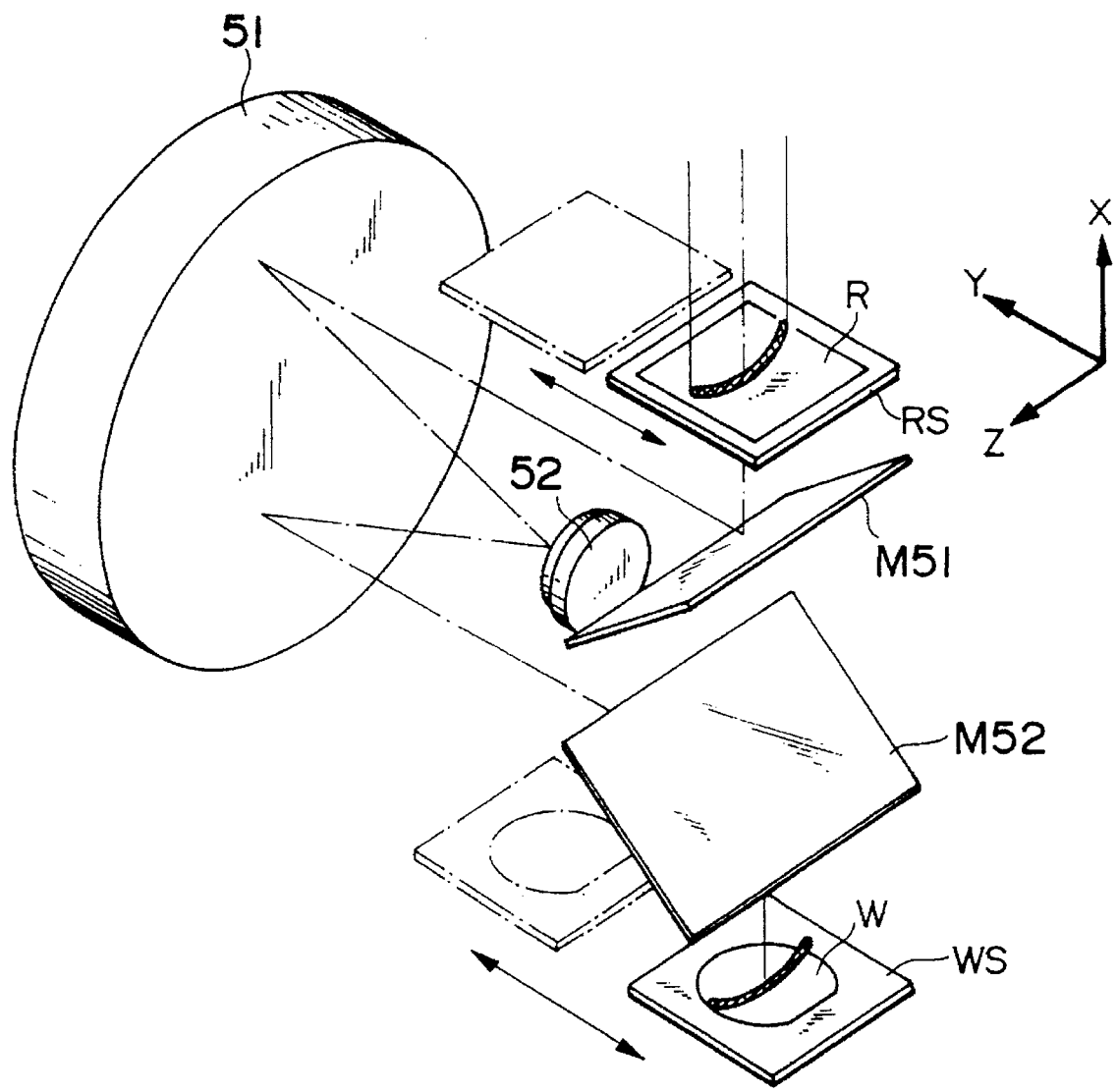
FIG. 43 is a schematic perspective view to show an extracted main portion of the exposure portion.

The reticle R is held by the reticle stage RS, and the wafer W by the wafer stage WS. The reticle stage RS and the wafer stage WS are driven by a drive system as described below during exposure to move in the directions shown by arrows so that the exposure of entire pattern on the reticle R may be effected on the wafer W (see FIG. 43).

Figure 44:
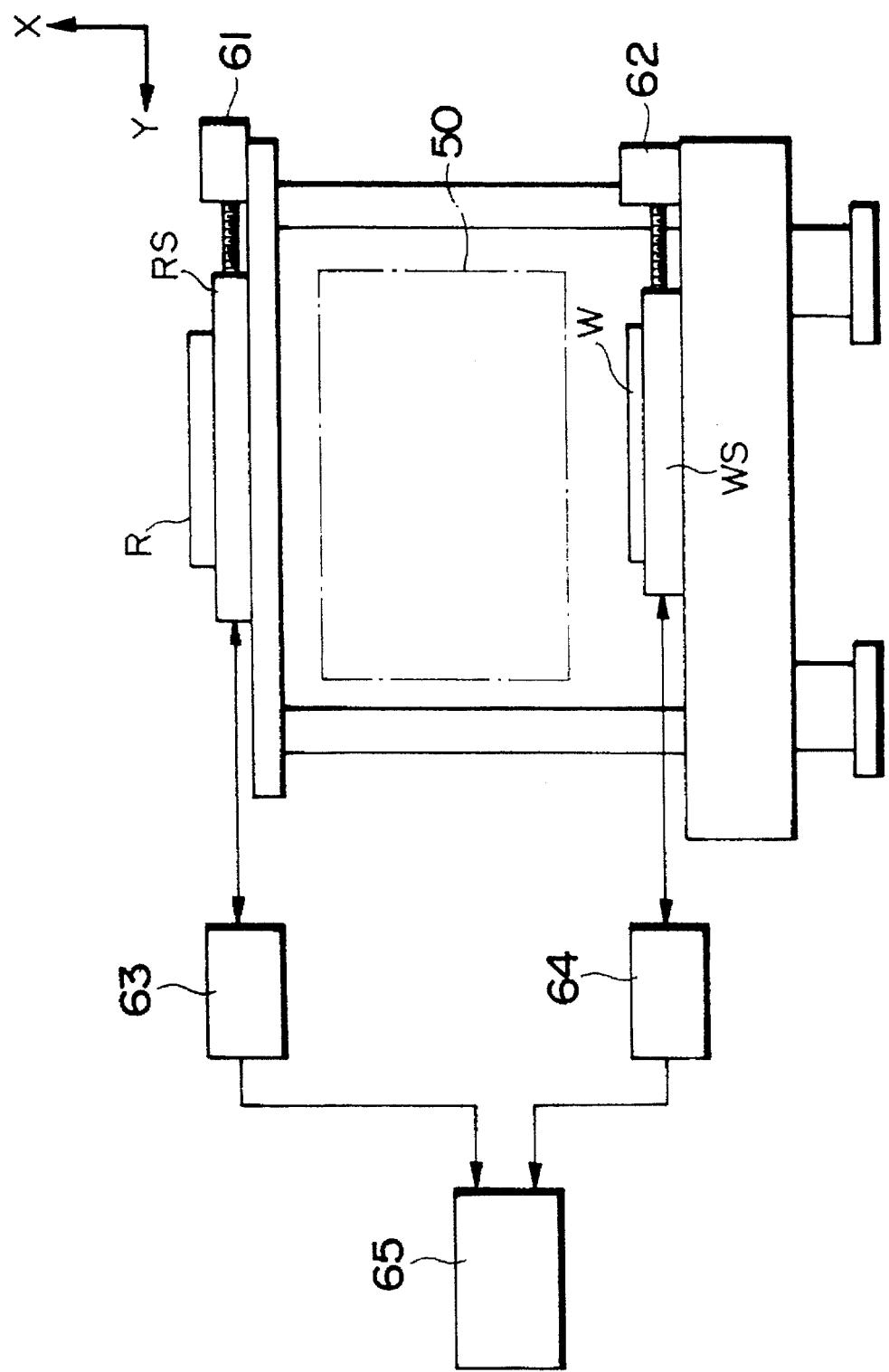
FIG. 44 is a drawing schematically to show the structure of a stepper.

Now described, referring to FIG. 44, is the structure of a stepper for sequentially moving the reticle stage RS and the wafer stage WS in exposure. This stepper has the general structure, for example, as disclosed in Japanese Laid-open Patent Application No. 61-251025. The reticle stage RS carries the reticle R thereon and is constructed as movable in the Y direction, in the Z direction and in the oblique direction to the YZ plane in the coordinate system as defined before. Also, the wafer stage WS below the reticle stage RS similarly carries the wafer W thereon and is constructed as movable in the Y direction, in the Z direction and in the oblique direction to the YZ plane in the coordinate system as defined before.

The reticle stage RS or the wafer stage WS is intermittently driven along the Y direction by a pulse motor 61 or 62, and a movement position thereof is detected by a laser interferometer 63 or 64, respectively. Detection results are input into a drive control unit 65, and the drive control unit 65 synchronization-controls a movement amount of reticle stage RS or wafer stage WS, based on the detection results. Namely, the drive control unit 65 supplies pulse signals as control signals to the pulse motors 61, 62.

The stages RS, WS do not necessarily have to be moved at the same speed but may be moved at respective speeds arranged at an appropriate ratio. Also, the stages RS, WS may be moved in different directions opposite to each other.

As described above, the apparatus shown in the present embodiment permits the reticle to be uniformly illuminated in the shape of arc at high illumination efficiency and under uniform numerical aperture, whereby the circuit pattern on the reticle R may be replicated on the wafer W in the shape of arc in short exposure time and at high resolution.

Although the present embodiment shows an example in which the projection optical system 50 is constituted as a 1:1 system, the projection optical system may be constituted as a demagnifying system or as a magnifying system, of course.

Embodiment II-2

FIGS. 45A and 45B show another example of the re-imaging optical system 30 in Embodiment II-1 as described above. In FIGS. 45A and 45B, the same reference numerals denote the same constituent elements as those in FIGS. 36A and 36B.

Figure 46:
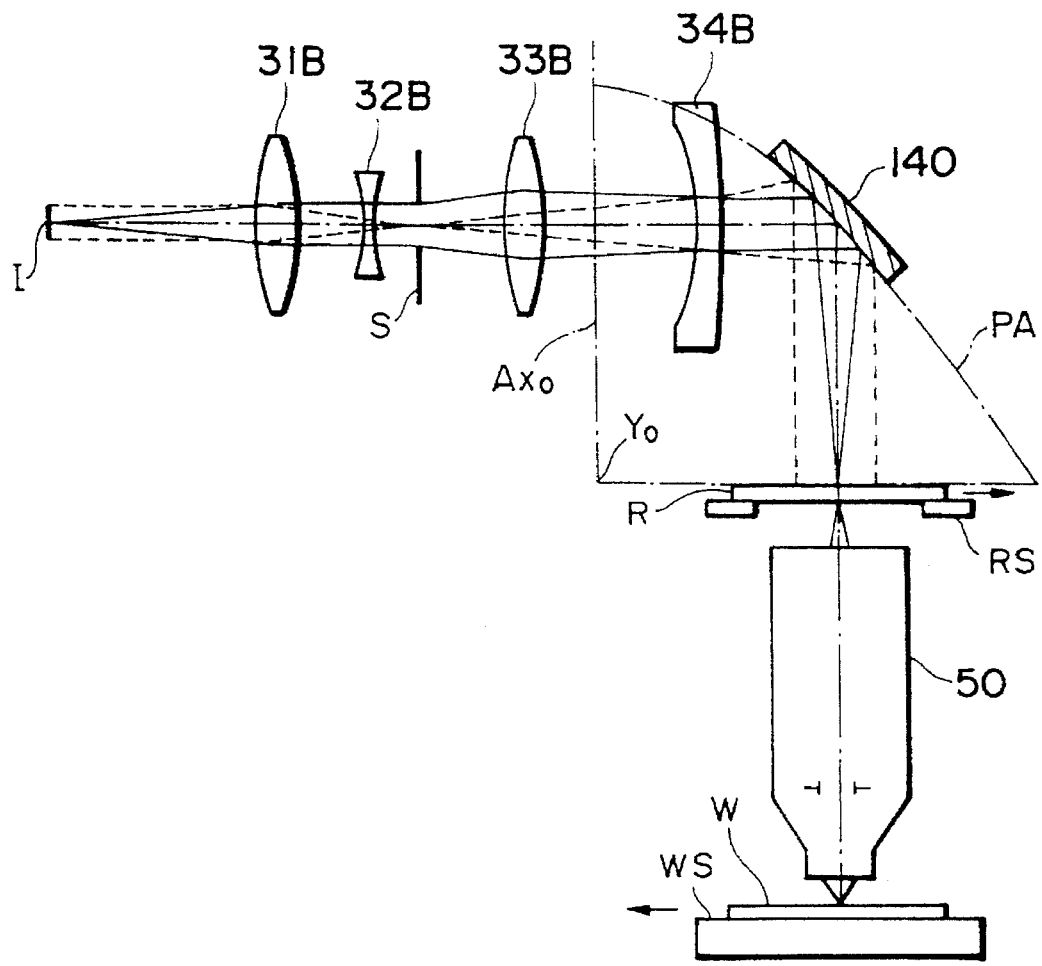
FIG. 46 is a schematic constitutional drawing to show the structure of an exposure portion where the re-imaging optical/system shown in FIG. 45A is employed.

In Embodiment II-1, the aperture stop S is disposed on the exit side of optical integrator, while in the present embodiment a real image of secondary light source of optical integrator is formed in a space within a second optical system 30B of re-imaging optical system 30 and an aperture stop S is placed at the position $A_2$ where the real image is formed. Further, the present embodiment shows an example in which a projection optical system 50 is constituted as a refraction type demagnifying projection system as shown in FIG. 46. The arrangement of this embodiment can expect the same effect as in Embodiment II-1 as described.

In case that the projection optical system 50 is constituted as a refraction-type demagnifying projection system with replication magnification of 1/n, a scan speed of wafer W will be 1/n of that of reticle R. Further, the scan direction of wafer W is opposite to that of reticle R.

Recently proposed was the oblique illumination technology attracting great attention, in which a reticle R is obliquely illuminated by shaped light from a secondary light source formed by optical integrator for example, whereby the resolution and the depth of focus are greatly improved as compared with what the projection optical system originally has.

An example is the ring illumination method, in which a ring (doughnut) aperture portion is provided in an aperture stop disposed on the exit side of optical integrator to form a secondary light source of ring shape and to obliquely illuminate the reticle R, whereby the resolution and the depth of focus of projection optical system may be improved. Also known is the special oblique illumination method, in which the aperture stop has two or four eccentric apertures to form two or four eccentric secondary light sources and thereby to obliquely illuminate the reticle R, whereby a higher resolution and a deeper depth of focus are obtainable than those in the ring illumination method. This method is disclosed, for example, in Japanese Laid-open Patent Application No. 4-101148.

Then, if an aperture stop S having a ring aperture portion OP as shown in FIG. 47A is disposed in a second optical system 30B of a re-imaging optical system 30, rays from a ring light source formed by this aperture stop S could evenly and obliquely illuminate the area on the reticle R in the shape of arc under a unique numerical aperture, which permits faithful replication of finer reticle pattern on the wafer W in a deep depth of focus.

Figure 47:
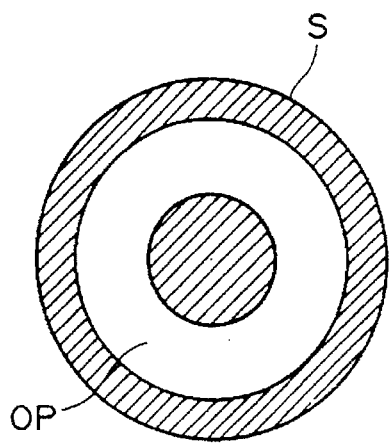
FIG. 47 is a plan view to show a shape of an aperture stop.

The advantage of the oblique illumination method can also be expected, if the aperture stop S as shown in FIG. 47 is applied to Embodiment II-1 shown in FIGS. 36A and 36B. In such an arrangement, the reflection type projection optical system 50 shown in FIG. 42 should be preferably replaced by the demagnifying system shown in FIG. 46.

Although Embodiments II-1 and II-2 showed the examples in which the light source such as laser is used as means for supplying parallel rays, the means is not limited to that. For example, the means for supplying parallel rays may be constituted, for example, by an elliptic mirror, a light source of mercury arc lamp provided at the first focus position of the elliptic mirror, and a collimator lens for converting light of mercury arc lamp condensed by the elliptic mirror into parallel rays.

Further, Embodiments II-1 and II-2 showed the examples in which the secondary light source (surface illuminant having an area) composed of a plurality of light source images are formed by the light source 10 supplying parallel rays and the light source image forming optical system 20, which serve substantially as light source means for supplying rays outgoing at respective exit angles, but the means is not limited to that. For example, the light source means may be constituted by a mercury arc lamp supplying rays radiated at respective radiation angles and a concave reflection mirror for effectively guiding the rays emitted from the mercury arc lamp to the optical system. In this case, a preferable arrangement is that a re-imaging optical system is opposed to the concave reflection mirror with the mercury arc lamp being in between and that a light emission point of mercury arc lamp is made coincident with the entrance pupil of the re-imaging optical system.

Embodiment II-3

Figure 48:
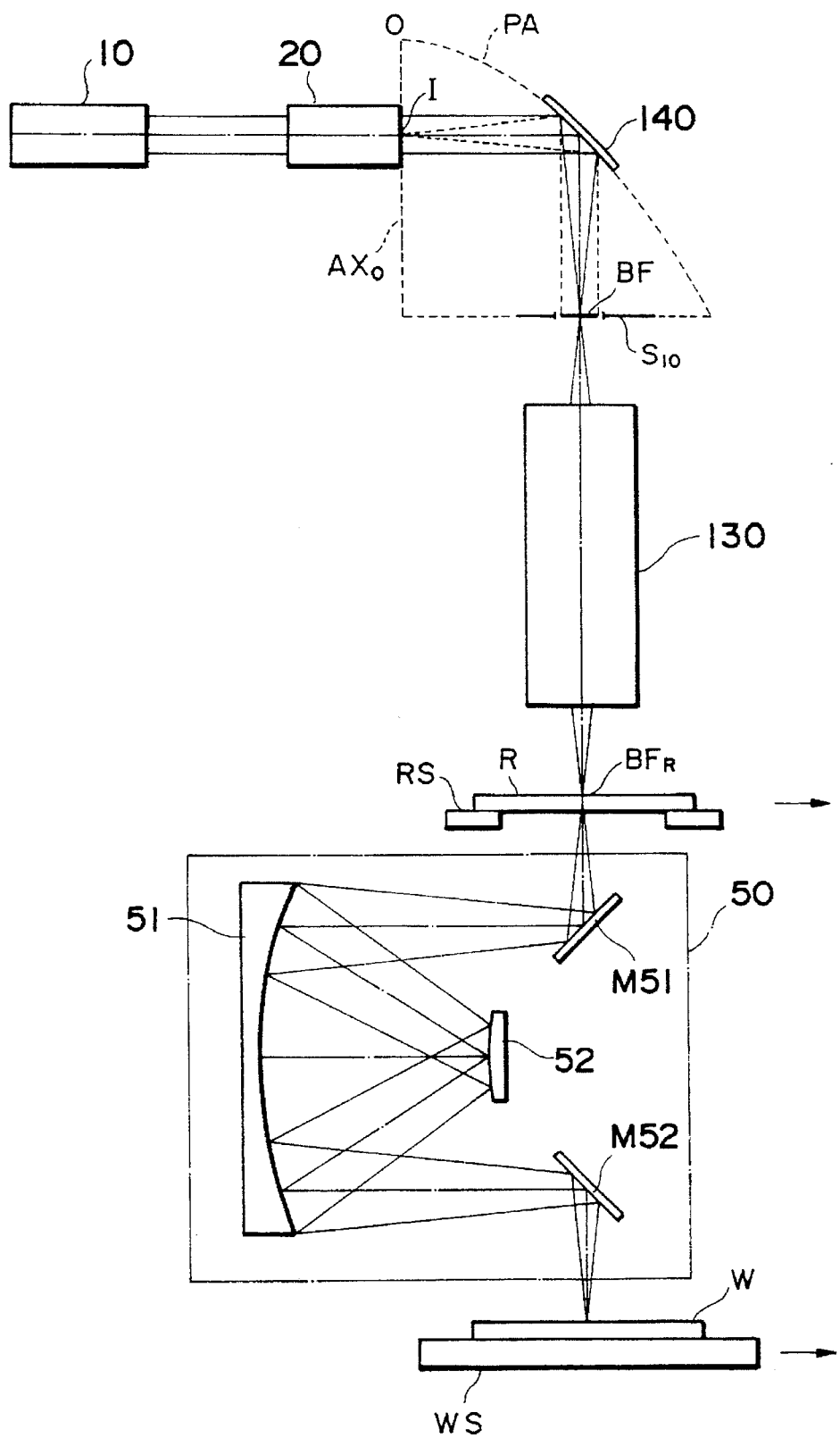
FIG. 48 is a drawing to show an embodiment in which the illumination optical system is applied to an exposure apparatus.

FIG. 48 shows another embodiment of the present invention. In this embodiment a re-imaging optical system 130 is disposed below an illumination area BF of optical reflector 140 and a reticle R is placed further below the re-imaging optical system 130.

In this apparatus, the light source 1, such as an excimer laser, supplies parallel rays for exposure, an unrepresented beam expander shapes the parallel rays into a beam with desired beam diameter, and the shaped beam then enters a light source image forming optical system 20 comprising an optical integrator.

It should be noted that the means for supplying the parallel rays is not limited to the light sources such as lasers. For example, it may be constructed of an elliptic mirror, a mercury-arc lamp placed at the first focus position of the elliptic mirror, and a collimator lens for converting light emitted from the mercury-arc lamp and then collected by the elliptic mirror into parallel rays.

The symmetry axis $Ax_0$ is arranged to pass the position of a plurality of light source images I (secondary light source) formed by the optical integrator, and these light source images I are formed at the light source side focus position of the optical reflector 140 (where the focal length f on the light source side is given by $f=(2\alpha)^{-1}$).

Consequently, the rays from the optical integrator are converted into parallel rays by the optical reflector 140, as shown by dotted lines, and an arcuate illumination region BF is formed at the illuminated surface side focus position of the optical reflector 140 (where the focal length f on the illuminated surface side is given by $f=(2\alpha)^{-1}$) in a state where the telecentricity is maintained.

A slit plate $S_{10}$ (see FIG. 17) is provided at the position of the illumination area BF as a field stop having an arcuate aperture portion for accurately defining an illumination area $BF_R$ on the reticle R. Rays passing through the slit plate $S_{10}$ are again converged through the re-imaging optical system 130 on the reticle R to form the arc illumination area $BF_R$ thereon while maintaining the telecentricity.

The rays passing through the slit plate $S_{10}$ are focused at the position of pupil (entrance pupil) of the re-imaging optical system 130 to form a light source image I' thereat, as described later.

Now, a 1:1 bitelecentric projection optical system 50 is provided between the reticle R and the wafer W. The projection optical system 50 has the basic structure with a concave mirror 51 and a convex mirror 52. Further, reflective mirrors $M_{S1}$, $M_{S2}$ for bending the optical path are placed between the reticle R and the concave mirror 51 and between the concave mirror 51 and the wafer W, respectively. In addition, the center of curvature of the concave mirror 51 is nearly coincident with that of the convex mirror 52, and the radius of curvature of the concave mirror 52 is a half of that of the concave mirror 51.

Here, a light source image I formed by the optical integrator (at the light source side focus position of optical reflector 140 ) is substantially conjugate with the entrance pupil of the re-imaging optical system 130 and with the entrance pupil of a projection optical system 50 (at or near a convex mirror 52). In addition, the light source image I, the entrance pupil of re-imaging optical system 130, and the entrance pupil of projection optical system 50 all are circular in shape.

It is thus seen that the arc illumination area is formed on the reticle R and that the telecentricity is maintained under Köhler illumination.

Accordingly, since the reticle R is uniformly illuminated in the shape of arc at high illumination efficiency, the circuit pattern on the reticle R may be faithfully replicated on the wafer W in short exposure time.

Here, the reticle R is held on a reticle stage RS, and the wafer W on a wafer stage WS. A drive system shown in FIG. 44 moves the reticle stage RS and the wafer stage WS in exposure in the direction shown by the arrows.

Thus, scanning exposure can be made with far higher illumination efficiency than that in the conventional methods, achieving exposure with higher throughput.

Although the embodiment shown in FIG. 48 shows an example where the projection optical system 50 is of a 1:1 system, the projection optical system 50 may be of course constructed as a demagnifying system or as a magnifying system, which is the case for the following embodiments.

Next described is the structure of the re-imaging optical system 130. The same reference numerals denote the same constituent elements as those in the preceding embodiments.

Figure 49:
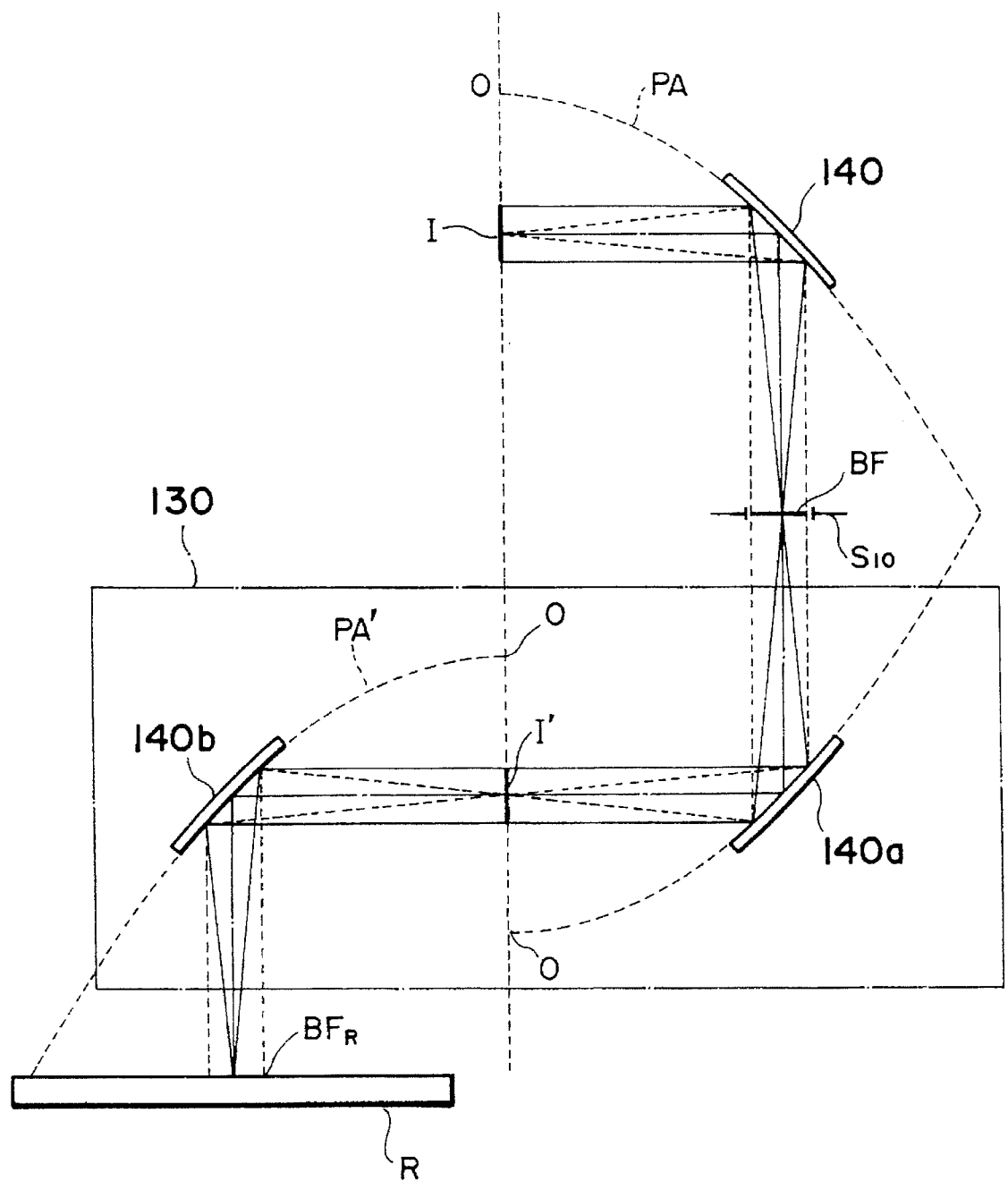
FIG. 49 is a drawing to show an example in which the re-imaging optical system is constructed of two optical reflectors.

FIG. 49 shows an example in which the re-imaging optical system 130 is constituted by a combination of two optical reflectors 140 as described referring to FIG. 39 and FIG. 40.

As shown in FIG. 49, a secondary light source I (light source images) comprised of an assembly of plural point sources is formed by an optical integrator shown in FIG. 48 on the symmetry axis $Ax_0$ of optical reflector 140. Rays from the secondary light source I are converted through the optical reflector 140 into parallel rays as shown by dotted lines to form an arcuate illumination area BF at the arcuate aperture portion in the slit plate $S_{10}$. After that, rays passing through the slit plate $S_{10}$ enter the re-imaging optical system 130 composed of two optical reflectors 140a, 140b, which are identical to the optical reflector 140.

The one optical reflector 140a is located at the position where the optical reflector 140a is line-symmetric symmetric to the optical reflector 140 with respect to the line passing through the illumination region BF formed by the optical reflector 140. The other optical reflector 140b is located at the position where the optical reflector 140b is in a relation of 180 rotation with the optical reflector 140a about the light source image I' re-imaged by the optical reflector 140 and the optical reflector 140a.

The light source image I and the light source image I' are conjugate with each other with respect to the optical reflector 140 and the optical reflector 140a, as shown by the dotted lines in FIG. 49, and the two light source images (I, I') both are circular. Also, the slit plate $S_{10}$ and the reticle R are conjugate with each other with respect to the re-imaging optical system 130, as shown by the solid lines in FIG. 49, and the illumination area BF formed on the aperture portion in the slit plate $S_{10}$ and the illumination area $BF_R$ on the reticle both have the shape of arc.

Consequently, the light source image I may be re-imaged on the entrance pupil of the projection optical system 50 by the re-imaging optical system 130 composed of the combination of two optical reflectors 140a, 140b identical to the optical reflector 140, whereby the telecentric Köhler illumination may be achieved with arcuate illumination area $BF_R$ being formed on the reticle R.

Figure 50:
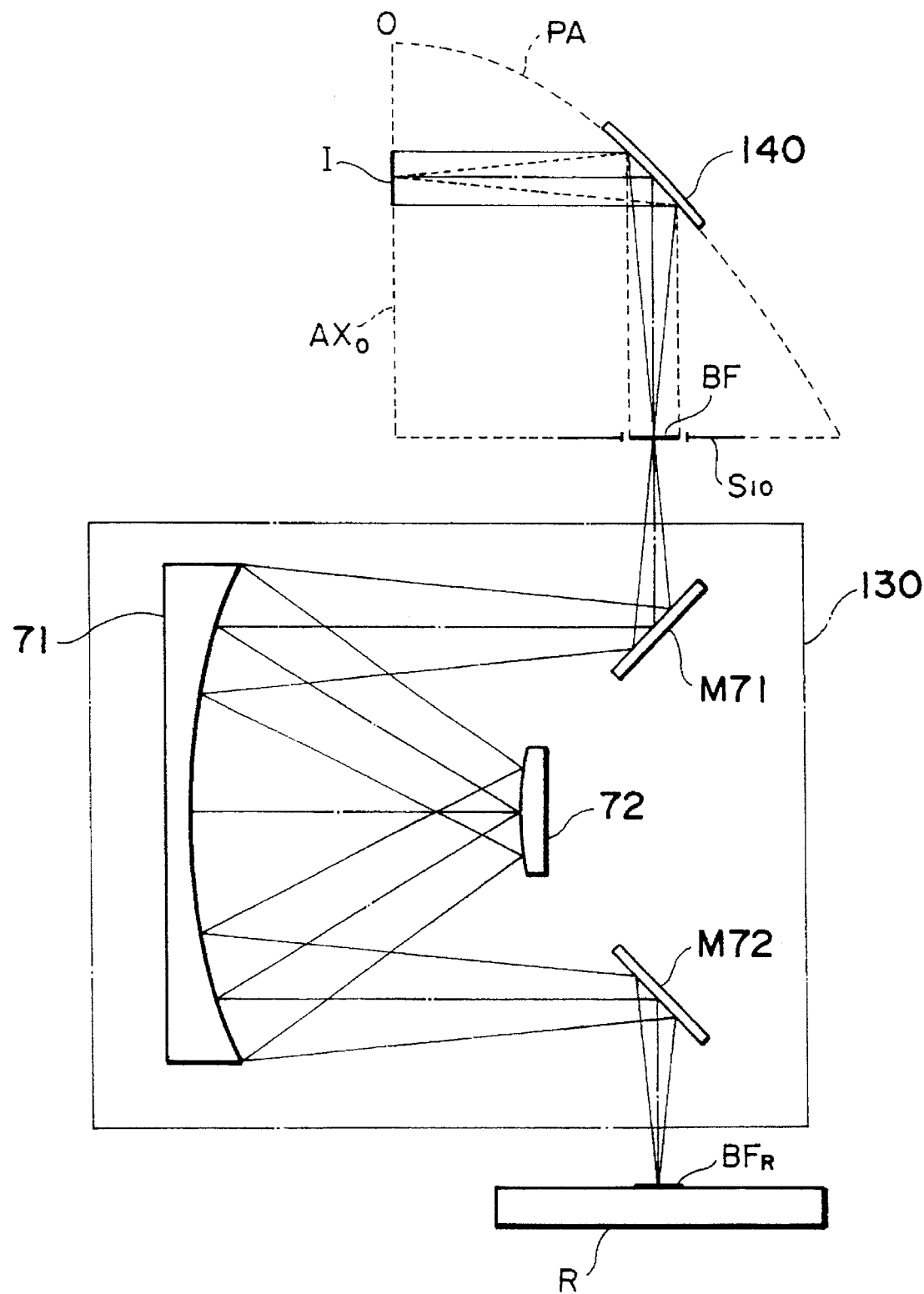
FIG. 50 is a drawing to show an example in which the re-imaging optical system is constructed of a concave mirror and a convex mirror.

Next described, referring to FIG. 50, is an example in which the re-imaging optical system 130 is constituted by a concave mirror 71 and a convex mirror 72 similarly as the projection optical system 50 shown in FIG. 48.

As shown in FIG. 50, the re-imaging optical system 130 has basic constituents of concave mirror 71 and convex mirror 72 and further includes reflection mirrors $M_{71}$, $M_{72}$ for bending an optical path between the slit plate $S_{10}$ and the concave mirror 71 and between the concave mirror 71 and the reticle R, respectively. Similarly as in the projection optical system 50 shown in FIG. 48, the center of curvature of the concave mirror 71 is approximately coincident with that of the convex mirror 72, and the radius of curvature of the convex mirror 72 is a half of that of the concave mirror 71.

The light source images I formed by the optical integrator (at the light source side focus position of the optical reflector 140) are substantially conjugate with the entrance pupil of the re-imaging optical system 130 (at or near the convex mirror 72). In addition, the shape of the plural light source images I and the shape of the entrance pupil of re-imaging optical system 130 all are circular.

Accordingly, the light source images I may be re-imaged on the entrance pupil of projection optical system 50 by the re-imaging optical system 130 composed of the concave mirror 71 and the convex mirror 72 similarly as in the projection optical system 50 shown in FIG. 48, whereby the telecentric Köhler illumination may be achieved with the arcuate illumination area $BF_R$ being formed on the reticle R.

Figure 51:
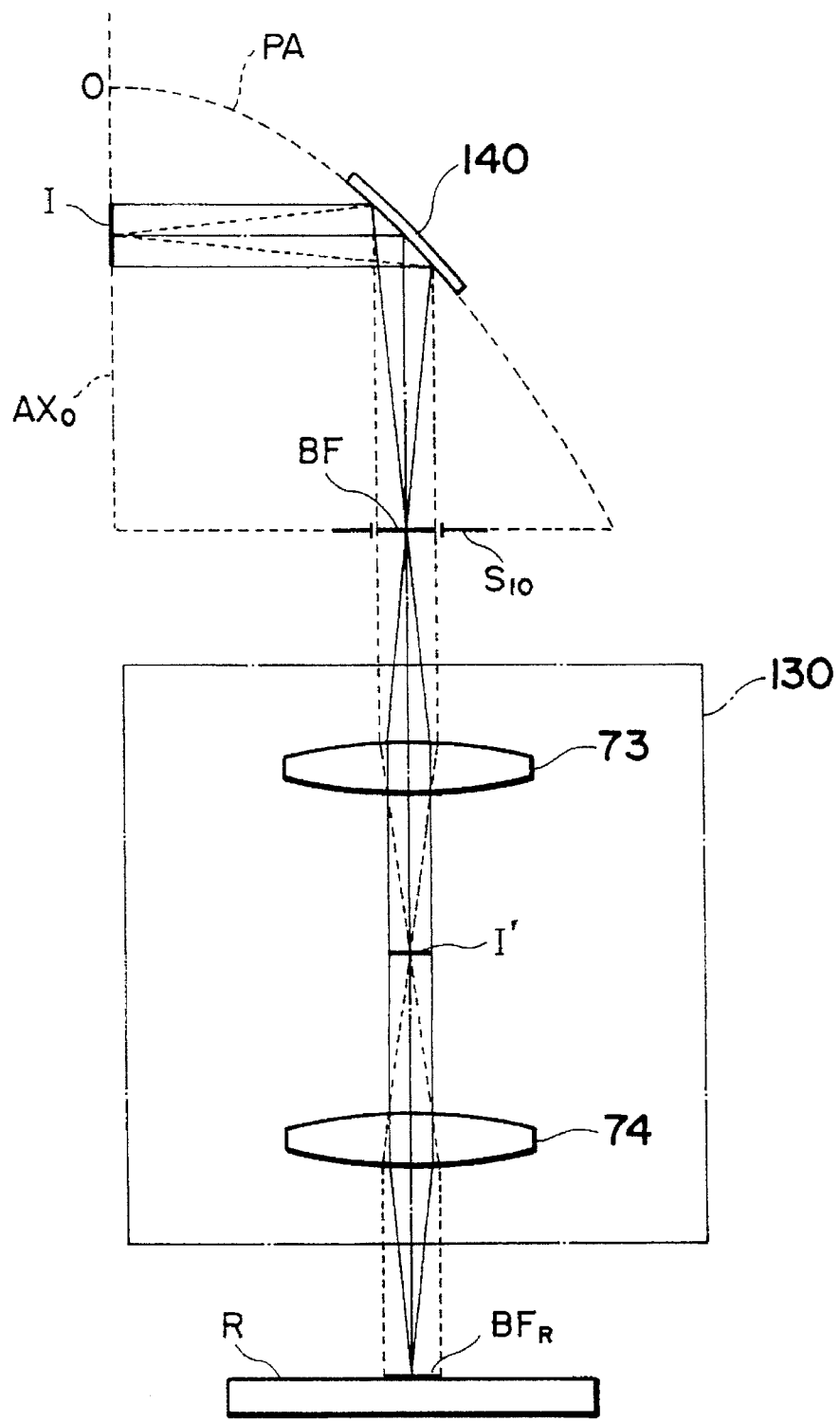
FIG. 51 is a drawing to show an example in which the re-imaging optical system is constructed of two refracting lenses.
Figure 52:
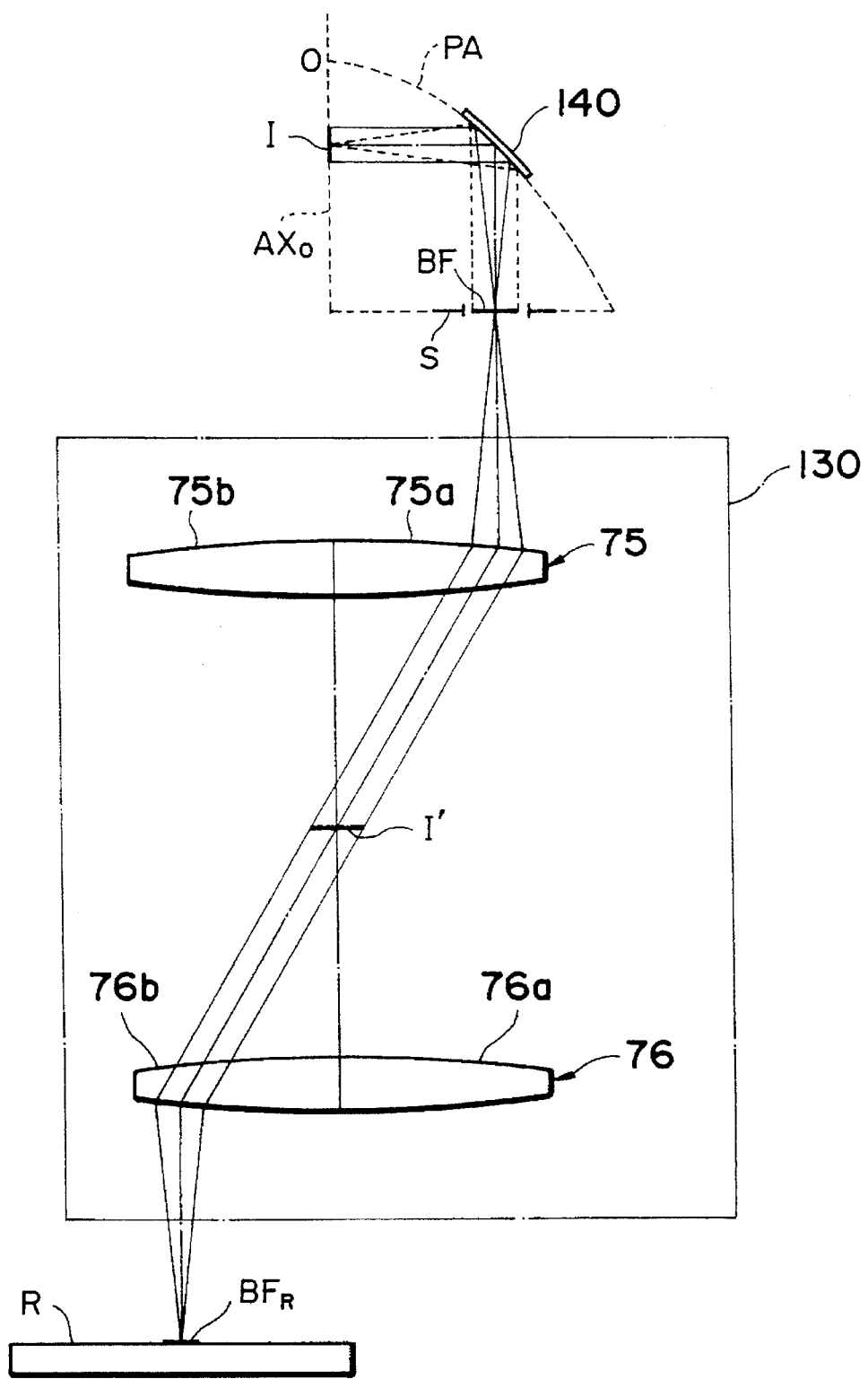
FIG. 52 is a drawing to show the structure of a re-imaging optical system constructed of two refracting lenses.

FIG. 49 and FIG. 50 illustrated the examples with re-imaging optical system 130 of reflection type optical system, while FIG. 51 and FIG. 52 illustrate examples with re-imaging optical system 130 of refraction type optical system.

FIG. 51 shows an example in which the re-imaging optical system 130 is constituted by two refracting lenses. The re-imaging optical system 130 is composed of a re-imaging lens 73 and a re-imaging lens 74. A substantially circular light source image I' is formed through the optical reflector 140 and the re-imaging lens 73 between the re-imaging lens 73 and the re-imaging lens 74.

Accordingly, the light source image I may be re-imaged on the entrance pupil of projection optical system 50 by the re-imaging optical system 130 composed of the two refracting lenses, whereby telecentric Köhler illumination may be achieved with the arcuate illumination region $BF_R$ being formed on the reticle R.

FIG. 51 showed the example in which the re-imaging optical system 130 is composed of the two refracting lenses for simplicity of description, but the re-imaging lens 73 or the re-imaging lens 74 may be of course constituted by a plurality of refracting lenses.

FIG. 52 shows an example in which the re-imaging optical system 130 is composed of two refracting lenses and the optical axis of the re-imaging optical system 130 is made coincident with the symmetry axis $Ax_0$ of the optical reflector 140.

As shown by the dotted lines in FIG. 52, rays from a light source image I formed by the optical integrator are converted through the optical reflector 140 into parallel rays to arc-illuminate an arcuate aperture portion in slit plate $S_{10}$. After that, rays passing through the arcuate aperture portion in slit plate $S_{10}$ enter away from the optical axis the re-imaging optical system 130 composed of a re-imaging lens 75 and a re-imaging lens 76, and pass through a right half lens portion 75a of the re-imaging lens 75 with respect to the optical axis to form a light source image I' at the illuminated plane side focus position of the re-imaging lens 75. Then, the rays from light source image I' pass through a left half lens portion 76b of the re-imaging lens 76 with respect to the optical axis to form an arcuate illumination area $BF_R$ on the reticle R.

Since the re-imaging optical system 130 of this example uses only the off-axial rays, good aberration correction is necessary only for a very small area at height of incidence apart by a certain distance from the optical axis of the re-imaging optical system 130, which is advantageous in requiring no consideration on correction of spherical aberration. Therefore, the re-imaging optical system 130 having the structure as shown in FIG. 52 can achieve theoretically excellent aberration correction by the smaller number of constituent lenses.

Although FIG. 52 showed the example of re-imaging optical system 130 composed of the two refracting lenses, the re-imaging optical system 130 may be constituted by a single refracting lens cut into two halves, one of which is used for the re-imaging lens 75a and the other of which for the re-imaging lens 76b.

Also, another arrangement is such that a plane mirror is located at the illuminated surface side focus position of the re-imaging lens 75 (at the position of light source image I'), that rays from the optical reflector 140 passing through a right half lens portion 75a of the re-imaging lens 75 are reflected by the plane mirror then to pass through a left half lens portion 75b of the re-imaging lens 75, and that the rays passing through the left lens portion 75b are guided onto the reticle R. This arrangement obviates the re-imaging lens 76.

Figure 53:
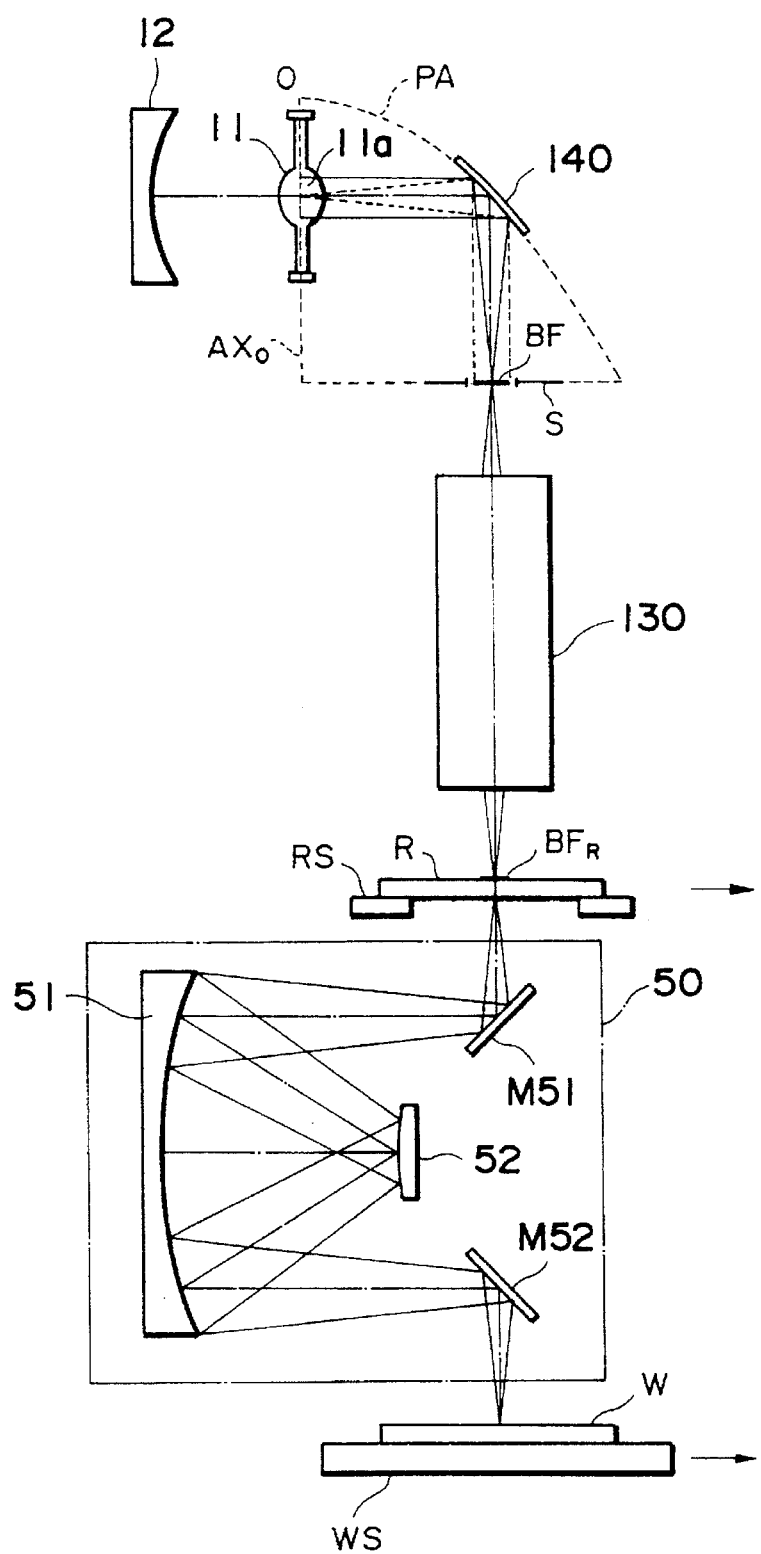
FIG. 53 is a drawing to show an embodiment in which the illumination optical system is applied to an exposure apparatus.

FIG. 53 next shows an embodiment in which the illumination optical apparatus according to the above embodiment is applied to an exposure apparatus. This embodiment will be described referring to FIG. 53. The same reference numerals denote constituent elements with the same functions as those in the previously described embodiments.

The apparatus in the present embodiment is different from the apparatus in the preceding embodiments in that a light source is located directly at the light source side focus position of optical reflector 140 (with focal length f on the light source side as $f=(2\alpha)^{-1}$).

As shown in FIG. 53, a mercury arc lamp 11 as light source is located on the symmetry axis $Ax_0$ of optical reflector 140 so that a light emission area 11a of the mercury arc lamp 11 is coincident with the light source side focus position of the optical reflector 140. Disposed on the left side of mercury arc lamp 11 is a concave mirror 12 having a curvature with the center of curvature at the center of light emission area 11a of mercury arc lamp 11. Rays emitted from the mercury arc lamp 11 to the left (toward the concave mirror 12) are reflected toward and converged at the center of the light emission area 11a by the concave mirror 12 then to advance toward the optical reflector 140. Rays emitted from the mercury arc lamp 11 to the right advance toward the optical reflector 140. In the present embodiment light source means is constituted by the mercury arc lamp 11 and the concave mirror 12.

The rays emitted from the mercury arc lamp 11 are converted through the optical reflector 140 into parallel rays having an arcuate cross section to arc-illuminate an arcuate aperture portion in slit plate S. Rays passing through the slit plate S are converged by the re-imaging optical system 130 onto the reticle R to form an arcuate illumination area $BF_R$ thereon in which the telecentricity is maintained.

The light emission area 11a of the mercury arc lamp 11 (at the light source side focus position of optical reflector 140) is substantially conjugate with the entrance pupil of projection optical system 50 (at or near the convex mirror 52). In addition, a light source image of the light emission area 11a is formed at the entrance pupil position of projection optical system 50 as being similar to the shape of the pupil (circular).

Accordingly, an arcuate illumination area is formed on the reticle R, in which the telecentricity is maintained under Köhler illumination. Thus, since the reticle R is evenly illuminated in the shape of arc at high illumination efficiency, by moving the reticle stage RS and the wafer stage WS in the directions shown by arrows, the scan exposure can be achieved at remarkably higher illumination efficiency and higher throughput than by conventional apparatus.

The re-imaging optical system 130 in the present embodiment shown in FIG. 53 may be replaced by one shown in either one of FIG. 49 to FIG. 52, of course.

Also, in the illumination optical system of the embodiments shown in FIG. 48 and in FIG. 53, the arcuate illumination area BF formed by the optical reflector 140 is shaped by the re-imaging optical system 130 to form the arcuate illumination area $BF_R$ on the reticle R, but without using the re-imaging optical system 130 the object to be illuminated may be directly arc-illuminated by positioning the illuminated object such as the reticle R on the arcuate illumination area BF formed by the optical reflector 140.

The above-described embodiments showed the examples where the optical integrator constituting the light source image forming optical system was composed of an assembly of lens elements, but the optical integrator may be constructed of rod optical members of an internal reflection type as disclosed in Japanese Laid-open Patent Application No. 1-271718, for example. Further, a bundle of optical fibers may also be used as an optical integrator.

Embodiment II-4

Next described is another embodiment where the re-imaging imaging optical system 130 is constructed as a refracting optical system.

Figure 55A:
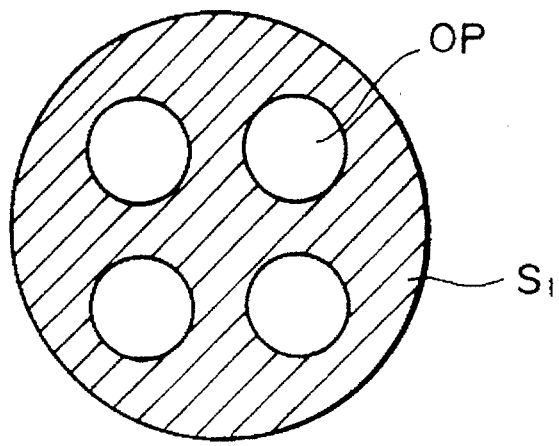
FIG. 55A is a plan view to show an aperture stop in which four symmetric transparent portions are provided.

First, let us suppose an aperture stop $S_1$ as shown in FIG. 55A is located at the position $A_1$ of the pupil of illumination optical system or at the position $A_2$ in FIG. 13A. In this case, a state of projection of the aperture stop $S_1$ in the illumination region (a relation of relative position) would rotate in accordance with a position in the arcuate shape of illumination region. This state will be schematically illustrated with FIGS. 56A and 56B.

The light emitted from the light source reaches the aperture stop $S_1$ positioned at the pupil position $A_1$ or $A_2$ and the light is outgoing with respective exit angles from apertures OP in the aperture stop $S_1$ (FIG. 13A). Thus, the light outgoing from the apertures OP radially travels toward the optical reflector 40. Observing this from the optical reflector 40 side, the shape of projection of the aperture stop $S_1$ is seen as confronting the reflector at a position of each radial angle. Namely, the aperture stop $S_1$ is observed in same orientation at either angle.

Figure 56B:
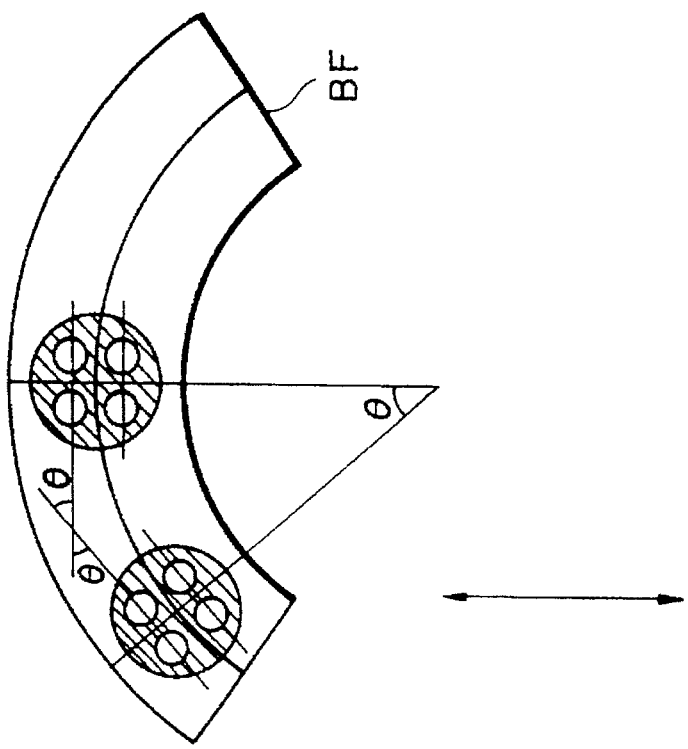
FIG. 56A and FIG. 56B are explanatory drawings to schematically show illumination states by light passing through the aperture stop in the conventional technology, using the shape of aperture stop.
Figure 56A:
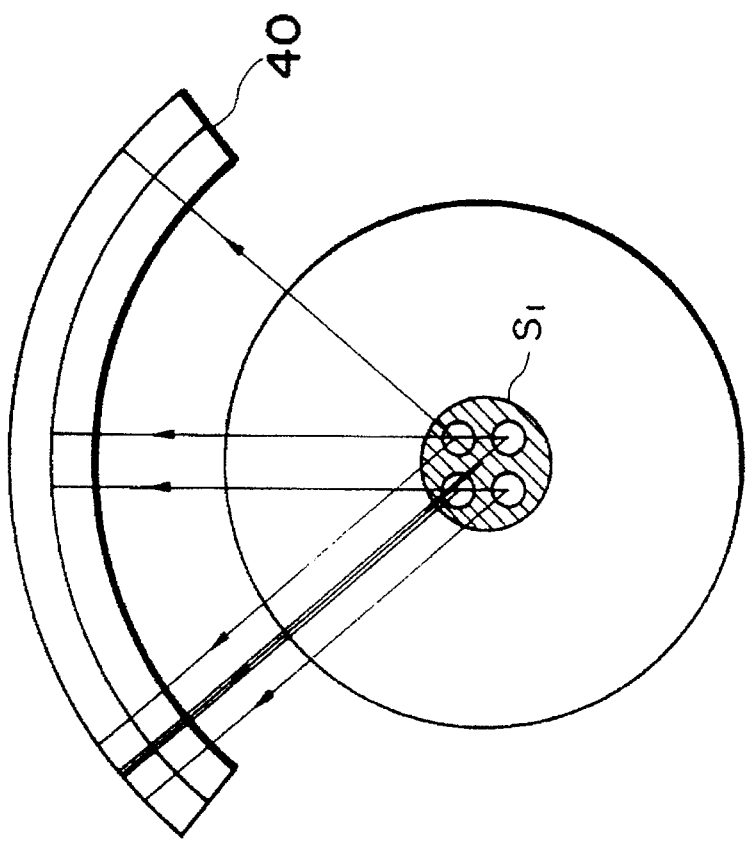

Because of this, while the beam reflected by the optical reflector 40 travels toward the arcuate illumination region BF, the effect to rotate the aperture stop $S_1$ occurs depending upon the position of reflection on the optical reflector 40 (i.e., depending upon the angular direction or depending upon the angular direction of exit from the light source image forming optical system 20 comprising the optical integrator 22). Namely, as shown in FIG. 56B, a beam traveling straight on the optical axis of the illumination optical system (with exit angle of ±0 degree) is projected as maintaining the state of setting position of the aperture stop $S_1$, but the illumination light from the aperture stop $S_1$ is projected as rotated depending upon the angular position in the arcuate illumination region (or depending upon the exit angle θ).

Since this is the same state as the aperture stop $S_1$ is rotated depending upon the position in the arcuate illumination region, a relation of a relative setting position with a projection pattern also changes (depending upon the position in the arcuate illumination region). Thus, the state of image formation changes in the illumination region, so that only the central portion of the illumination region (the portion corresponding to the exit angle of 0 degree and neighbors thereof) can have an improvement in imaging characteristics with desired performance even if the positions of the apertures OP in the aperture stop $S_1$ (the directions of illumination of oblique illumination light) are set to match with the arrangement direction of circuit pattern. Then, the imaging characteristics would be degraded gradually toward the peripheral portions of the arcuate region.

Figures 54A, 54B:
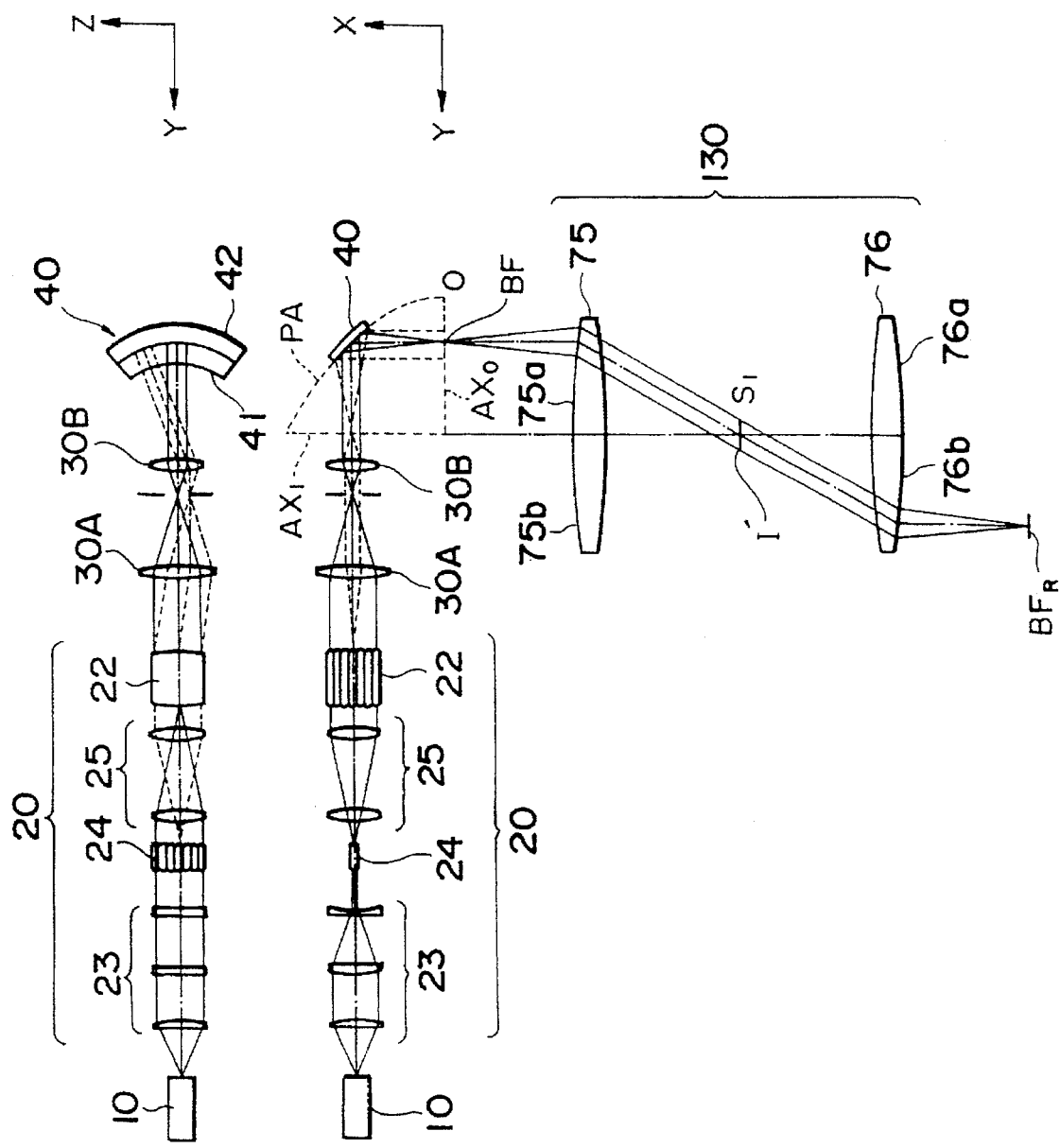
FIG. 54A is a plan view to show schematic structure of an illumination optical apparatus according to an embodiment.
FIG. 54B is a side view thereof.

Now, the structure of the present embodiment is shown in FIGS. 54A and 54B.

The illumination optical system itself is substantially the same as the illumination optical system in the previously described embodiments, except that the system is provided with a re-imaging optical system 130 as a relay optical system for relay of the arcuate illumination region BF and that an aperture stop $S_1$ is set at the position of the pupil of the re-imaging optical system 130 (at the position represented by I' in the drawing). Here, the same members will be denoted by the same reference numerals as those in the previously described embodiments.

In the illumination optical apparatus shown in FIGS. 54A and 54B, a beam from a light source 10 consisting of a laser light source is incident into a beam shaping lens system 23 composed of a collimator lens and other lenses, where it is converted into a beam with rectangular cross section. Then the rectangular beam enters a first optical integrator 24. Further, beams emergent from the first optical integrator then pass through a relay lens system 25 to enter a second optical integrator 22 to form images of the light source on the exit plane thereof. Beams emergent with respective exit angles therefrom are guided via a first optical system 54A, a second optical system 54B, and an optical reflector 40 to illuminate an arcuate illumination region BF under Köhler illumination.

This illumination region BF is guided through the re-imaging optical system 130 consisting of re-imaging lenses 75, 76 onto an illuminated object (R), where an illumination region $BF_R$ with the same shape (arcuate shape) is reconstructed. Generally, when such an illumination optical apparatus is applied to the projection exposure apparatus, a reticle (or a mask) R as an illuminated object is placed at the illumination region $BF_R$ to provide exposure light for projection of a mask pattern. The same constructions as in the previously described embodiments can be employed for these exposure apparatus and scanning apparatus for mask and wafer.

The re-imaging lenses 75, 76 are so set that the optical axis thereof is coincident with the reference axis $AX_1$ of the optical reflector 40. Because of this arrangement, this relay system has no axial spherical aberration (or uses no axial beam), thus necessitating no correction. Since the re-imaging lenses 75, 76 are used only in the half portions 75a, 76b, it is possible that a single lens is cut into halves and they are used in alternate arrangement.

The aperture stop $S_1$ provided with transparent portions as shown in FIG. 55A is set at the position I' of the pupil of the re-imaging optical system 130, so that the illumination light is subjected to selection by the aperture stop $S_1$ and then the selected illumination light reaches the illumination region $BF_R$ (as predetermined oblique illumination light). Namely, the aperture stop $S_1$ has the apertures OP defined based on the Fourier transform pattern of a fine pattern on mask, as disclosed in Japanese Laid-open Patent Application No. 4-101148, whereby it selectively transmits only diffracted light of predetermined order.

Figure 57A:
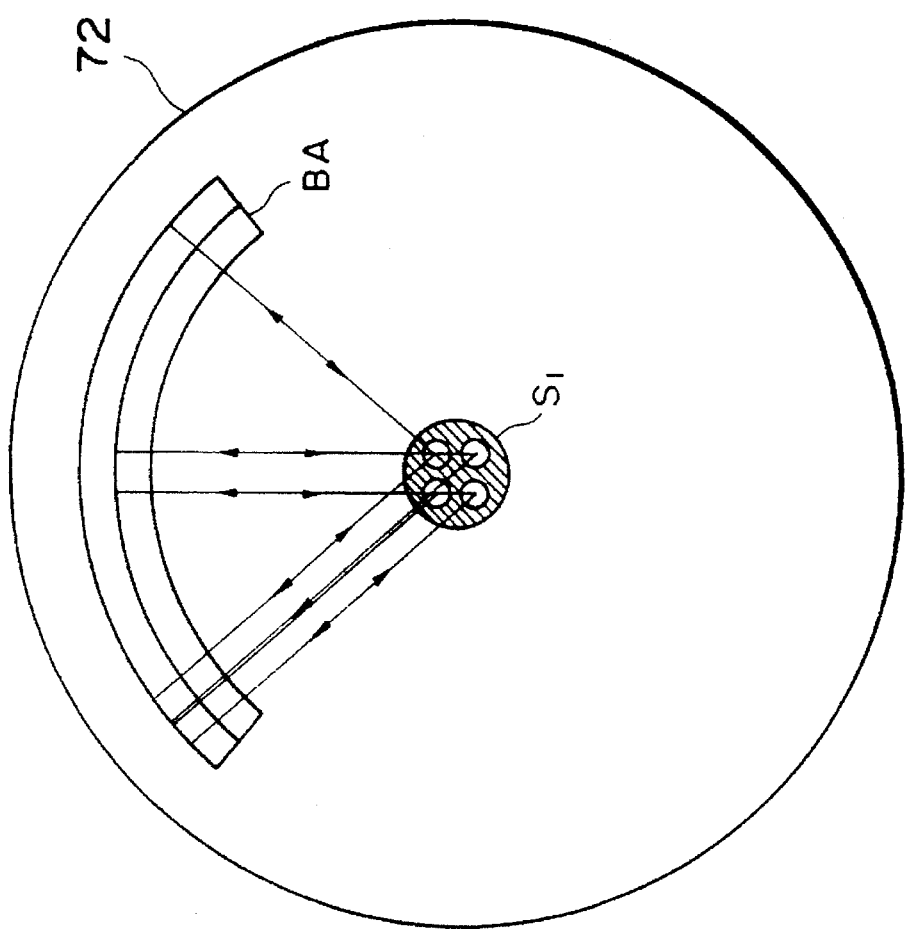
Figure 57B:
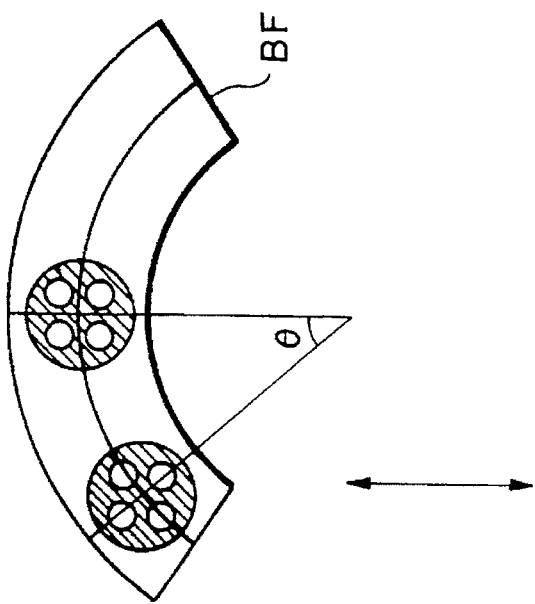

Then the state of projection of the aperture stop $S_1$ located at the position I' of the pupil of the re-imaging optical system 130 is kept always constant in the entire area of the arcuate illumination region BF, as shown in FIGS. 57A and 57B. In other words, the state of projection of the aperture stop $S_1$ becomes constant at any position in the illumination region BF in the scan directions (i.e., in the arrow directions). This means that the incident direction of oblique illumination light with the aperture stop $S_1$ is constant at all positions in the illumination region BF.

Figure 55B:
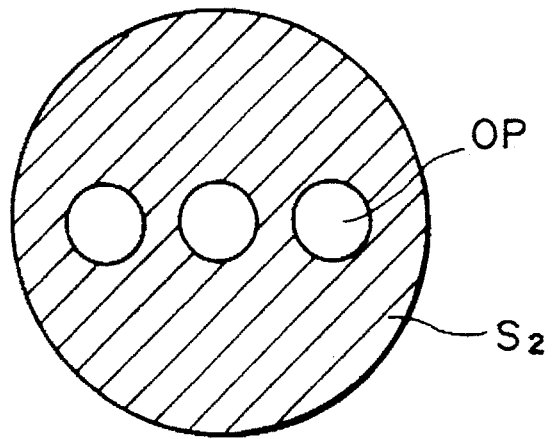
FIG. 55B is a plan view to show another aperture stop in which two symmetric transparent portions and a central transparent portion are provided.

The aperture stop to be set may be replaced by an aperture stop $S_2$ of the type shown in FIG. 55B. Either of the aperture stops $S_1$, $S_2$ has the apertures at offset positions from the central portion. Since the center of the aperture stop is arranged as to match with the optical axis of the re-imaging optical system, the central portion of the aperture stop is coincident with the optical axis. Then the aperture stop is set with specific directionality depending upon directions of lines or the density thereof in a projected pattern when applied to the projection exposure apparatus or the like.

FIG. 55A shows the aperture stop $S_1$ having four circular apertures OP offset from the center, which have the same size and are located at positions symmetric with each other around the central portion (with two apertures being in line symmetry with the other two apertures). Accordingly, with oblique illumination in the two orthogonal directions of the apertures, the resolution can be improved in the directions.

Since, in the present embodiment, the projection (state) of such a special aperture stop is always constant in the entire area in the illumination region BF, a projected image can be obtained with a deeper depth of focus from an illuminated object, such as a reticle, illuminated by the illumination light, than those by the conventional methods, and the state of the image formed is kept uniform independent of the position in the illumination region BF (in the projected image).

Also, where the re-imaging optical system 130 is constructed as shown in FIGS. 58A and 58B, the aperture stop $S_1$ or $S_2$ can also be set at the position of the pupil of the optical system 130 (at the position shown by I' in the drawing).

In the present embodiment, the optical path connecting the illumination regions BF and $BF_R$ is not offset with respect to the re-imaging lenses 73 and 74, using the central portions of the lenses. Thus, the relaying portion is different from that in the previously described embodiment, but the shape of projection of the aperture stop $S_1$, $S_2$ on the illuminated surface (reticle R) is also uniform independent of the position in the illumination region BF, similarly as in the previously described embodiment. The size of the optical system itself can be made compact by such use of the central portion of the re-imaging optical system.

As described above, the arrangement that the aperture stop $S_1$, $S_2$ is set near the position of the pupil in the re-imaging optical system can enjoy such an advantage that the effect is uniform in the entire area in the arcuate illumination region in applications of the so-called oblique illumination method which could affect the depth of focus or the contrast of projected image. Therefore, if this illumination optical apparatus is applied to the projection exposure apparatus, a projected image can be obtained with a deep depth of focus in the entire area of the projected region and a brightness difference of the image becomes larger, also providing an advantage that those are uniform over the entire area of the projected region. This permits projection exposure apparatus which can perform projection exposure with high resolution while maintaining a high throughput, to be constructed.

Here, the type of the illumination optical system itself as described above has no specific limitation as long as it can form the arcuate illumination region. For example, when the illumination system described in Japanese Laid-open Patent Application No. 60-232552 is provided with the re-imaging optical system and the aperture stop of the present embodiment, the depth of focus becomes deeper in applications to the projection exposure apparatus than those in the conventional methods. Thus, the total illumination (projection) characteristics can be improved. Also, the depth of focus becomes deeper in applications to the illumination optical system with a special reflective mirror having a reflective surface consisting of a rotational parabolic surface or a parabolic toric surface, as in the illumination optical system described in Japanese Laid-open Patent Application No. 6-97047 or as in the illumination optical system described in Japanese Patent Application No. 5-323718, whereby the illumination characteristics can be improved as compared with the conventional methods.

The aperture stop of the present embodiment utilizes the aperture stop as described in Japanese Laid-open Patent Application No. 4-101148 as explained previously, which has a plurality of apertures offset from the optical axis of the re-imaging optical system. This means that there is directionality of arrangement of the apertures at least between the offset positions of the apertures and the center portion, specifically in the arrangements as shown in FIGS. 55A and 55B.

As described previously, the four circular apertures OP are provided at positions symmetric with each other with respect to the center and offset from the center portion in FIG. 55A. This case is the same as the beams passing through the four apertures OP become illumination light beams having respective predetermined angles, and the four beams (mainly, each of the two pairs of beams) are related to the orientation.

Also, in FIG. 55B, the three circular apertures OP are located at the center and on the both sides thereof in symmetry with each other. The aperture stop may be one as shown in Japanese Laid-open Patent Application No. 4-101148, in which two circular apertures are provided at positions symmetric with each other on the both sides of the center. With these aperture stops, oblique illumination is effected especially by beams from the apertures located in symmetry at the offset positions, thus having the issue of directionality of incident directions.

It is general in either case that the aperture stop is used with the center on the optical axis. Since the apertures are formed at the offset positions, they have such directionality (to define the direction of the incident plane of the oblique illumination light) that the apertures are aligned in the direction of a line connecting the center portion with the positions of the apertures (the offset positions) (or in the direction perpendicular thereto).

Namely, Japanese Laid-open Patent Application No. 4-101148 utilizes the regularity of a fine pattern to be transferred and positively uses diffracted light emerging from the fine pattern, wherein a light-shielding plate has apertures determined based on the Fourier transform pattern of the fine pattern. In the present embodiment, such a structure for letting transmission beams pass in a limiting manner is considered as an aperture stop.

For applications of the illumination optical system using such special aperture stops to the projection exposure apparatus, a necessary condition is that one or more pairs of apertures are provided at angular positions depending upon the direction of the transfer pattern and at an interval depending on the fineness of the pattern and on the wavelength of exposure light. Since such a pair of apertures are provided in symmetry with each other with respect to the center of the optical axis (generally with respect to the center of the aperture stop), some apertures are located at offset positions.

With provision of such an aperture stop, diffracted light of the exposure light is selectively transmitted thereby and the incident angle of projected light onto the mask is limited. Thus, the depth of focus is improved and the contrast of the projection pattern is also improved, thus making the brightness difference clearer.

In these aperture stops, the apertures are arranged at least as to readily transmit the exposure light, which may be constructed of a transmissive member. On the other hand, the light-shielding portion (the hatched portion in FIG. 55A or other drawings) may be formed of any material with characteristics hardly to transmit the exposure light, for example, of one selected from materials perfectly shielding the light or materials partly interfering transmission of the exposure light.

Further, as described in Japanese Laid-open Patent Application No. 4-101148, these aperture stops can be so arranged that they are selectively exchanged with necessity depending upon a pattern on a used mask and that the relation of setting position is determined depending thereon. For example, employing a filter using a liquid crystal display device or an EC (electrochromic) device or the like, the exchange mechanism can be made compact and, in addition, the size, the positions, and the shape of apertures can be readily adjusted in a short time.

It is preferred that the aperture stop be located at the position of the pupil of the relay optical system. Namely, the position of the pupil of the re-imaging optical system in the present embodiment is the position where the beams from the arcuate illumination region by the illumination system are converged. Thus, setting the aperture stop there, the projection state becomes constant in positional relation (or is directed in a same direction), independent of the position in the illumination region.

It should be noted that the position of the pupil herein does not always mean only the strict position where the pupil is present, but may include positions near the position of the pupil (or positions around the pupil), as long as the aperture stop is effective there, and positions conjugate with such positions (which is the case throughout the specification). In either case, there is no specific restriction on the position as long as the aperture stop can reveal the effect of selection of diffracted light.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 4-242486 filed on Sep. 11, 1992; 4-316717 filed on Nov. 26, 1992; 5-271952 filed on Oct. 29, 1993; 5-323718 filed on Dec. 22, 1993; and 6-134916 filed on May 26, 1994 are hereby incorporated by reference.

What is claimed is:

1. A light source system comprising light source unit for emitting a beam and light guide optical system for receiving the beam emitted from said light source unit and converging it to form a light source image, the beam emitted from the light source image having a constant beam diameter in all outgoing directions of the beam, wherein said light guide optical system comprises a first optical system and a second optical system which are arranged in order from said light source unit, wherein said first optical system holds a relation of $y=f_1 \cdot g_1(\theta_1)$ when a beam enters said first optical system at an angle of incidence $\theta_1$, where y is a height from the optical axis, of said beam as converged at a focal position of said first optical system, $g_1(\theta_1)$, a function for $\theta_1$, and $f_1$ a focal length of the first optical system, wherein said second optical system holds a relation of $y=f_2 \cdot g_2(\theta_2)$ when a beam from said first optical system at a height y from said optical axis and at said focal position of said first optical system is outgoing from the second optical system, where $\theta_2$ is an outgoing angle, $g_2(\theta_2)$ a function for $\theta_2$, and $f_2$ a focal length of the second optical system, and wherein said first optical system and said second optical system satisfy the following relation:

$$g_2'(\theta_2) \cdot \cos\theta_1 = g_1'(\theta_1),$$

where $g_1'(\theta_1)$ is a derivative of $g_1(\theta_1)$ and $g_2'(\theta_2)$ a derivative of $g_2(\theta_2)$.

2. A light source system according to claim 1, wherein said light source units comprise a light source for emitting the beam and an optical integrator for receiving the beam emitted from said light source to form a plurality of beams.

3. A light source system according to claim 1, wherein said first optical system comprises an f·sinθ lens and said second optical system comprises an fθ lens.

4. A light source system according to claim 3, wherein said first optical system comprises a double-convex positive lens, a double-concave negative lens and a double-convex positive lens, which are arranged in order from said light source unit, and wherein said second optical system comprises a double-convex positive lens, a double-concave negative lens, a double-convex positive lens and a meniscus negative lens with a concave surface on the side of said light source, which are arranged in order from said light source unit.

5. A light source system according to claim 1, wherein in said second optical system a real image of said light source image is formed in a space within the second optical system and an aperture stop is located at a position where the real image of the light source image is formed.

6. A light source system according to claim 5, wherein said aperture stop has a ring aperture portion.

7. An illumination optical apparatus for illuminating a surface to be illuminated in the shape of arc or annulus, which comprises a light source system for forming a light source image to emit a beam and an optical reflector for reflecting the beam emitted from said light source system, wherein said light source system comprises light source unit for emitting the beam and light guide optical system for receiving the beam emitted from said light source unit and converging it to form a light source image, the beam emitted from said light source image having substantially constant beam diameter in all outgoing directions of the beam, wherein a reflective plane of said optical reflector has a curved surface which constitutes at least a part of a parabolic toric surface, said parabolic toric surface being obtained by rotating an arbitrary parabola with a first axis passing through the vertex and the focus of the parabola about a second axis passing through a point located on an opposite side to the directrix of the parabola with respect to said focus while being parallel to the directrix, wherein light guide optical system comprises a first optical system and a second optical system which are arranged in order from said light source unit, wherein said first optical system holds a relation of $y=f_1 \cdot g_1(\theta_1)$ when a beam enters said first optical system at an angle of incidence $\theta_1$, where y is a height from the optical axis, of said beam as converged at a focal position of said first optical system, $g_1(\theta_1)$, a function for $\theta_1$, and $f_1$ a focal length of the first optical system, wherein said second optical system holds a relation of $y=f_2 \cdot g_2(\theta_2)$ when a beam from said first optical system at a height y from said optical axis and at said focal position of said first optical system is outgoing from the second optical system, where $\theta_2$ is an outgoing angle, $g_2(\theta_2)$ a function for $\theta_2$, and $f_2$ a focal length of the second optical system, and wherein said first optical system and said second optical system satisfy the following relation:

$$g_2'(\theta_2) \cdot \cos\theta_1 = g_1'(\theta_1),$$

wherein $g_1'(\theta_1)$ is a derivative of $g_1(\theta_1)$ and $g_2'(\theta_2)$ a derivative of $g_2(\theta_2)$.

8. An illumination optical apparatus according to claim 7, wherein said light source unit comprises a light source for emitting the beam and an optical integrator for receiving the beam emitted from said light source to form a plurality of beams.

9. An illumination optical apparatus according to claim 7, wherein said second axis is apart from the focus at a distance equal to a distance between said focus and said directrix of the parabola.

10. An illumination optical apparatus according to claim 9, wherein said reflective plane of the optical reflector is formed in the shape of belt-like arc which constitutes a part of said parabolic toric surface.

11. An illumination optical apparatus according to claim 10, wherein the light source image emitted from said light source system is formed on said second axis.

12. An illumination optical apparatus according to claim 11, wherein said light source image is located around a position on said second axis which is apart from an intersection between said first axis and said second axis at a distance equal to a distance between the second axis and said focus.

13. An illumination optical apparatus according to claim 7, wherein said first optical system comprises an f·sinθ lens and said second optical system comprises an fθ lens.

14. An illumination optical apparatus according to claim 13, wherein said first optical system comprises a double-convex positive lens, a double-concave negative lens and a double-convex positive lens, which are arranged in order from said light source unit, and wherein said second optical system comprises a double-convex positive lens, a double-concave negative lens, a double-convex positive lens and a meniscus negative lens with a concave surface on the side of said light source, which are arranged in order from said light source unit.

15. An illumination optical apparatus according to claim 14, wherein in said second optical system a real image of said light source image is formed in a space within the second optical system and an aperture stop is located at a position where the real image of the light source image is formed.

16. An illumination optical apparatus according to claim 15, wherein said aperture stop has a ring aperture portion.

17. An illumination optical apparatus according to claim 7, wherein said light source system comprises a field stop having an aperture for defining a shape of an arcuate illumination region formed in illuminating said surface to be illuminated, at a position where the beam emitted from said first optical system is converged.

18. An illumination optical apparatus according to claim 17, wherein said aperture in the field stop has such a shape as to make a curvature of a contour line of an outer periphery in said arcuate illumination region substantially equal to a curvature of a contour line of an inner periphery thereof.

19. An illumination optical apparatus according to claim 18, wherein said shape of the aperture in the field stop is an elongate rectangle extending along a direction of rotation of said parabola and located on a plane perpendicular to the optical axis of said optical system and wherein a width of said aperture in a direction along said second axis gradually decreases toward both side edges from a central portion thereof.

20. An illumination optical apparatus according to claim 7, further comprising:
    mask holding unit for holding a photo mask which is to be illuminated by said illumination optical apparatus;
    substrate holding unit for holding a substrate onto which an image of a pattern on said photo mask is to be replicated;
    a projection optical system which the image of the pattern on said photo mask enters and which projects the pattern image onto said substrate; and
    transfer unit for transferring said mask holding unit and said substrate holding unit in synchronism with each other;
    wherein the image of the pattern on said photo mask is successively replicated on said substrate while said transfer unit sequentially moves said mask holding unit and said substrate holding unit.

21. An illumination optical apparatus according to claim 20, wherein said second axis is apart from the focus at a distance equal to a distance between said focus and said directrix of the parabola.

22. An illumination optical apparatus according to claim 21, wherein said reflective plane of the optical reflector is formed in the shape of belt-like arc which constitutes a part of said parabolic toric surface.

23. An illumination optical apparatus according to claim 22, wherein the light source image emitted from said light source system is formed on said second axis.

24. An illumination optical apparatus according to claim 23, wherein said light source image is located around a position on said second axis which is apart from an intersection between said first axis and said second axis at a distance equal to a distance between the second axis and said focus.

25. An illumination optical apparatus according to claim 24, wherein said first optical system comprises an f·sinθ lens and said second optical system comprises an fθ lens.

26. An illumination optical apparatus according to claim 25, wherein said first optical system comprises a double-convex positive lens, a double-concave negative lens and a double-convex positive lens, which are arranged in order from said light source unit, and wherein said second optical system comprises a double-convex positive lens, a double-concave negative lens, a double-convex positive lens and a meniscus negative lens with a concave surface on the side of said light source, which are arranged in order from said light source unit.

27. An illumination optical apparatus according to claim 26, wherein in said second optical system a real image of said light source image is formed in a space within the second optical system and an aperture stop is located at a position where the real image of the light source image is formed.

28. An illumination optical apparatus according to claim 27, wherein said aperture stop has a ring aperture portion.

29. An illumination optical apparatus according to claim 20, further comprising a second re-imaging optical system disposed between said surface to be illuminated and said mask holding unit, for re-imaging on said photo mask the illumination light beam projected on said surface to be illuminated.

30. An illumination optical apparatus according to claim 29, wherein said second re-imaging optical system comprises an aperture stop having a plurality of transparent portions and located at a position of a pupil in the second re-imaging optical system, said transparent portions being located at offset positions from the optical axis of said second re-imaging optical system.

31. An illumination optical apparatus according to claim 30, wherein the optical axis of said second re-imaging optical system is located on said second axis.

32. An illumination optical apparatus according to claim 30, wherein the optical axis of said second re-imaging optical system is located on an axis perpendicular to said surface to be illuminated.

33. An illumination optical system in which an optical reflector reflects a light source image emitted from a light source system to illuminate a surface to be illuminated in the shape of arc or annulus,
    wherein a reflective plane of said optical reflector has a curved surface which constitutes at least a part of a parabolic surface, said parabolic surface being obtained by rotating an arbitrary parabola about a third axis passing through the vertex and the focus of said parabola.

34. An illumination optical system according to claim 33, wherein said reflective plane of the optical reflector is formed in the shape of belt-like arc which constitutes a part of said parabolic surface.

35. An illumination optical system according to claim 34, wherein the light source image emitted from said light source system is formed on said third axis.

36. An illumination optical system according to claim 35, wherein said light source image is located around a position of said focus on said third axis.

37. An illumination optical apparatus for illuminating a surface to be illuminated in the shape of arc or annulus, which comprises a light source system for forming a light source image to emit the beam and an optical reflector for reflecting the beam emitted from said light source system,
    wherein said light source system comprises light source unit for emitting the beam and light guide optical system for receiving the beam emitted from said light source unit and converging it to form a light source image, the beam emitted from said light source image having a substantially constant beam diameter in all outgoing directions of the beam, wherein a reflective plane of said optical reflector has a curved surface which constitutes at least a part of a parabolic surface, said parabolic surface being obtained by rotating an arbitrary parabola about a third axis passing through the vertex and the focus of said parabola, wherein light guide optical system comprises a first optical system and a second optical system which are arranged in order from said light source unit, wherein said first optical system holds a relation of $y=f_1 \cdot g_1(\theta_1)$ when a beam enters said first optical system at an angle of incidence $\theta_1$, where y is a height from the optical axis, of said beam as converged at a focal position of said first optical system, $g_1(\theta_1)$ a function for $\theta_1$, and $f_1$ a focal length of the first optical system, wherein said second optical system holds a relation of $y=f_2 \cdot g_2(\theta_2)$ when a beam from said first optical system at a height y from said optical axis and at said focal position of said first optical system is outgoing from the second optical system, where $\theta_2$ is an outgoing angle, $g_2(\theta_2)$ a function for $\theta_2$, and $f_2$ a focal length of the second optical system, and wherein said first optical system and said second optical system satisfy the following relation:

$$g_2'(\theta_2) \cdot \cos\theta_1 = g_1'(\theta_1),$$

where $g_1'(\theta_1)$ is a derivative of $g_1(\theta_1)$ and $g_2'(\theta_2)$ a derivative of $g_2'(\theta_2)$.

38. An illumination optical apparatus according to claim 37, wherein said light source means comprises a light source for emitting the beam and an optical integrator for receiving the beam emitted from said light source to form a plurality of beams.

39. An illumination optical apparatus according to claim 37, wherein said reflective plane of the optical reflector is formed in the shape of belt-like arc which constitutes a part of said parabolic surface.

40. An illumination optical apparatus according to claim 39, wherein the light source image emitted from said light source system is formed on said third axis.

41. An illumination optical apparatus according to claim 40, wherein said light source image is located around a position of said focus on said third axis.

42. An illumination optical apparatus according to claim 37, wherein said first optical system comprises an f·sinθ lens and said second optical system comprises an fθ lens.

43. An illumination optical apparatus according to claim 42, wherein said first optical system comprises a double-convex positive lens, a double-concave negative lens and a double-convex positive lens, which are arranged in order from said light source unit, and wherein said second optical system comprises a double-convex positive lens, a double-concave negative lens, a double-convex positive lens and a meniscus negative lens with a concave surface on the side of said light source, which are arranged in order from said light source unit.

44. An illumination optical apparatus according to claim 43, wherein in said second optical system a real image of said light source image is formed in a space within the second optical system and an aperture stop is located at a position where the real image of the light source image is formed.

45. An illumination optical apparatus according to claim 44, wherein said aperture stop has a ring aperture portion.

46. An illumination optical apparatus according to claim 37, wherein said light source system comprises a field stop having an aperture for defining a shape of an arcuate illumination region formed in illuminating said surface to be illuminated, at a position where the beam emitted from said first optical system is converged.

47. An illumination optical apparatus according to claim 46, wherein said aperture in the field stop has such a shape as to make a curvature of a contour line of an outer periphery in said arcuate illumination region substantially equal to a curvature of a contour line of an inner periphery thereof.

48. An illumination optical apparatus according to claim 47, wherein said shape of the aperture in the field stop is an elongate rectangle extending along a direction of rotation of said parabola and located on a plane perpendicular to the optical axis of said optical system and wherein a width of said aperture in a direction along said second axis gradually decreases toward both side edges from a central portion thereof.

49. An illumination optical apparatus according to claim 37, further comprising a second re-imaging optical system disposed between said surface to be illuminated and said mask holding unit, for re-imaging on said photo mask the illumination light beam projected on said surface to be illuminated.

50. An illumination optical apparatus according to claim 49, wherein said second re-imaging optical system comprises an aperture stop having a plurality of transparent portions and located at a position of a pupil in the second re-imaging optical system, said transparent portions being located at offset positions from the optical axis of said second re-imaging optical system.

51. An illumination optical apparatus according to claim 50, wherein the optical axis of said second re-imaging optical system is located on said second axis.

52. An illumination optical apparatus according to claim 50, wherein the optical axis of said second re-imaging optical system is located on an axis perpendicular to said surface to be illuminated.

53. An illumination optical apparatus for illuminating a surface to be illuminated in the shape of arc or annulus, which comprises a light source system for forming a light source image to emit the beam and an optical reflector for reflecting the beam emitted from said light source system:

mask holding unit for holding a photo mask which is to be illuminated by said illumination optical apparatus;

substrate holding unit for holding a substrate onto which an image of a pattern on said photo mask is to be replicated;

a projection optical system which the image of the pattern on said photo mask enters and which projects the pattern image onto said substrate; and transfer unit for transferring said mask holding unit and said substrate holding unit in synchronism with each other;

wherein the image of the pattern on said photo mask is successively replicated on said substrate while said transfer unit sequentially moves said mask holding unit and said substrate holding unit, wherein said light source system comprises light source unit for emitting the beam and light guide optical system for receiving the beam emitted from said light source unit and converging it to form a light source image, the beam emitted from said light source image having a substantially constant beam diameter in all outgoing direction of the beam, and wherein a reflective plane of said optical reflector has a curved surface which constitutes at least a part of a parabolic surface, said parabolic surface being obtained by rotating an arbitrary parabola about a third axis passing through the vertex and the focus of said parabola.

54. An illumination optical apparatus according to claim 53, wherein said reflective plane of the optical reflector is formed in the shape of belt-like arc which constitutes a part of said parabolic surface.

55. An illumination optical apparatus according to claim 54, wherein the light source image emitted from said light source system is formed on said third axis.

56. An illumination optical apparatus according to claim 55, wherein said light source image is located around a position of said focus on said third axis.

57. An illumination optical apparatus according to claim 56, wherein said first optical system comprises an f·sinθ lens and said second optical system comprises an fθ lens.

58. An illumination optical apparatus according to claim 57, wherein said first optical system comprises a double-convex positive lens, a double-concave negative lens and a double-convex positive lens, which are arranged in order from said light source means, and wherein said second optical system comprises a double-convex positive lens, a double-convex negative lens, a double-convex positive lens and a meniscus negative lens with a concave surface on the side of said light source, which are arranged in order from said light source means.

59. An illumination optical apparatus according to claim 58, wherein in said second optical system a real image of said light source image is formed in a space within the second optical system and an aperture stop is located at a position where the real image of the light source image is formed.

60. An illumination optical apparatus according to claim 59, wherein said aperture stop has a ring aperture portion.

* * * * *